(12) United States Patent
Ma et al.

(10) Patent No.: US 11,450,738 B2
(45) Date of Patent: Sep. 20, 2022

(54) SOURCE/DRAIN REGIONS IN INTEGRATED CIRCUIT STRUCTURES

(71) Applicant: Intel Corporation, Santa Clara, CA (US)

(72) Inventors: Sean T. Ma, Portland, OR (US); Anand S. Murthy, Portland, OR (US); Glenn A. Glass, Portland, OR (US); Biswajeet Guha, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 16/832,417

(22) Filed: Mar. 27, 2020

(65) Prior Publication Data

US 2021/0305367 A1 Sep. 30, 2021

(51) Int. Cl.
*H01L 29/423* (2006.01)
*H01L 29/06* (2006.01)
*H01L 29/66* (2006.01)
*H01L 29/10* (2006.01)

(52) U.S. Cl.
CPC ...... *H01L 29/0669* (2013.01); *H01L 29/0653* (2013.01); *H01L 29/1087* (2013.01); *H01L 29/6656* (2013.01)

(58) Field of Classification Search
None
See application file for complete search history.

(56) References Cited

U.S. PATENT DOCUMENTS

| | | | |
|---|---|---|---|
| 10,535,733 B2* | 1/2020 | Cheng | H01L 29/78696 |
| 10,804,165 B2* | 10/2020 | Seo | H01L 29/1079 |
| 11,038,044 B2* | 6/2021 | Cheng | H01L 29/165 |
| 11,276,576 B2* | 3/2022 | Wang | H01L 29/775 |
| 2005/0023619 A1* | 2/2005 | Orlowski | H01L 29/42384 257/E21.415 |
| 2018/0138291 A1* | 5/2018 | Smith | H01L 29/66439 |
| 2019/0172755 A1* | 6/2019 | Smith | H01L 21/823864 |
| 2021/0384307 A1 | 12/2021 | Ma et al. | |

* cited by examiner

*Primary Examiner* — Ali Naraghi
(74) *Attorney, Agent, or Firm* — Akona IP PC

(57) ABSTRACT

Disclosed herein are source/drain regions in integrated circuit (IC) structures, as well as related methods and components. For example, in some embodiments, an IC structure may include: a channel region including a first semiconductor wire and a second semiconductor wire; and a source/drain region proximate to the channel region, wherein the source/drain region includes a first semiconductor portion proximate to an end of the first semiconductor wire, the source/drain region includes a second semiconductor portion proximate to an end of the second semiconductor wire, and the source/drain region includes a contact metal at least partially between the first semiconductor portion and the second semiconductor portion.

20 Claims, 92 Drawing Sheets

SOURCE/DRAIN REGIONS IN INTEGRATED CIRCUIT STRUCTURES

BACKGROUND

Electronic components may include active electrical elements, such as transistors. The design of these elements may impact the size, performance, and reliability of the electronic component.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
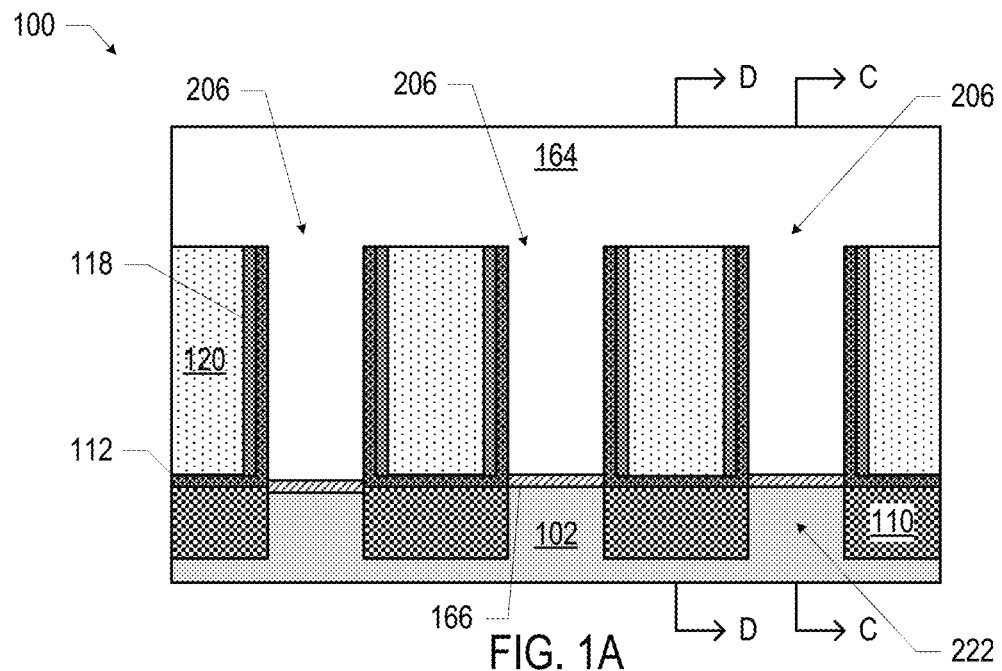
FIGS. 1A-1F are cross-sectional views of an integrated circuit (IC) structure, in accordance with various embodiments.

Disclosed herein are source/drain regions in integrated circuit (IC) structures, as well as related methods and components. For example, in some embodiments, an IC structure may include: a channel region including a first semiconductor wire and a second semiconductor wire; and a source/drain region proximate to the channel region, wherein the source/drain region includes a first semiconductor portion proximate to an end of the first semiconductor wire, the source/drain region includes a second semiconductor portion proximate to an end of the second semiconductor wire, and the source/drain region includes a contact metal at least partially between the first semiconductor portion and the second semiconductor portion.

Gate-all-around (GAA) transistors may include a vertically oriented stack of lateral semiconductor channels (e.g., semiconductor wires, such as semiconductor ribbons) wrapped by gate material. During operation, current may flow through these semiconductor channels, modulated by electrical signals applied to the gate and proximate source/drain (S/D) regions. However, as the number of semiconductor wires increases (e.g., to boost the drive current), the depth of the vertical stack increases and the resistance of the electrical connection to the semiconductor wires may become a performance and manufacturing bottleneck. For example, some fabrication techniques may require a deep etch into the epitaxially formed S/D regions to form S/D contacts; such techniques may need to be extremely anisotropic so that the epitaxial S/D regions are etched only vertically, without undesirable lateral etch, and may also need to avoid damaging any local gate spacers. Under real world manufacturing conditions, the failure of an etch to meet criteria like these may compromise device performance or may render such devices impractical to manufacture.

Disclosed herein are novel IC structures that may provide improved S/D contacts relative to previous approaches. The S/D contact structures disclosed herein may exhibit reduced external resistance without adding significant manufacturing complexity (thus speeding adoption and reducing cost), and may allow for improved process control relative to conventional techniques.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. As used herein, the term "insulating" means "electrically insulating" unless otherwise specified. For convenience, the phrase "FIG. 1" may be used to refer to the collection of drawings of FIGS. 1A-1F, the phrase "FIG. 2" may be used to refer to the collection of drawings of FIGS. 2A-2D, etc.

FIG. 1 provides cross-sectional views of an IC structure 100, in accordance with various embodiments. In particular, FIG. 1A is a cross-sectional view taken through the section A-A of FIGS. 1C and 1D (perpendicular to the longitudinal axis of a channel region 202, and across the source/drain (S/D) regions 150/152 of different channel regions 202), FIG. 1B is a cross-sectional view taken through the section B-B of FIGS. 1C and 1D (perpendicular to the longitudinal axis of a channel region 202, and across a gate 204 spanning multiple channel regions 202), FIG. 1C is a cross-sectional view taken through the section C-C of FIGS. 1A and 1B (along the longitudinal axis of a channel region 202), and FIG. 1D is a cross-sectional view taken through the section D-D of FIGS. 1A and 1B (between adjacent channel regions 202, parallel to the longitudinal axis of the channel regions 202). FIGS. 1E and 1F share the perspective of FIG. 1C, and illustrate alternate arrangements of the semiconductor regions 128/130. The "A," "B," "C," and "D" sub-figures of FIGS. 2-44 share the same perspectives as those of the sub-figures "A," "B," "C," and "D" of FIG. 1, respectively. Although various ones of the accompanying drawings depict a particular number of device regions 206 (e.g., three), channel regions 202 (e.g., three) in a device region 206, and a particular arrangement of channel materials 106 (e.g., two wires) in a channel region 202, this is simply for ease of illustration, and an IC structure 100 may include more or fewer device regions 206 and/or channel regions 202, and/or other arrangements of channel materials 106.

A device region 206 may be oriented vertically relative to an underlying base 102, with multiple device regions 206 arrayed along the base 102. The base 102 may be a semiconductor substrate composed of semiconductor material systems including, for example, n-type or p-type materials systems (or a combination of both). The base 102 may include, for example, a crystalline substrate formed using a bulk silicon. The base 102 may include a layer of silicon dioxide on a bulk silicon or gallium arsenide substrate. The base 102 may include a converted layer (e.g., a silicon layer that has been converted to silicon dioxide during an oxygen-based annealing process). In some embodiments, the base 102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the base 102. Although a few examples of materials from which the base 102 may be formed are described here, any material or structure that may serve as a foundation for an IC structure 100 may be used. The base 102 may be part of a singulated die (e.g., the dies 1502 of FIG. 46) or a wafer (e.g., the wafer 1500 of FIG. 46). In some embodiments, the base 102 may itself include an interconnect layer, an insulation layer, a passivation layer, an etch stop layer, additional device layers, etc. As shown in FIG. 1, the base 102 may include pedestals 222, around which a dielectric material 110 may be disposed; the dielectric material 110 may include any suitable material, such as a shallow trench isolation (STI) material (e.g., an oxide material, such as silicon oxide).

Figure 1B:
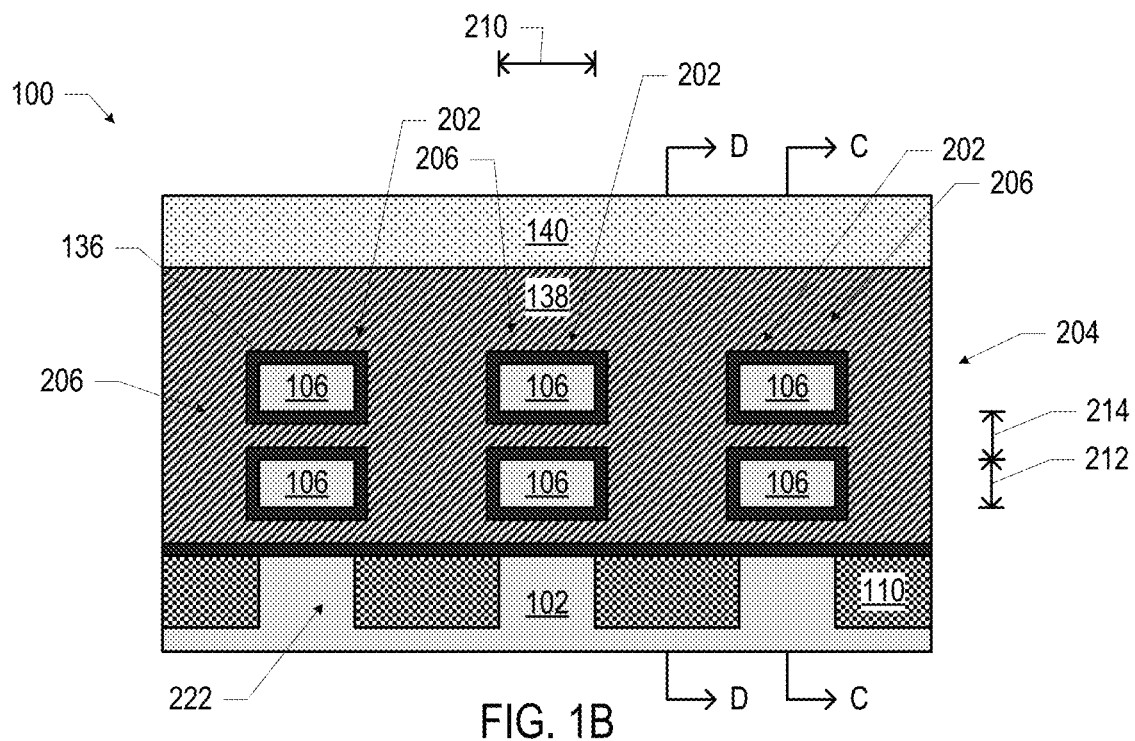
Figure 1C:
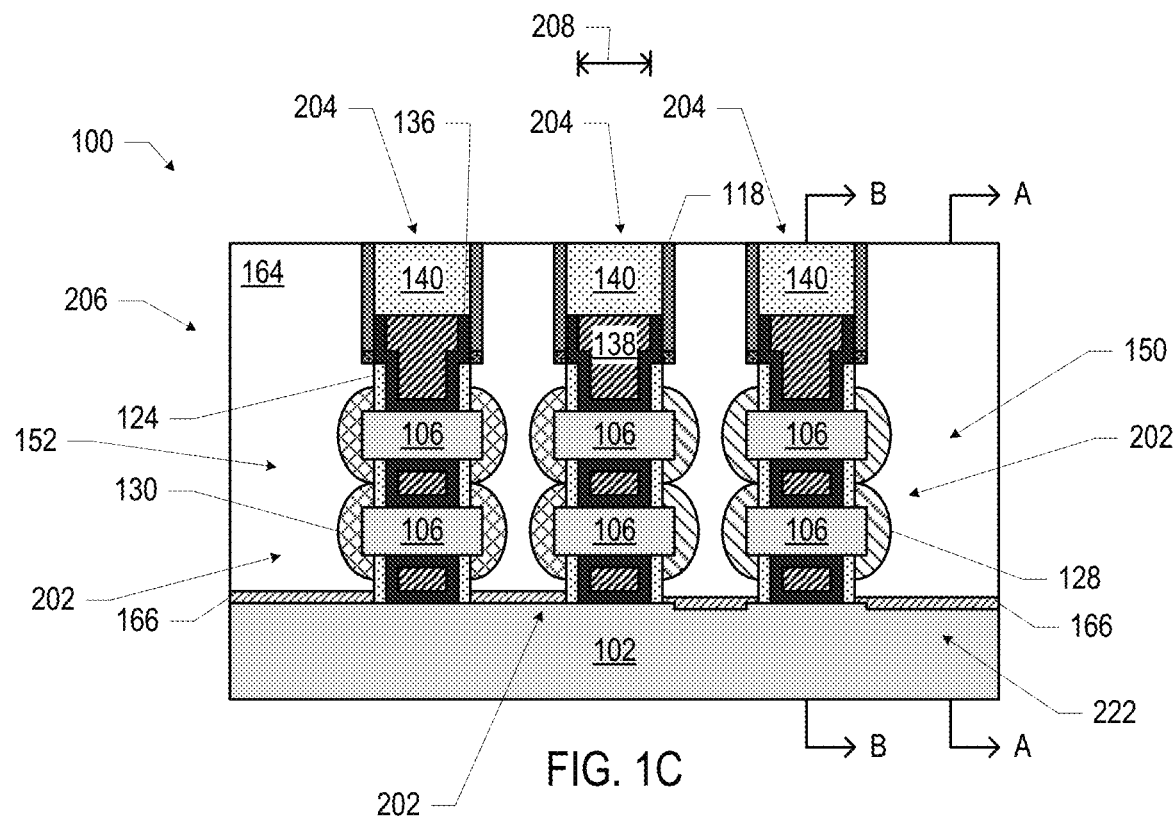
Figure 1D:
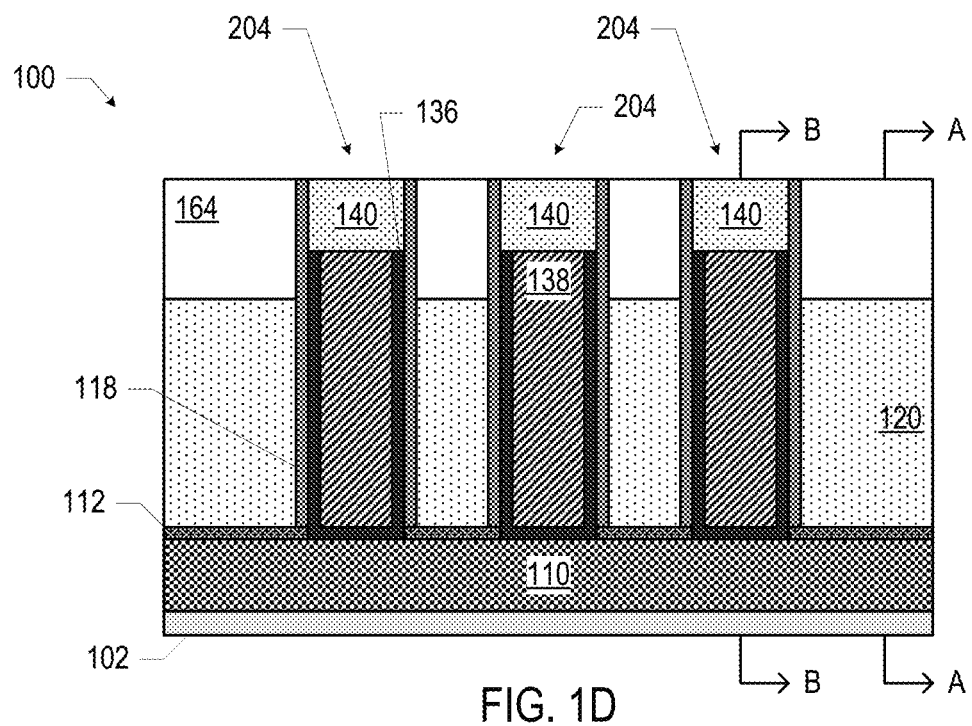

The IC structure 100 may include one or more device regions 206 having channel material 106 with a longitudinal axis (into the page from the perspective of FIGS. 1A and 1B, and left-right from the perspective of FIGS. 1C and 1D). The channel material 106 of a device region 206 may be arranged in any of a number of ways. For example, FIG. 1 illustrates the channel material 106 of the device regions 206 as including multiple semiconductor wires (e.g., nanowires or nanoribbons in GAA, forksheet, double-gate, or pseudo double-gate transistors). Although various ones of the accompanying drawings depict a particular number of wires in the channel material 106 of a device region 206, this is simply for ease of illustration, and a device region 206 may include more or fewer wires as the channel material 106. More generally, any of the IC structures 100 disclosed herein or substructures thereof (e.g., the S/D regions 150/152, discussed below) may be utilized in a transistor having any desired architecture, such as forksheet transistors, double-gate transistors, or pseudo double-gate transistors. In some embodiments, the channel material 106 may include silicon and/or germanium. In some embodiments, the channel material 106 may include indium antimonide, lead telluride, indium arsenide, indium phosphide, gallium arsenide, or gallium antimonide, or further materials classified as group II-VI, III-V, or IV. In some embodiments, the channel material 106 may include a semiconducting oxide (e.g., indium gallium zinc oxide). In some embodiments, the material composition of the channel material 106 used in different ones of the wires in a particular device region 206 may be different, or may be the same.

The channel material 106 may be in contact with a gate dielectric 136. In some embodiments, the gate dielectric 136 may surround the channel material 106 (e.g., when the channel material 106 includes wires, as shown in FIG. 1). The gate dielectric 136 may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 136 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 136 to improve its quality when a high-k material is used.

The gate dielectric 136 may be disposed between the channel material 106 and a gate metal 138. In some embodiments, the gate metal 138 may surround the channel material 106 (e.g., when the channel material 106 includes wires, as shown in FIG. 1). Together, the gate metal 138 and the gate dielectric 136 may provide a gate 204 for the associated channel material 106 in an associated channel region 202, with the electrical impedance of the channel material 106 modulated by the electrical potential applied to the associated gate 204 (through gate contacts 140). The gate metal 138 may include at least one p-type work function metal or n-type work function metal (or both), depending on whether the transistor of which it is a part is to be a p-type metal oxide semiconductor (PMOS) or an n-type metal oxide semiconductor (NMOS) transistor. In some implementations, the gate metal 138 may include a stack of two or more metal layers, where one or more metal layers are work function metal layers and at least one metal layer is a fill metal layer. Further metal layers may be included for other purposes, such as a barrier layer (e.g., tantalum, tantalum nitride, an aluminum-containing alloy, etc.). In some embodiments, a gate metal 138 may include a resistance-reducing cap layer (e.g., copper, gold, cobalt, or tungsten). For a PMOS transistor, metals that may be used for the gate metal 138 include, but are not limited to, ruthenium, palladium, platinum, cobalt, nickel, conductive metal oxides (e.g., ruthenium oxide), and any of the metals discussed herein with reference to an NMOS transistor (e.g., for work function tuning). For an NMOS transistor, metals that may be used for the gate metal 138 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning). In some embodiments, the gate metal 138 may include grading (increasing or decreasing) of the concentration of one or more materials therein. Dielectric material 118 and/or dielectric material 124 may separate the gate dielectric 136, the gate metal 138, the gate contact 140 from the proximate S/D regions 150/152. The dielectric materials 118 and 124 may include silicon nitride, silicon oxide, silicon carbide, silicon nitride doped with carbon, silicon oxide doped with carbon, silicon oxynitride, or silicon oxynitride doped with carbon, for example.

Source/drain (S/D) regions 150/152 may be in electrical contact with the longitudinal ends of the channel material 106, allowing current to flow from one S/D region 150/152 to another S/D region 150/152 through the channel material 106 (upon application of appropriate electrical potentials to the S/D regions 150/152) during operation. The S/D regions 150/152 may include semiconductor regions 128/130, respectively; as discussed further below with reference to FIGS. 2-44, the semiconductor regions 128 may have a particular dopant type (i.e., n-type or p-type) while the semiconductor regions 130 may have the opposite dopant type (i.e., p-type or n-type, respectively); reference may be made herein to "n-type" or "p-type" S/D regions 150/152 according to the dopant type of the semiconductor regions 128/130, respectively. The particular arrangement of S/D regions 150/152 in the accompanying drawings is simply illustrative, and any desired arrangement may be used (e.g., by appropriate selective masking).

In some embodiments, the semiconductor regions 128/130 may include a silicon alloy such as silicon germanium or silicon carbide. In some embodiments, semiconductor regions 128/130 may include dopants such as boron, arsenic, or phosphorous. In some embodiments, the semiconductor regions 128/130 may include one or more alternate semiconductor materials such as germanium or a group III-V material or alloy. For PMOS transistors, semiconductor regions 128/130 may include, for example, group IV semiconductor materials such as silicon, germanium, silicon germanium, germanium tin, or silicon germanium alloyed with carbon. Example p-type dopants in silicon, silicon germanium, and germanium include boron, gallium, indium, and aluminum. For NMOS transistors, semiconductor regions 128/130 may include, for example, group III-V semiconductor materials such as indium, aluminum, arsenic, phosphorous, gallium, and antimony, with some example compounds including indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. The semiconductor regions 128/130 may be in contact with the adjacent channel material 106, as shown.

Figure 1E:
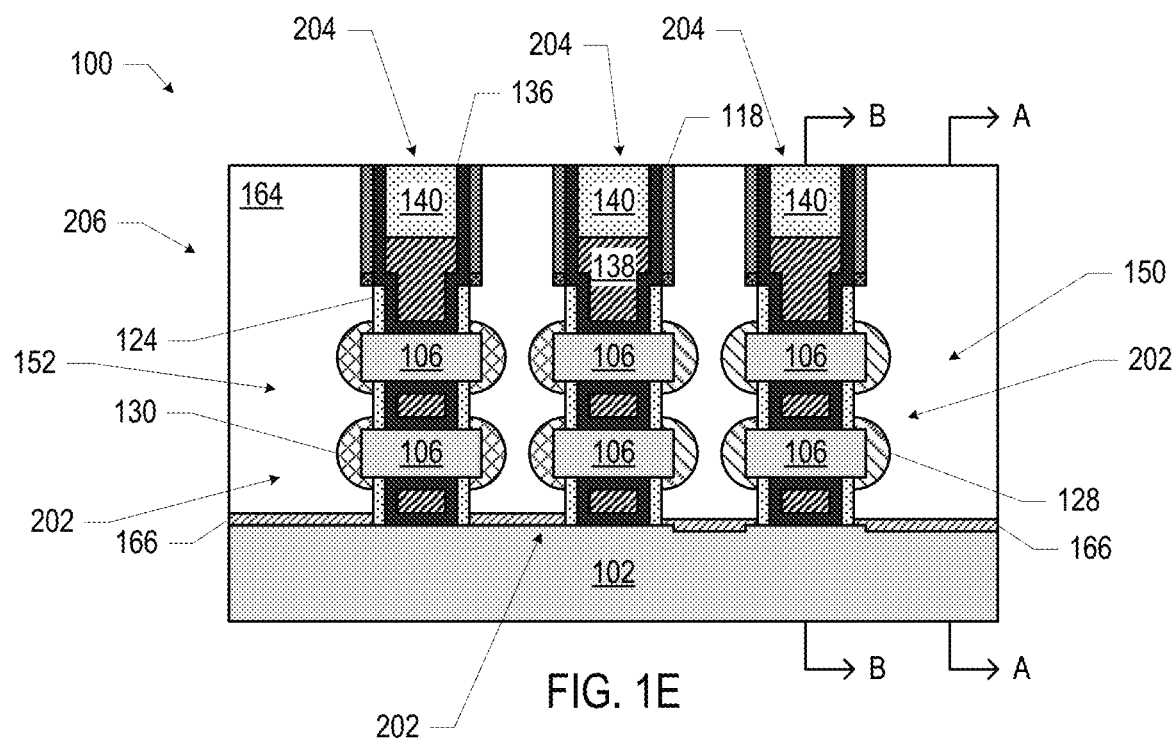
Figure 1F:
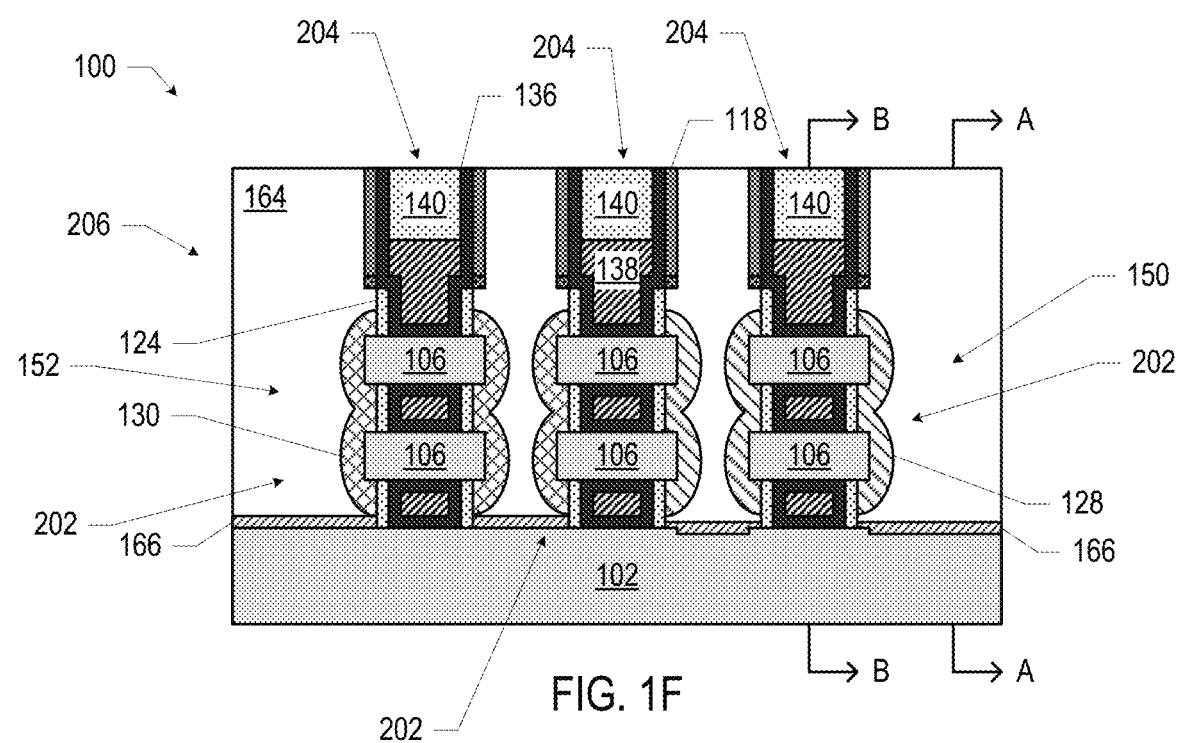
Figure 2A:
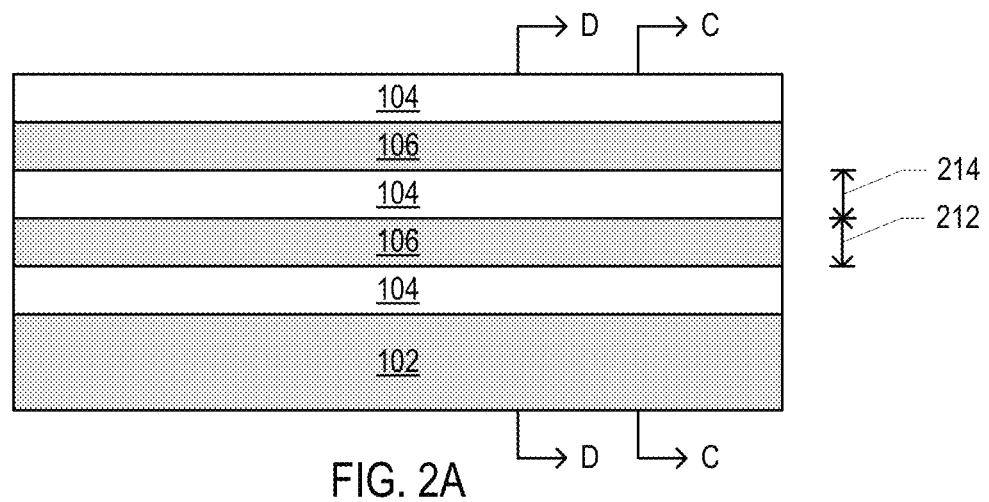
FIGS. 2A-2D, 3A-3D, 4A-4D, 5A-5D, 6A-6D, 7A-7D, 8A-8D, 9A-9D, 10A-10D, 11A-11D, 12A-12D, 13A-13D, 14A-14D, 15A-15D, 16A-16D, 17A-17D, 18A-18D, 19A-19D, 20A-20D, 21A-21D, 22A-22D, 23A-23D, 24A-24D, 25A-25D, 26A-26D, 27A-27D, 28A-28D, 29A-29D, 30A-30D, 31A-31D, 32A-32D, 33A-33D, 34A-34D, 35A-35D, 36A-36D, 37A-37D, 38A-38D, 39A-39D, 40A-40D, 41A-41D, 42A-42D, 43A-43D, and 44A-44D are cross-sectional views of stages in an example process of manufacturing the IC structure of FIGS. 1A-1F, in accordance with various embodiments.
Figure 2B:
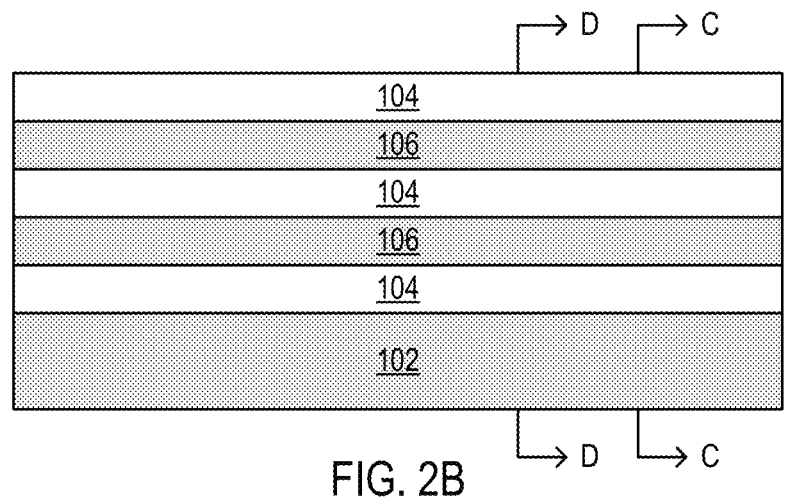
Figure 2C:
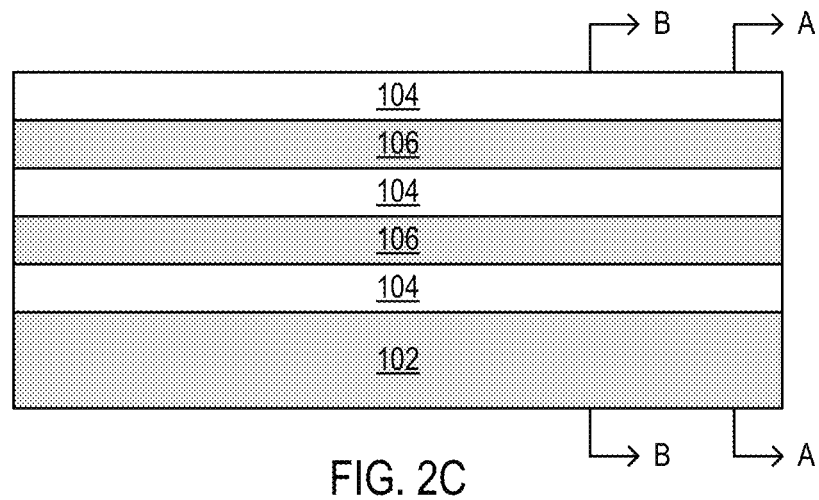
Figure 2D:
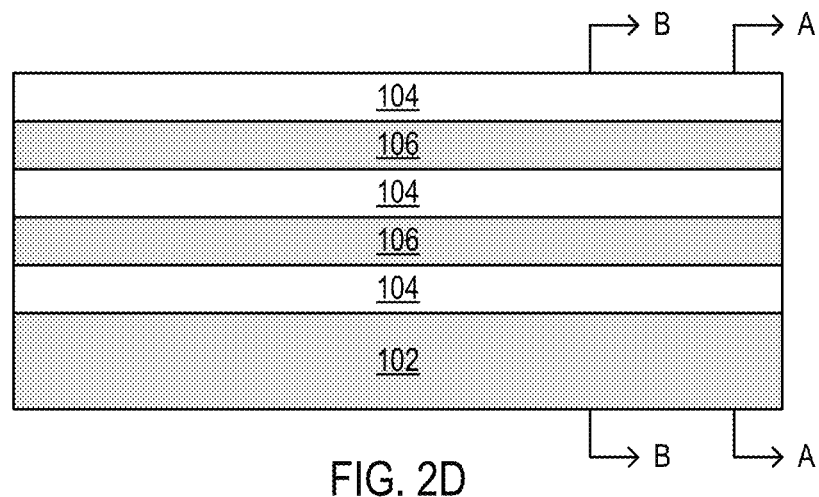
Figure 3A:
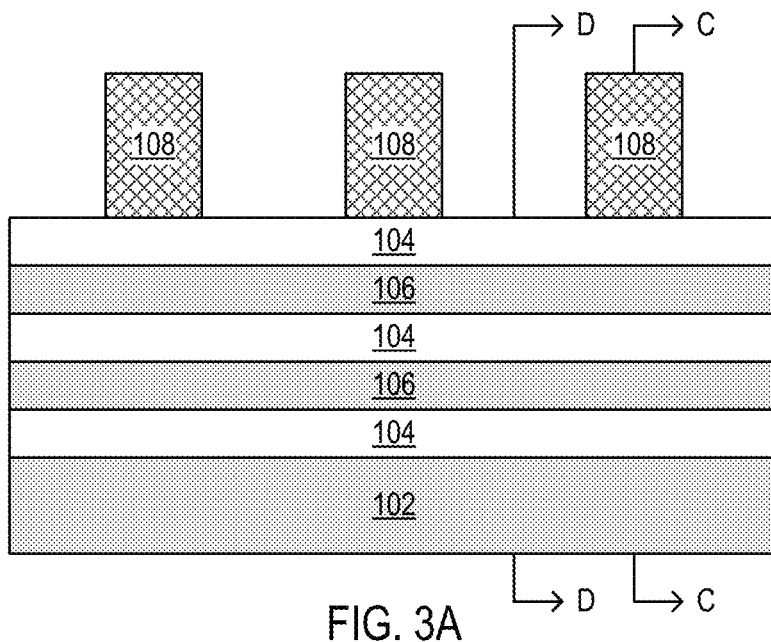
Figure 3B:
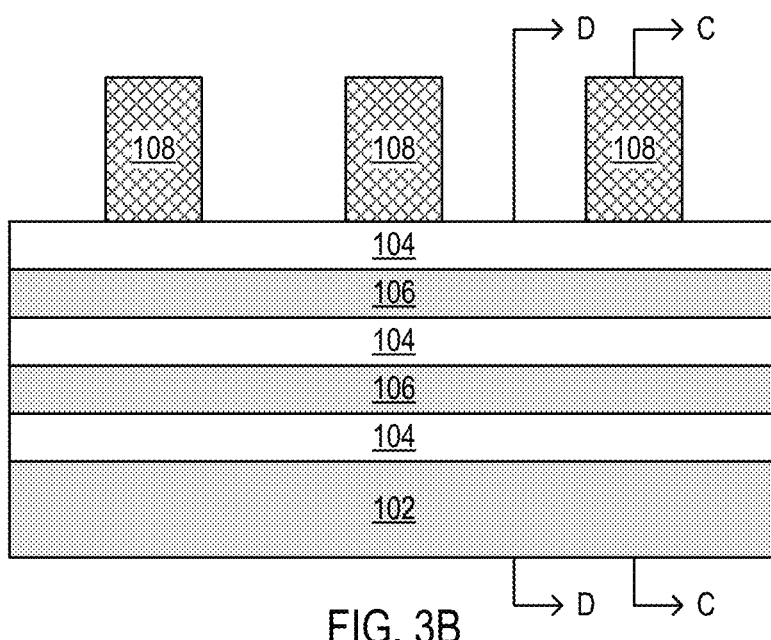
Figure 3C:
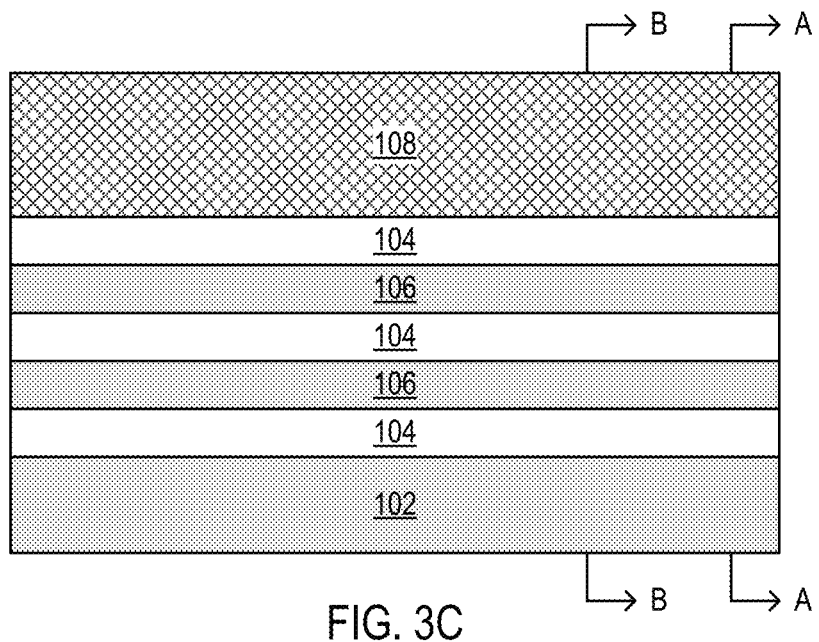
Figure 3D:
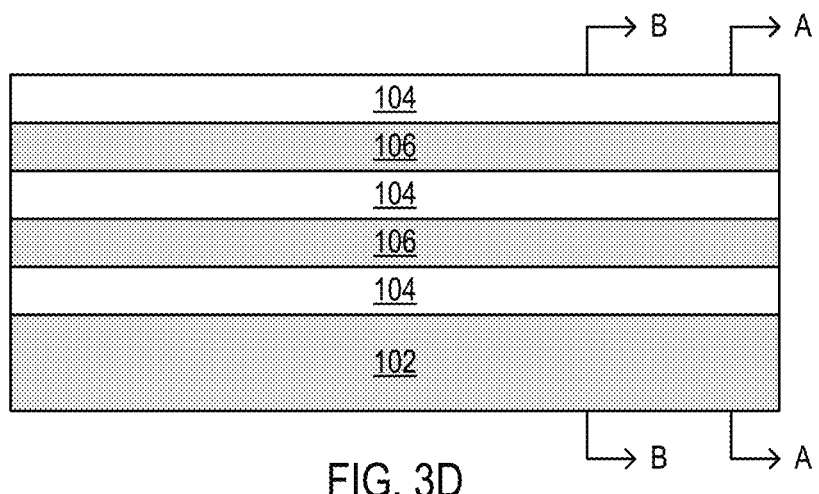
Figure 4A:
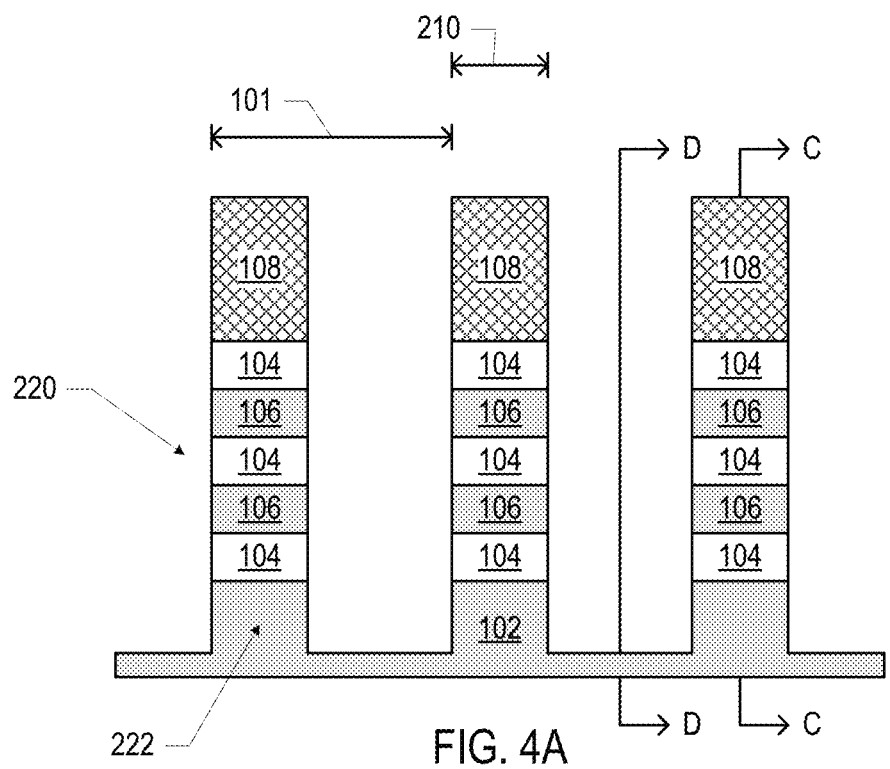
Figure 4B:
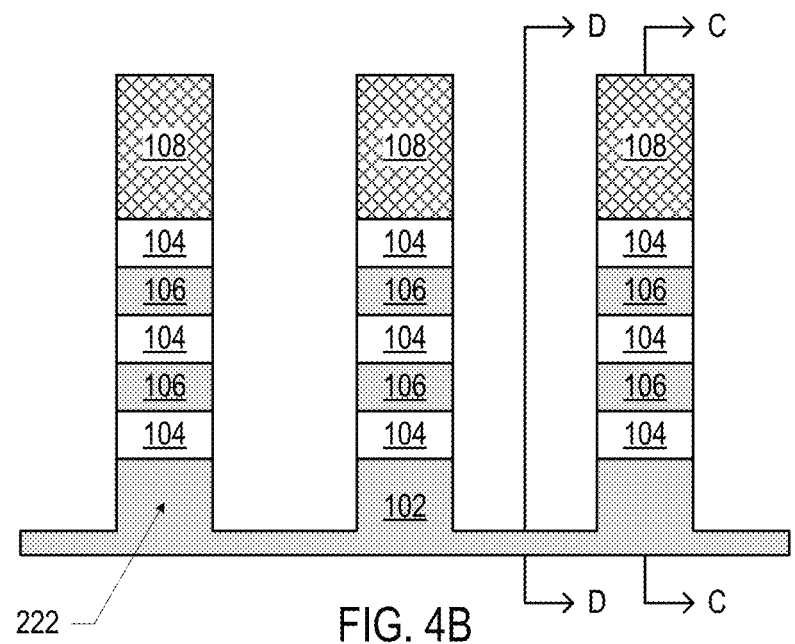
Figure 4C:
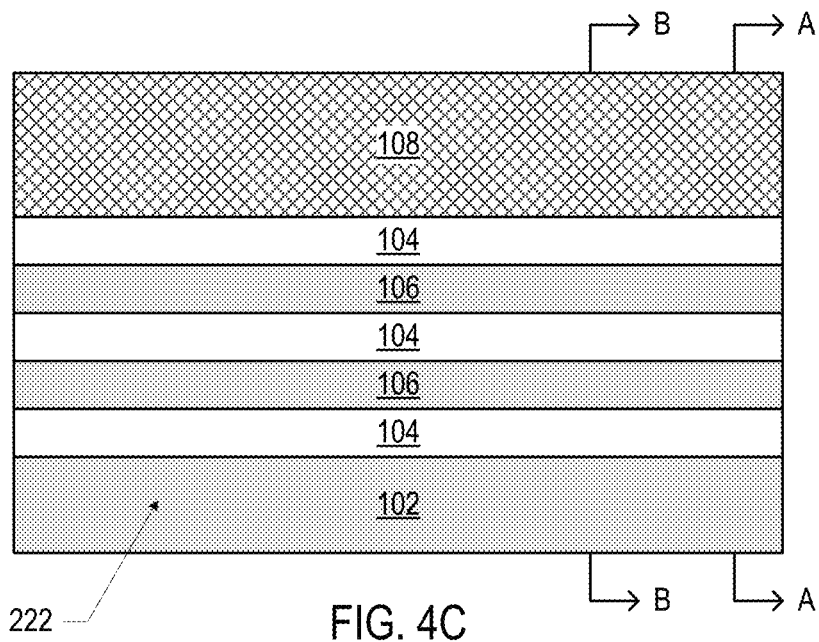
Figure 4D:
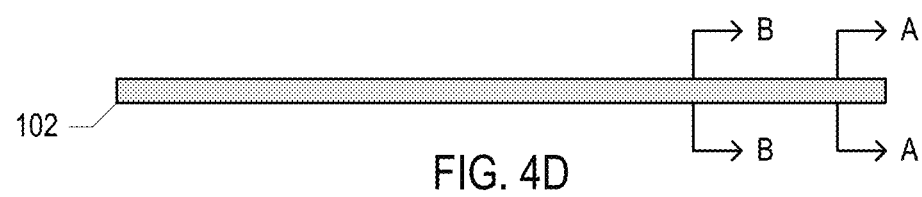
Figure 5A:
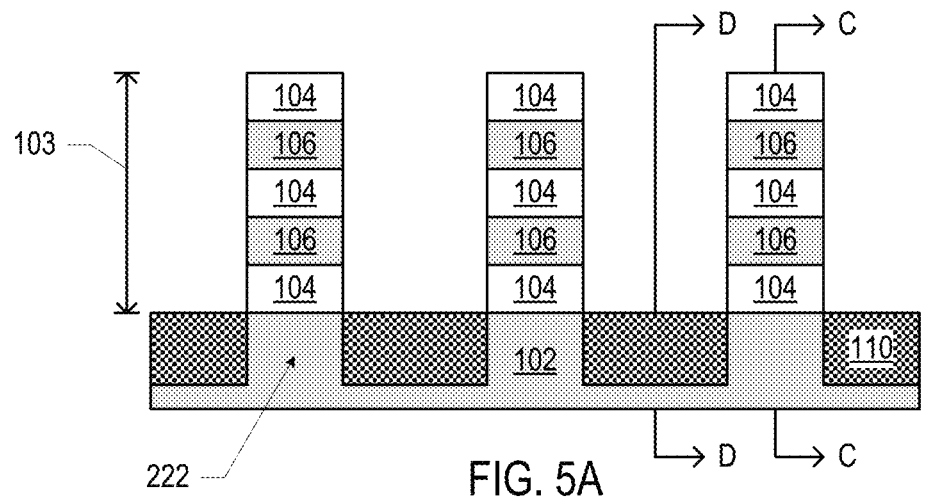
Figure 5B:
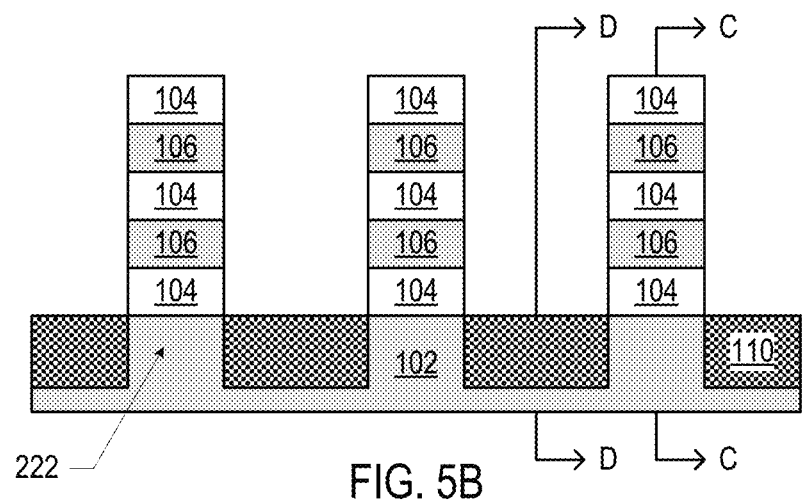
Figure 5C:
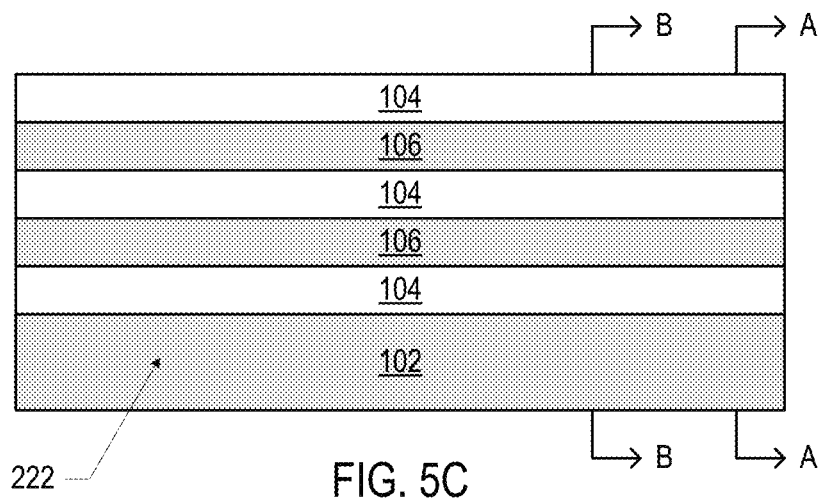
Figure 5D:
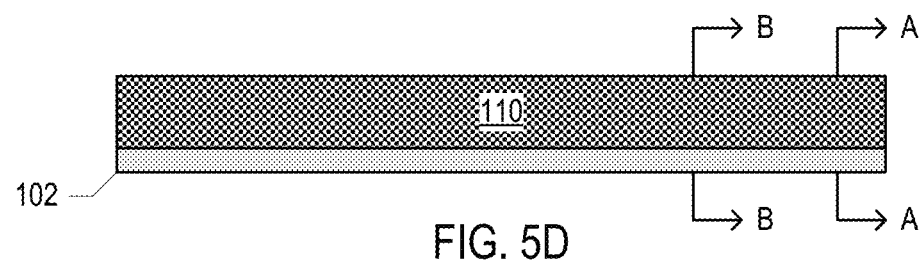
Figure 6A:
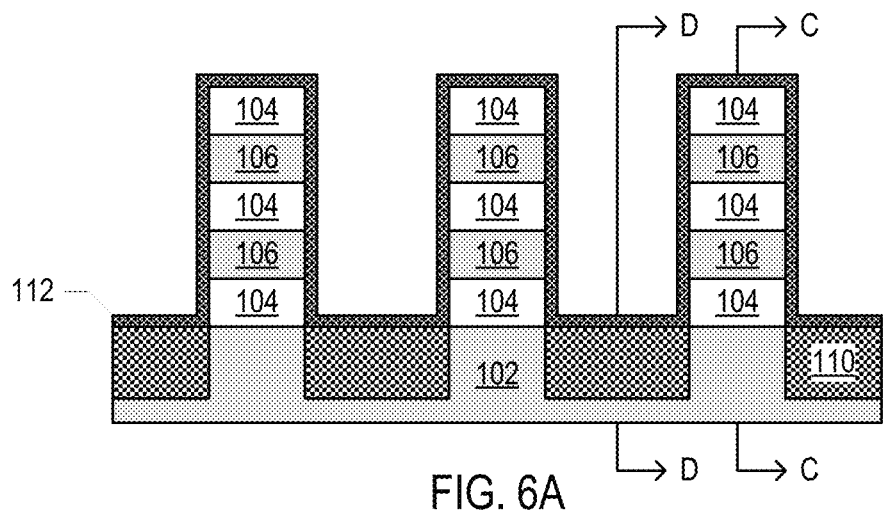
Figure 6B:
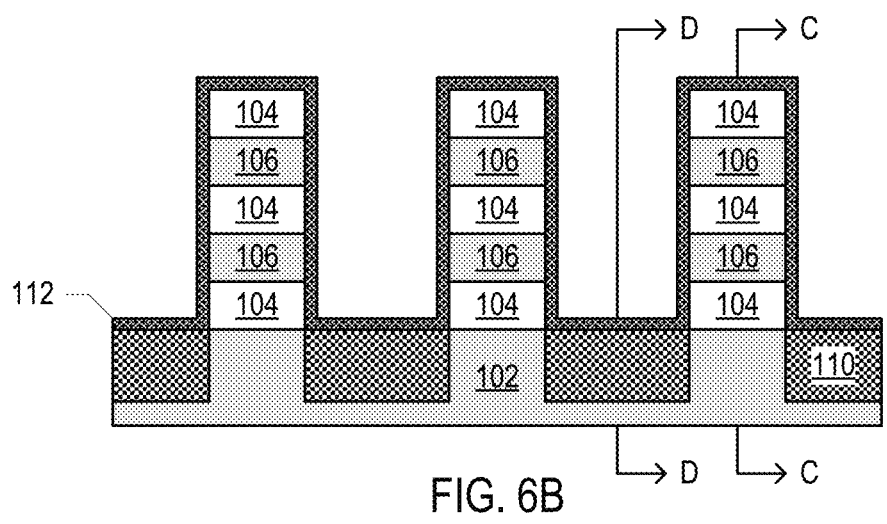
Figure 6C:
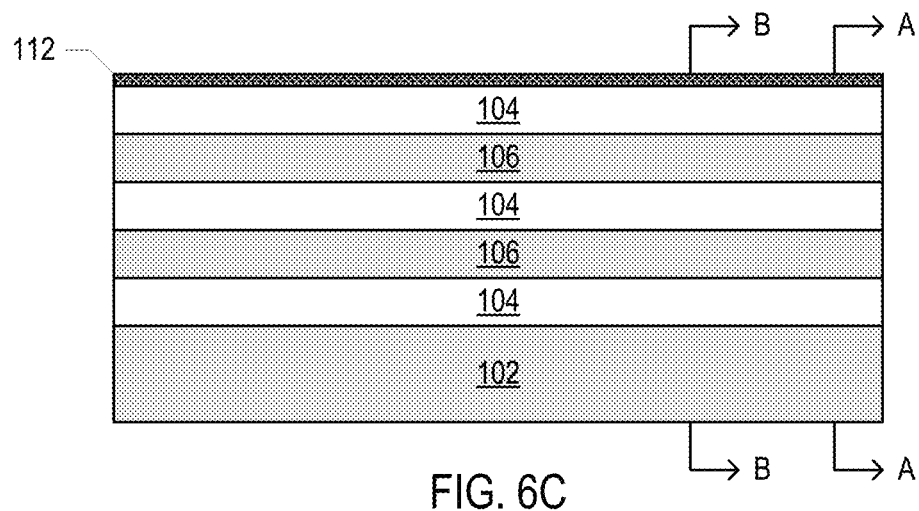
Figure 6D:
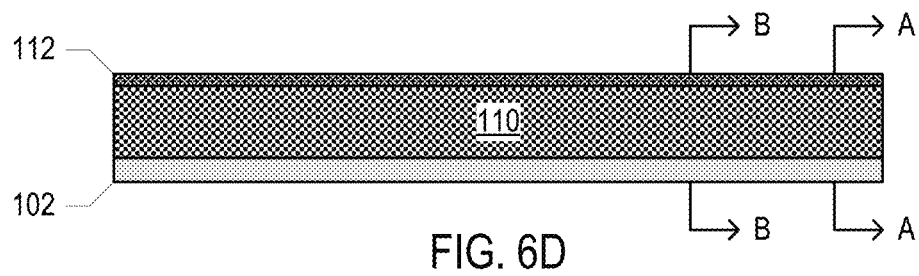
Figure 7A:
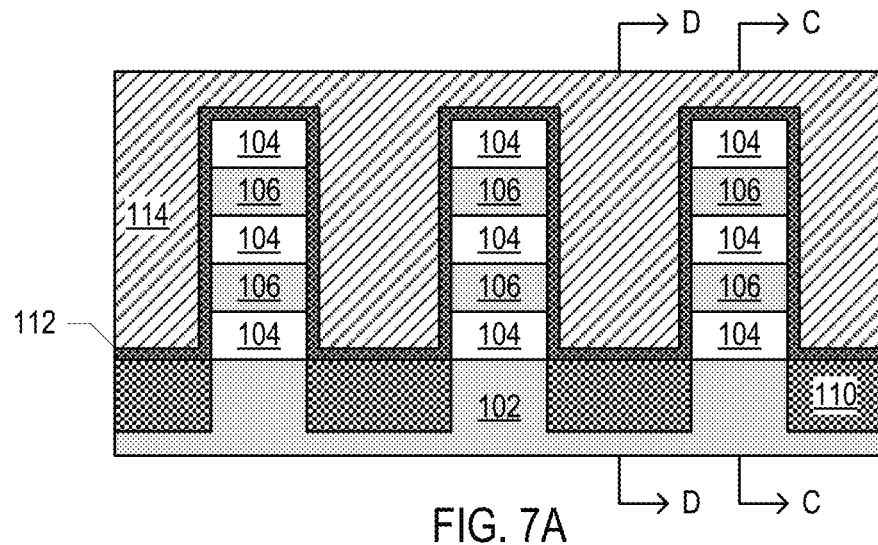
Figure 7B:
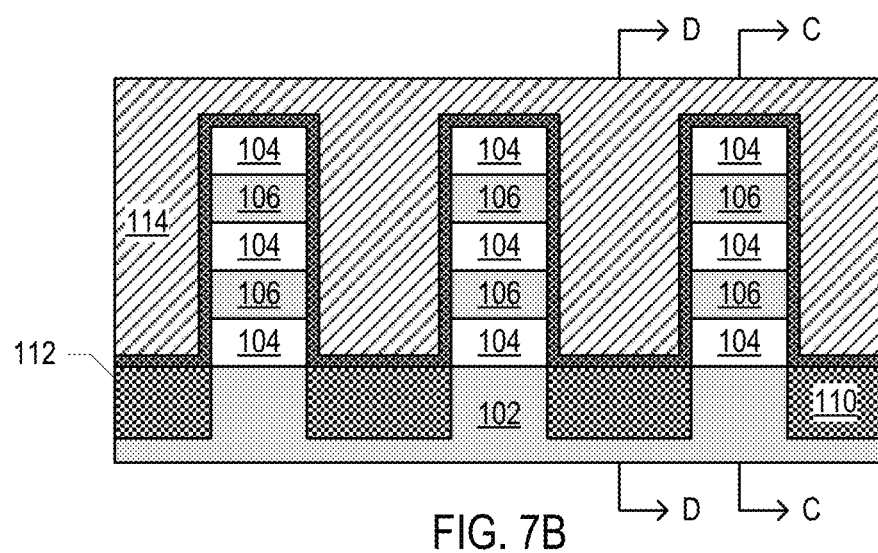
Figure 7C:
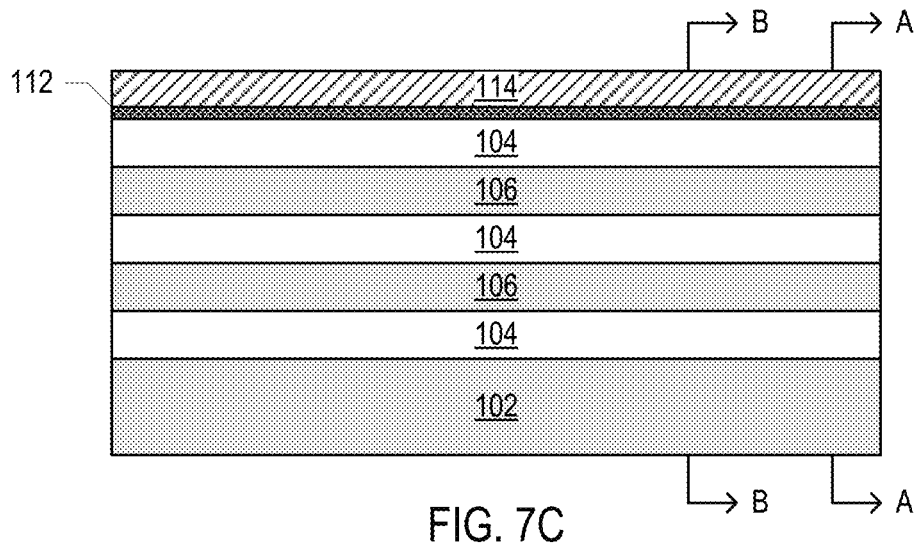
Figure 7D:
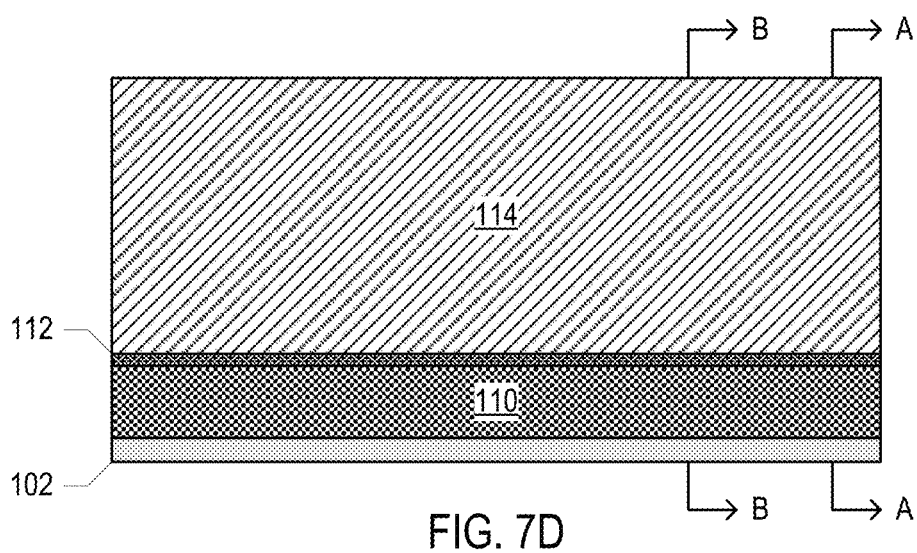
Figure 8A:
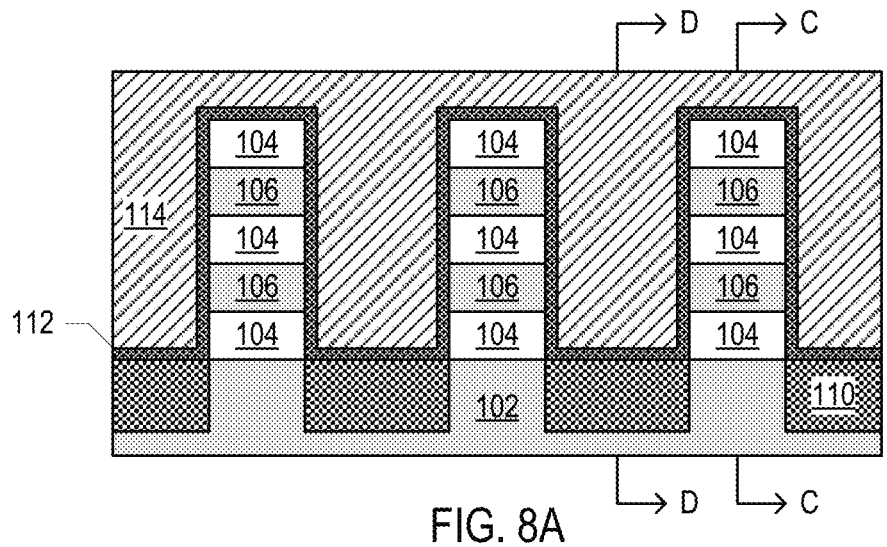
Figure 8B:
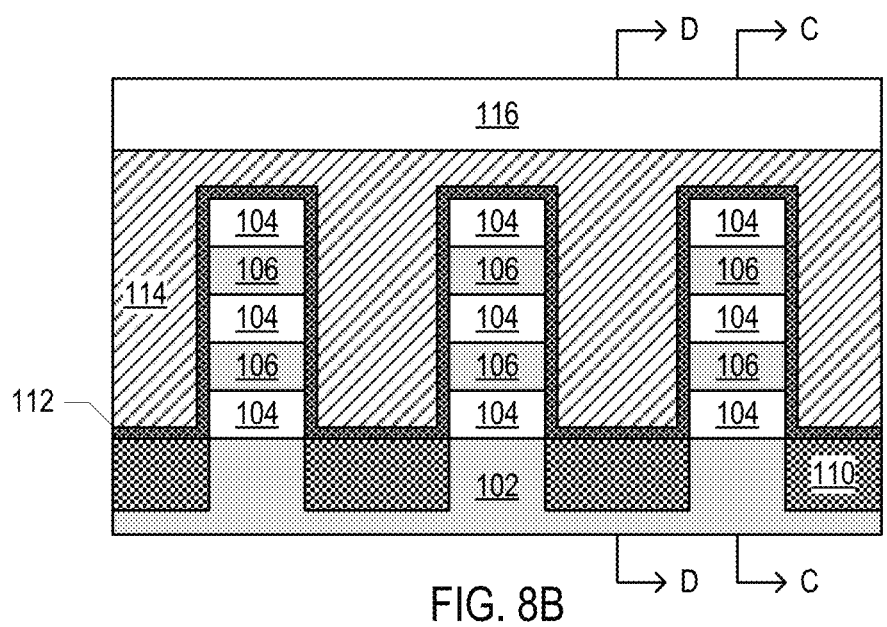
Figure 8C:
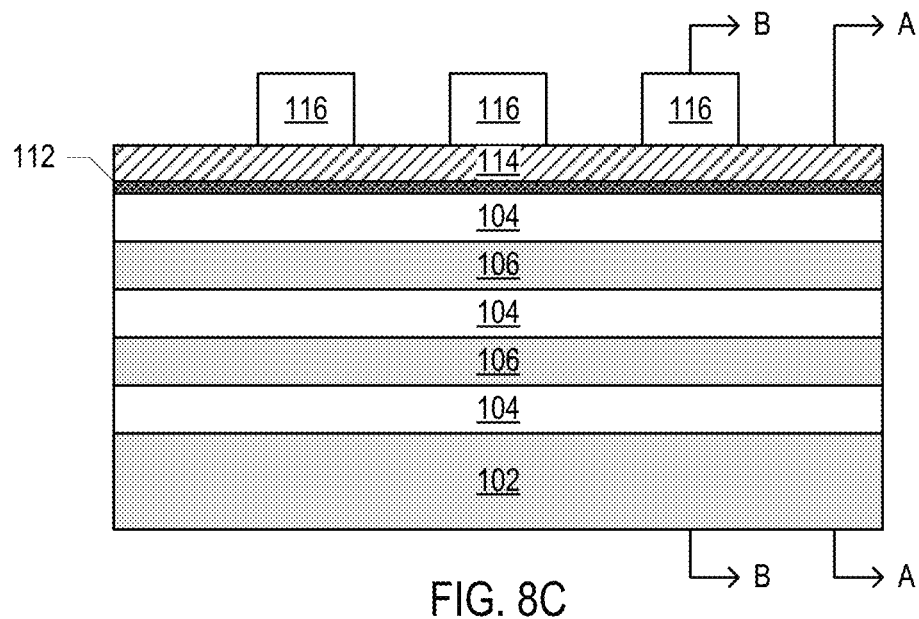
Figure 8D:
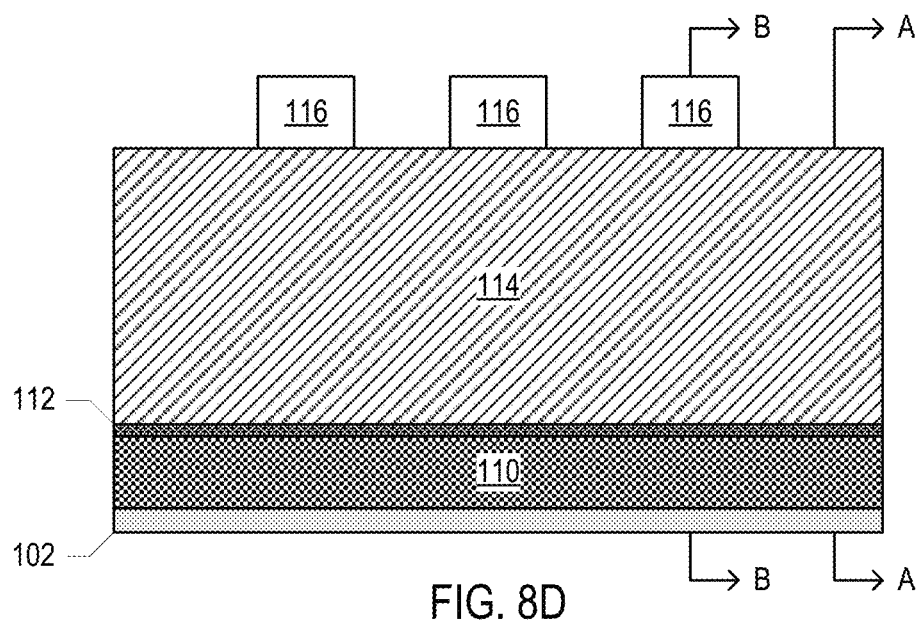
Figure 9A:
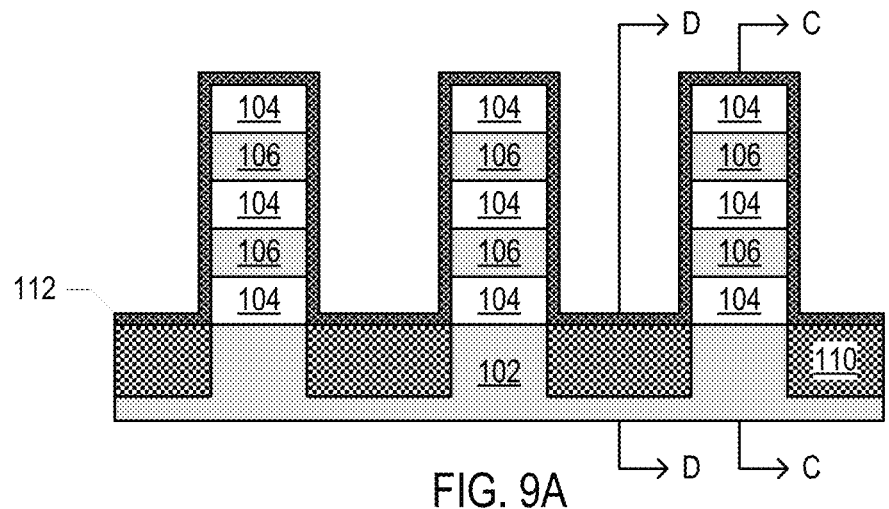
Figure 9B:
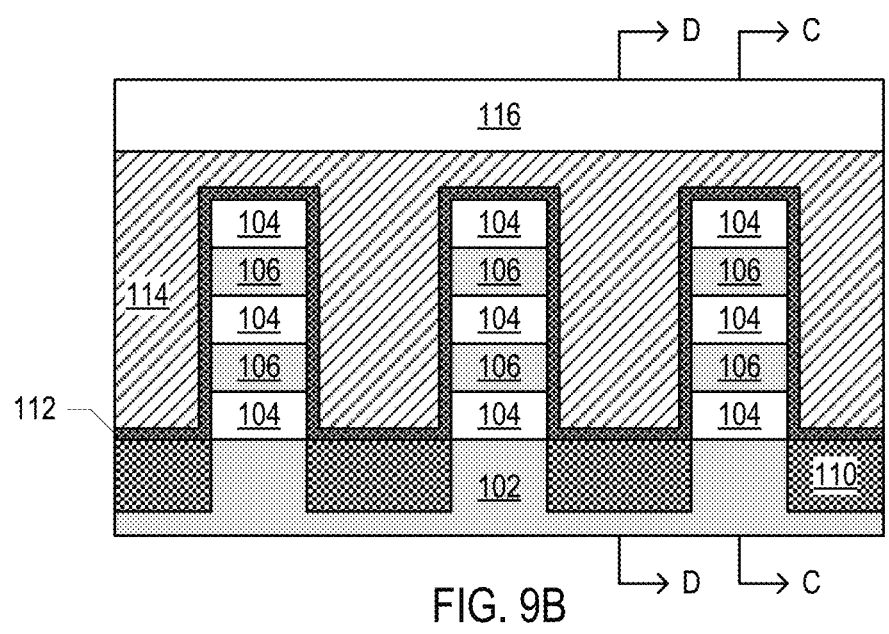
Figure 9C:
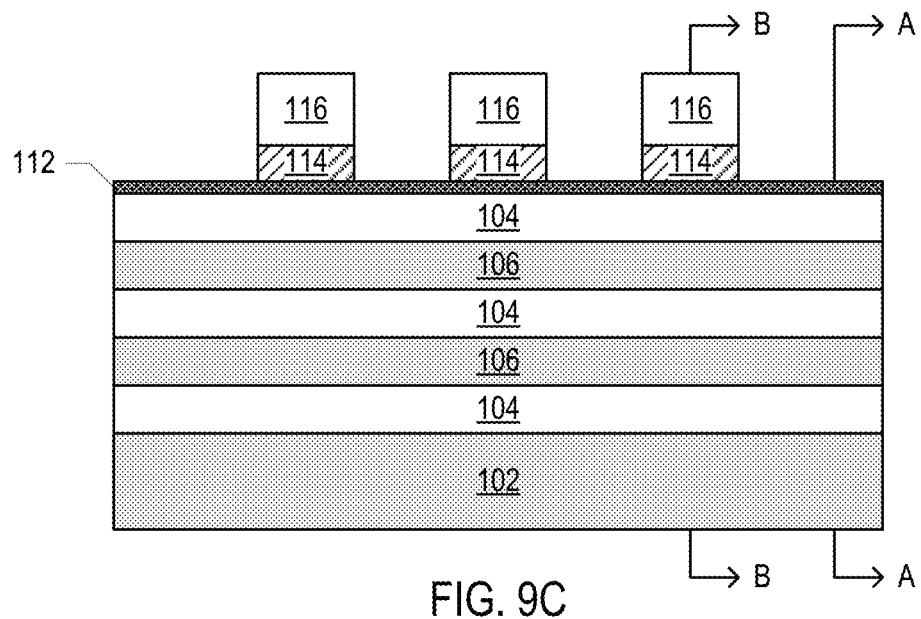
Figure 9D:
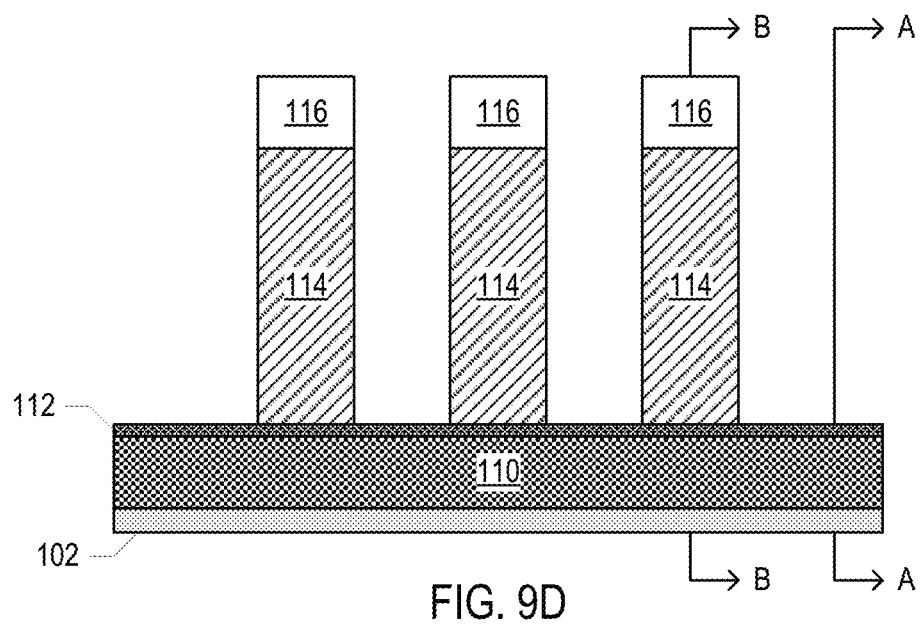
Figure 10A:
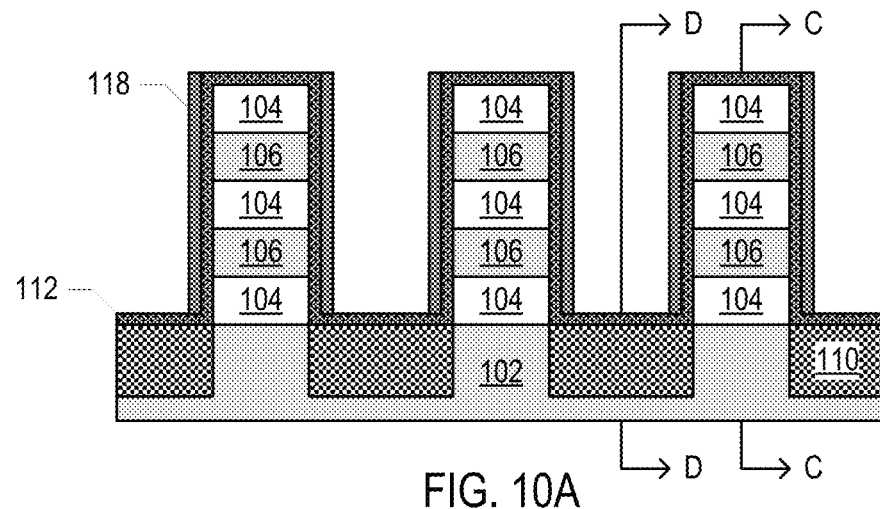
Figure 10B:
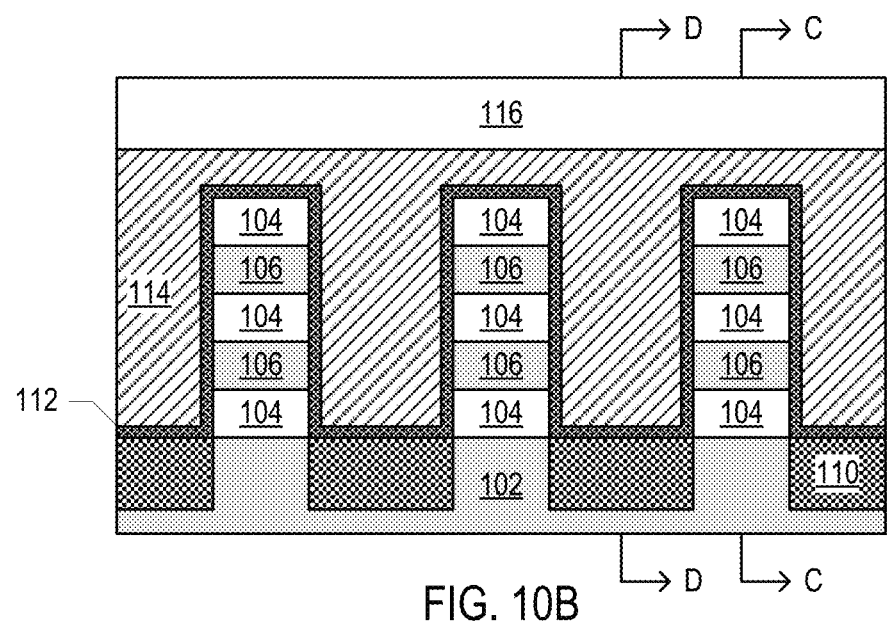
Figure 10C:
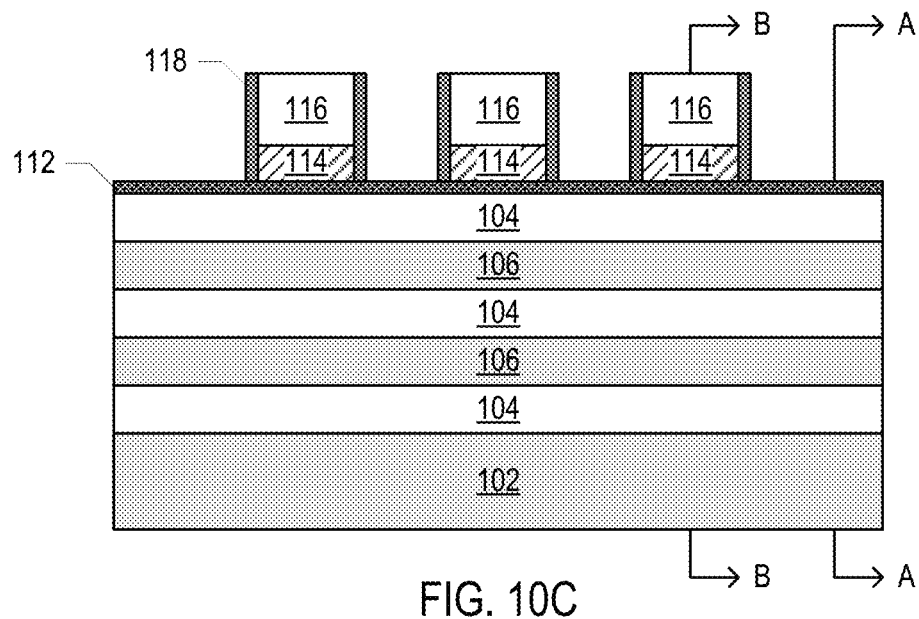
Figure 10D:
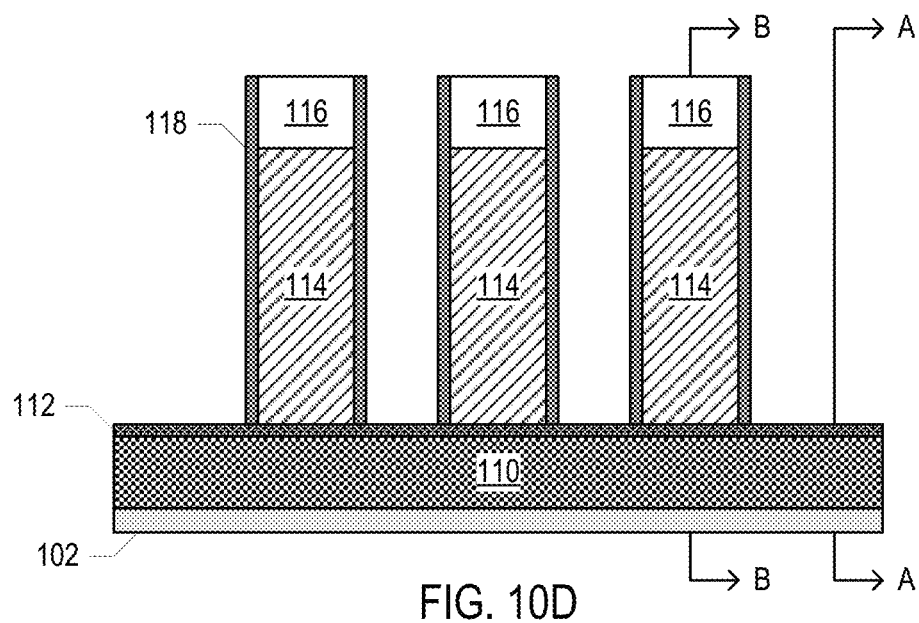
Figure 11A:
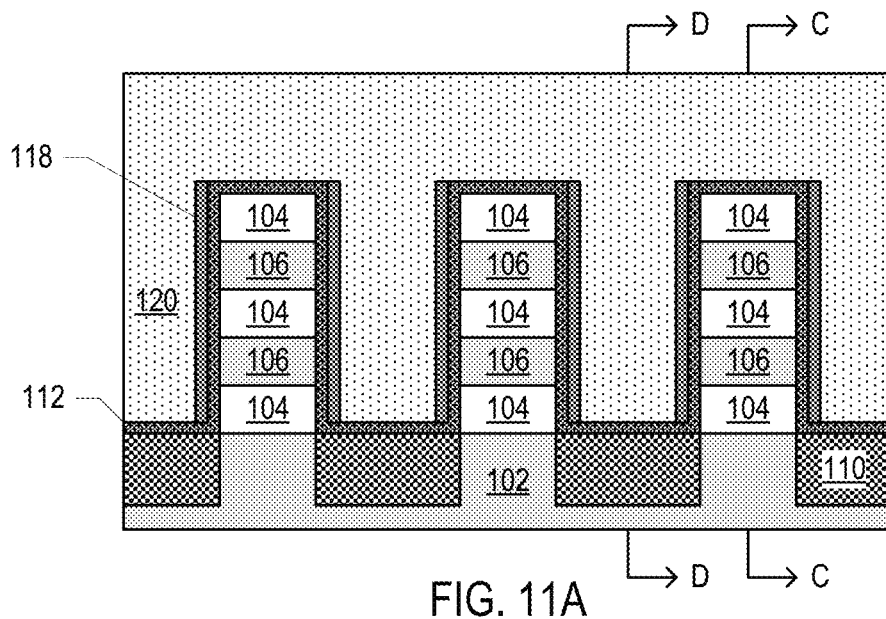
Figure 11B:
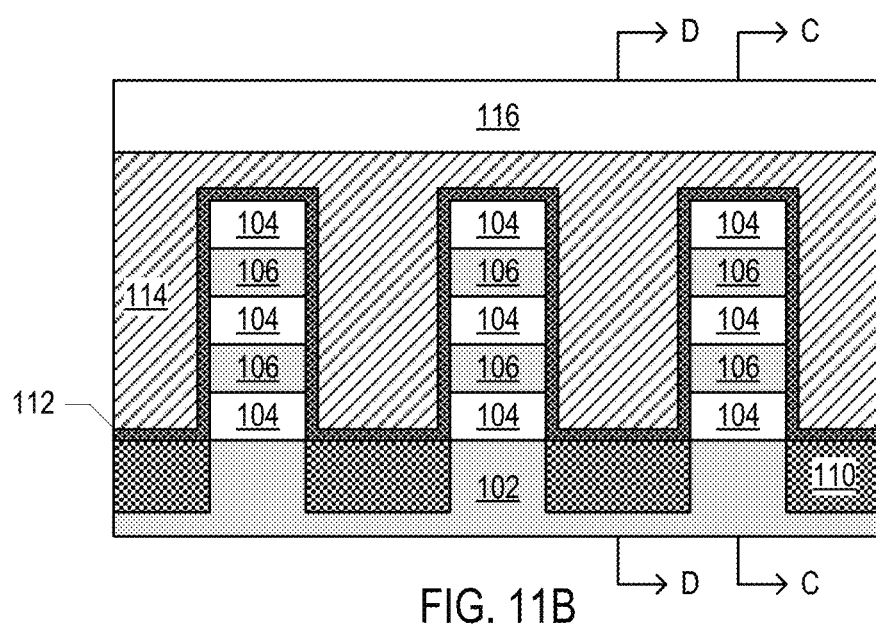
Figure 11C:
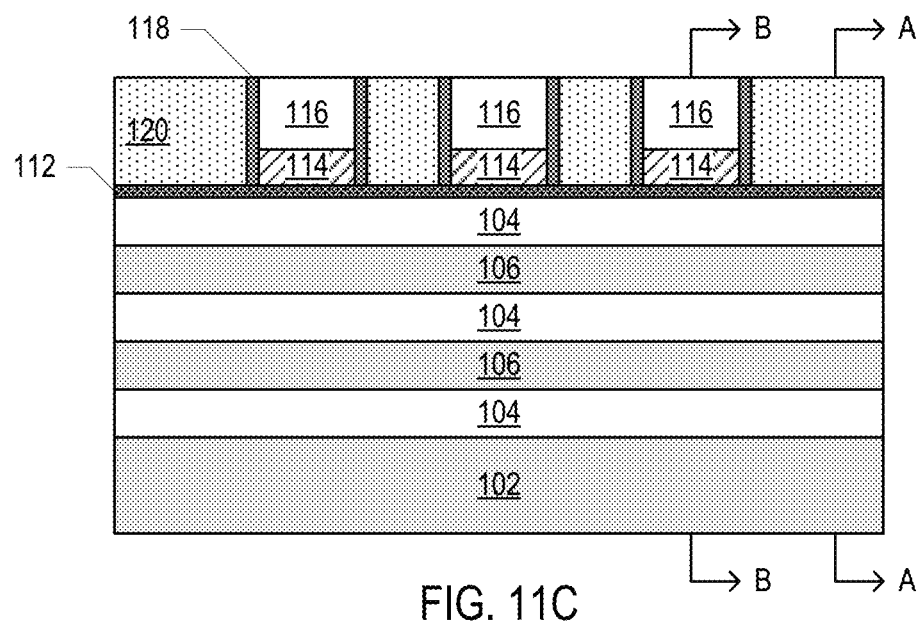
Figure 11D:
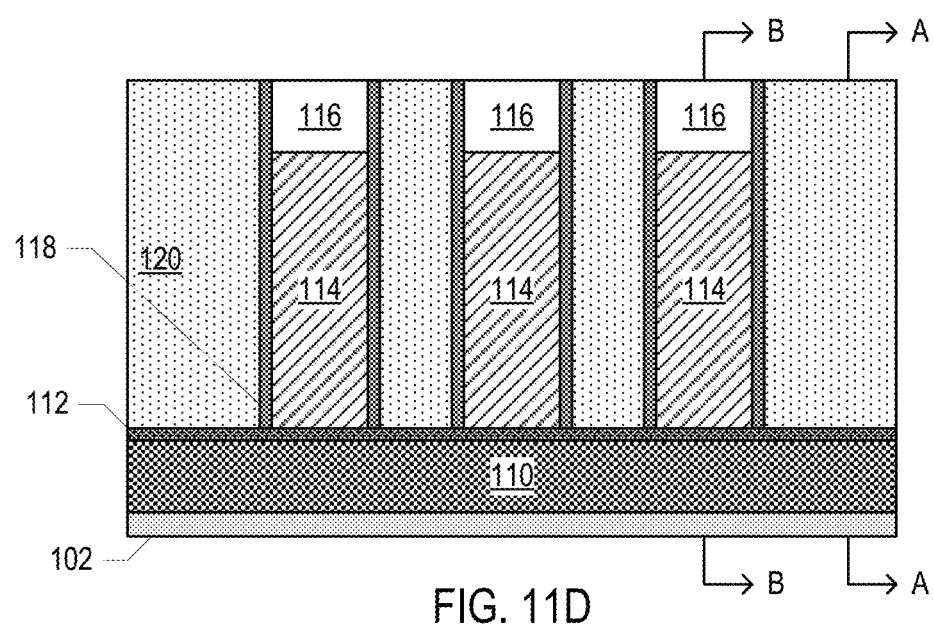
Figure 12A:
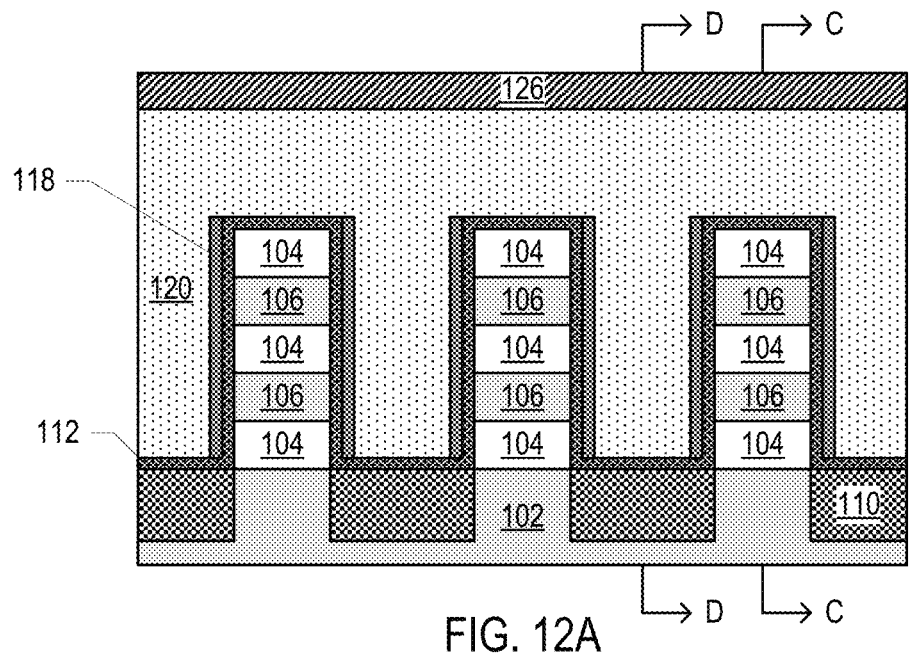
Figure 12B:
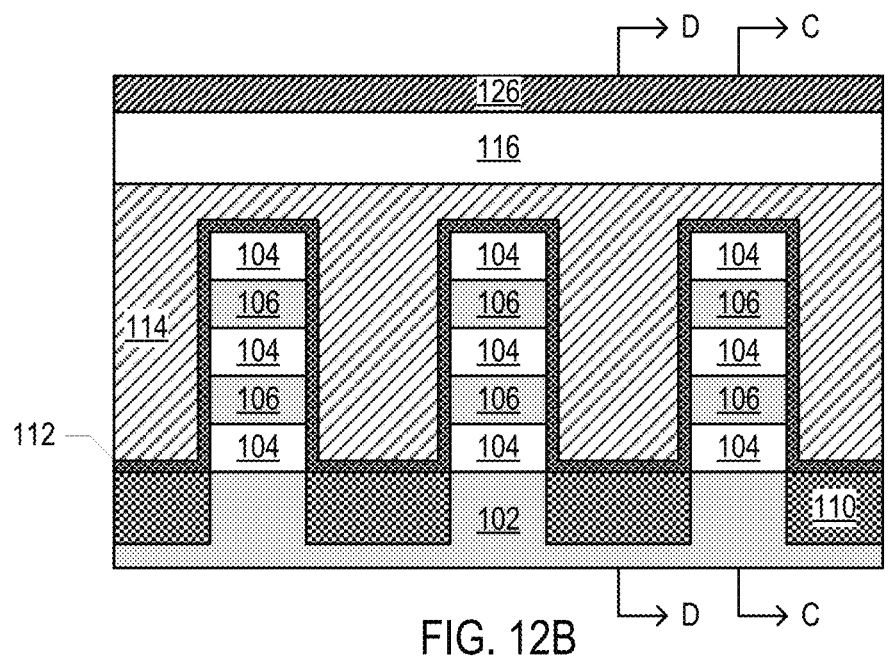
Figure 12C:
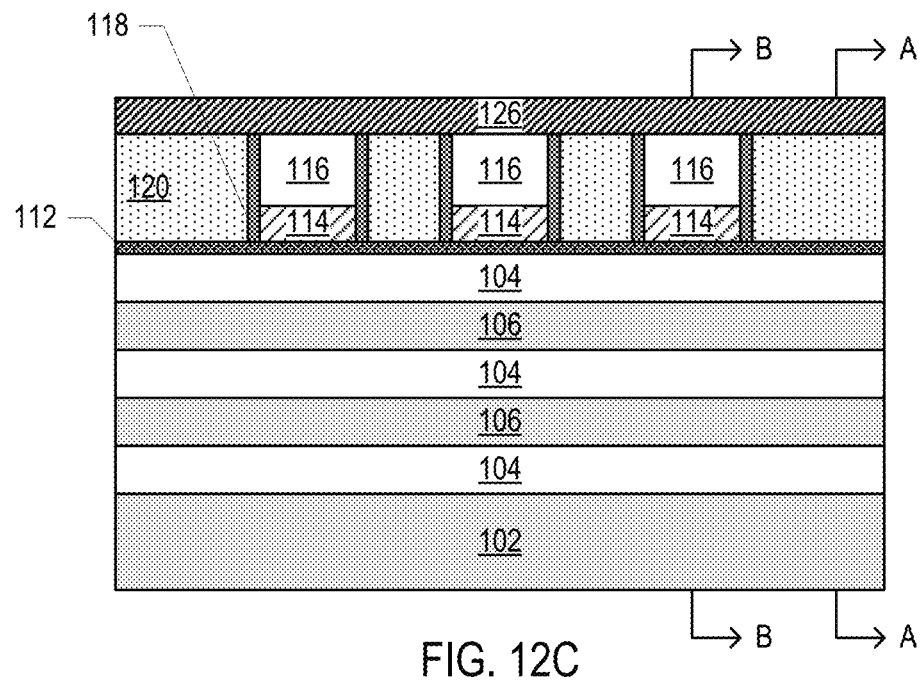
Figure 12D:
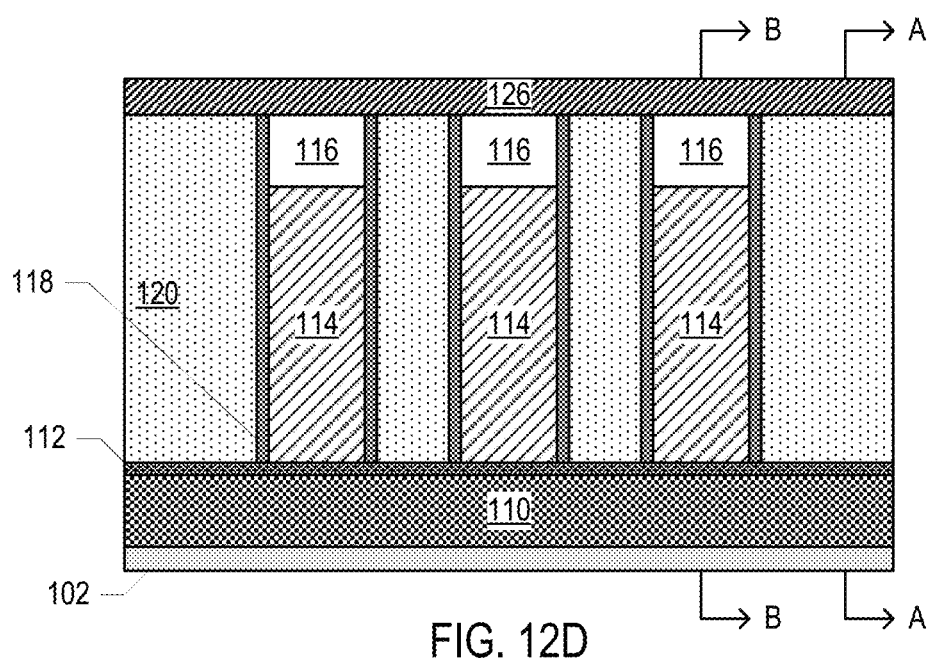
Figure 13A:
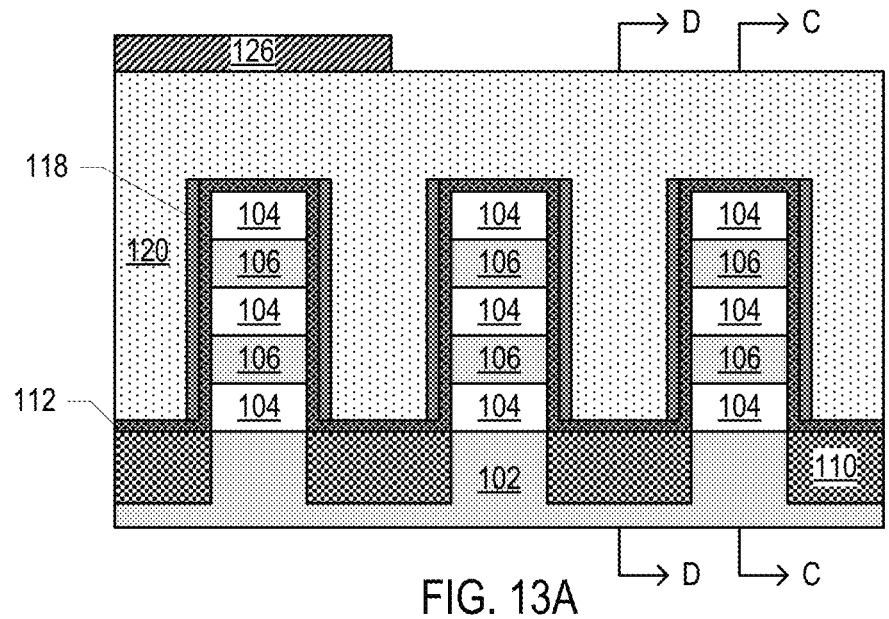
Figure 13B:
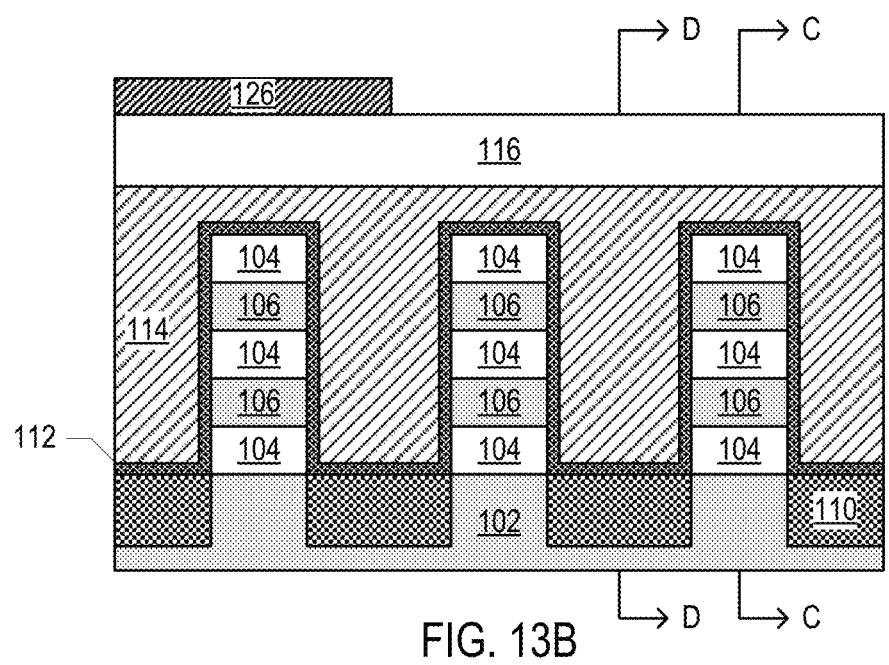
Figure 13C:
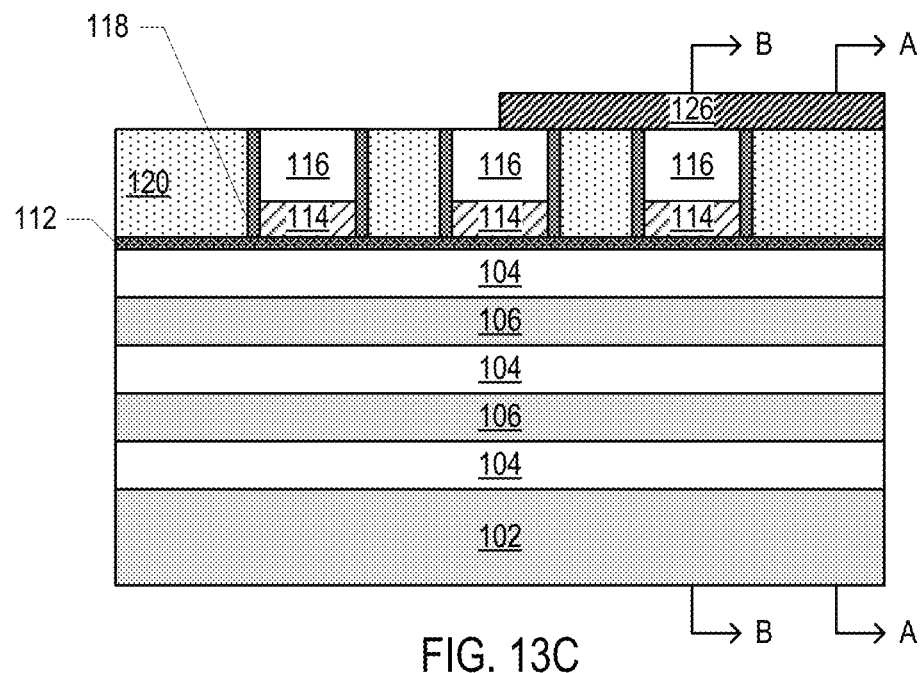
Figure 13D:
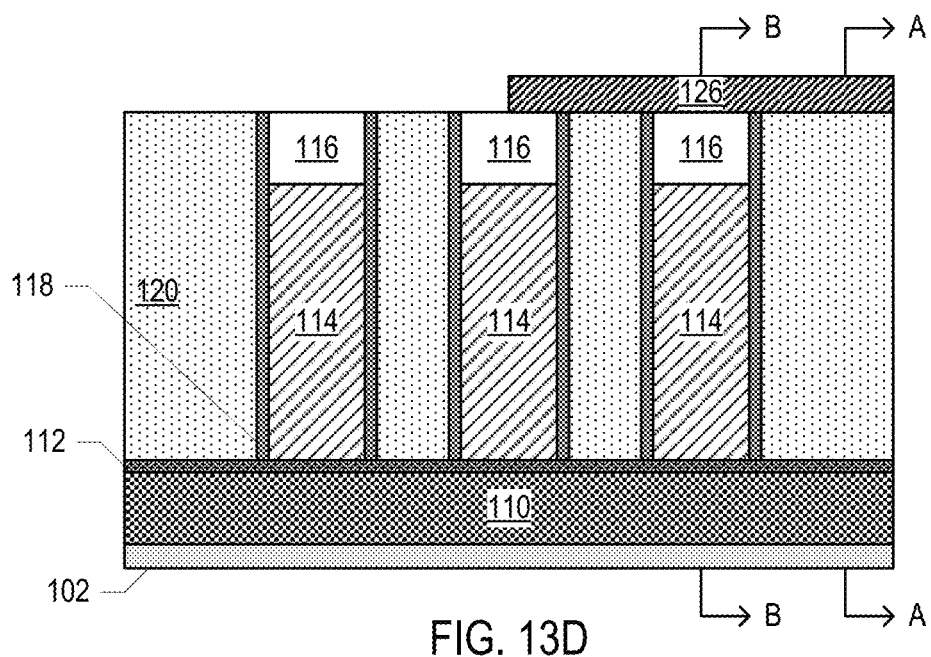
Figure 14A:
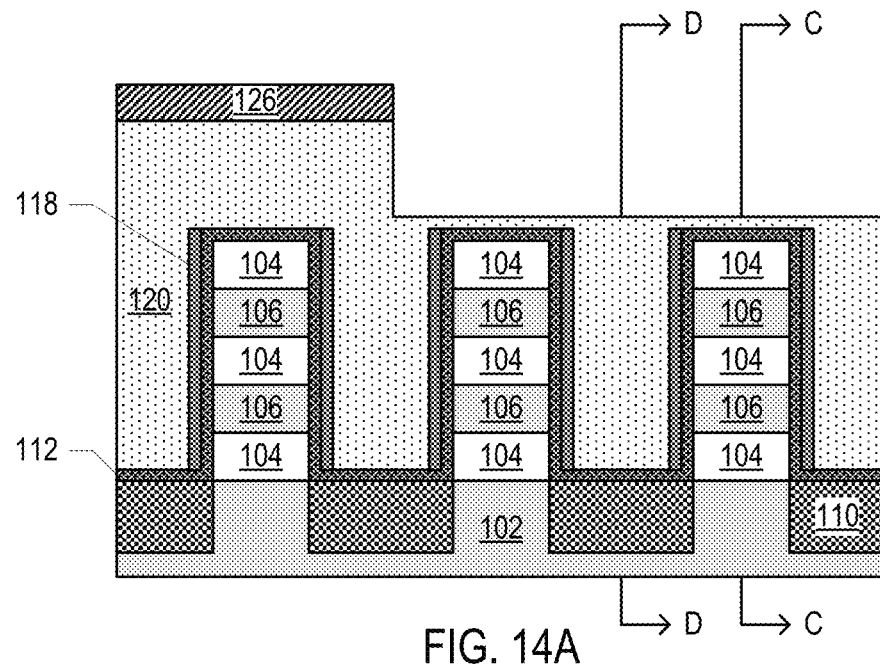
Figure 14B:
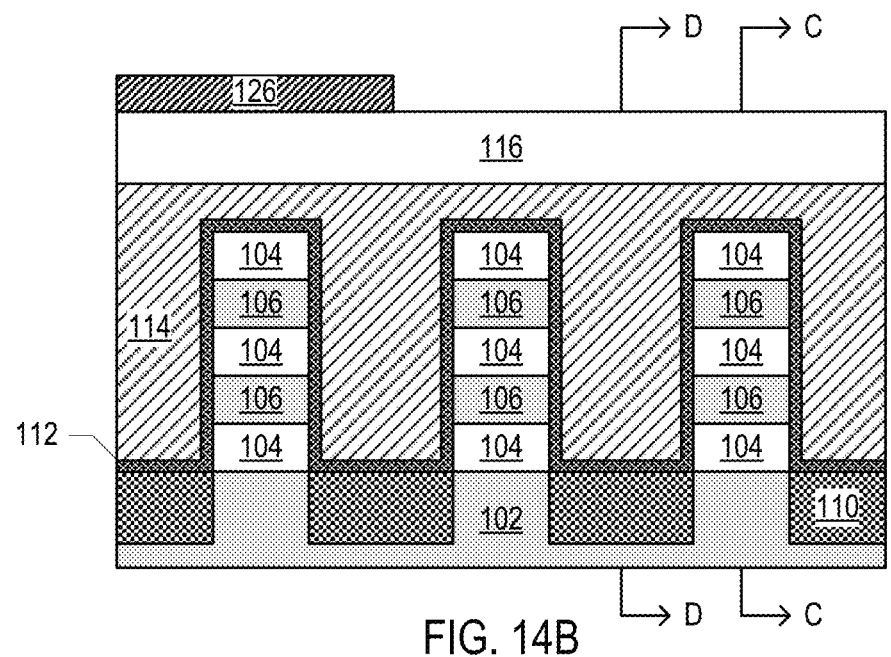
Figure 14C:
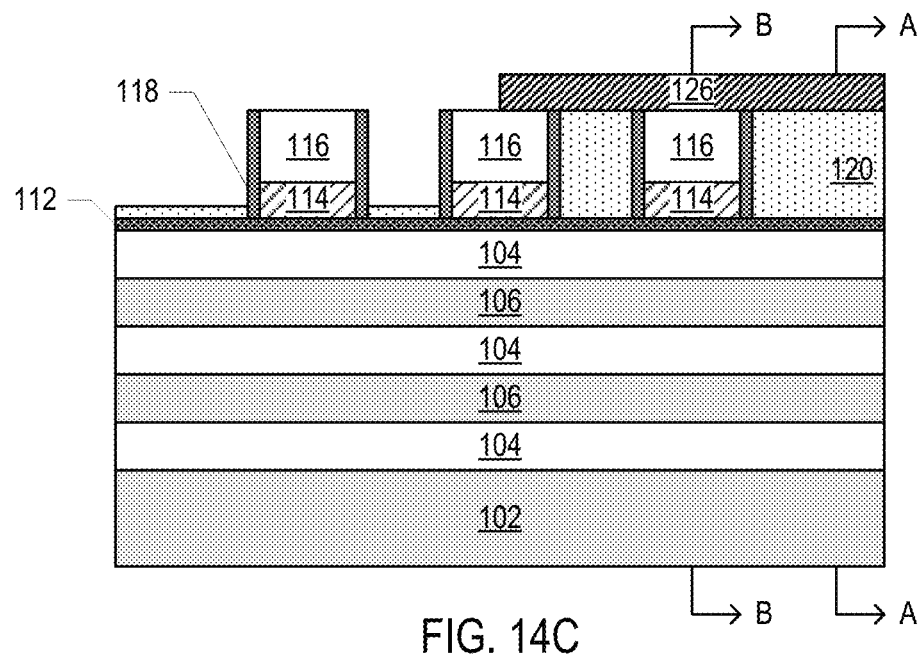
Figure 14D:
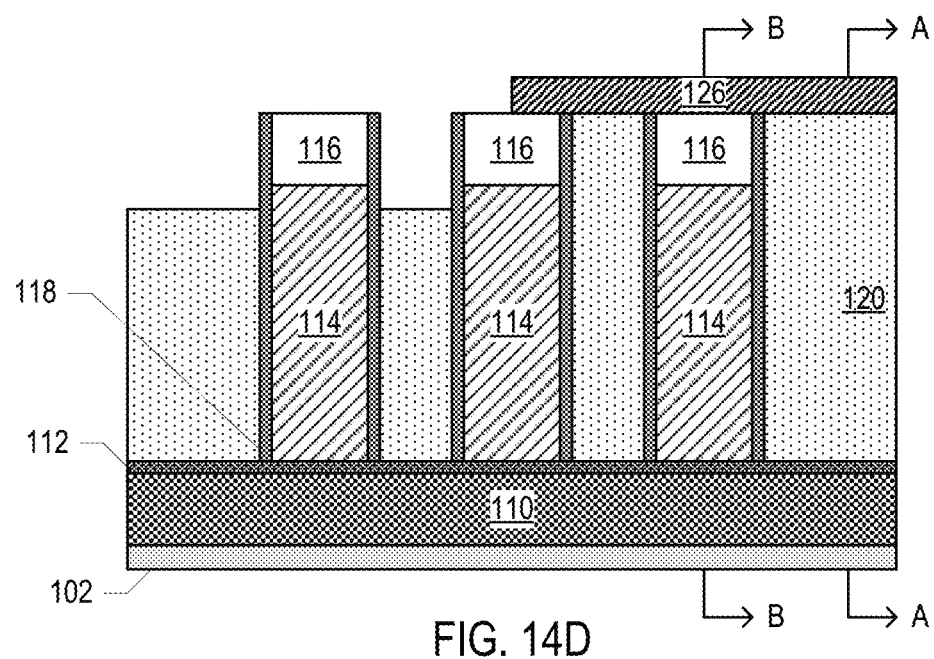
Figure 15A:
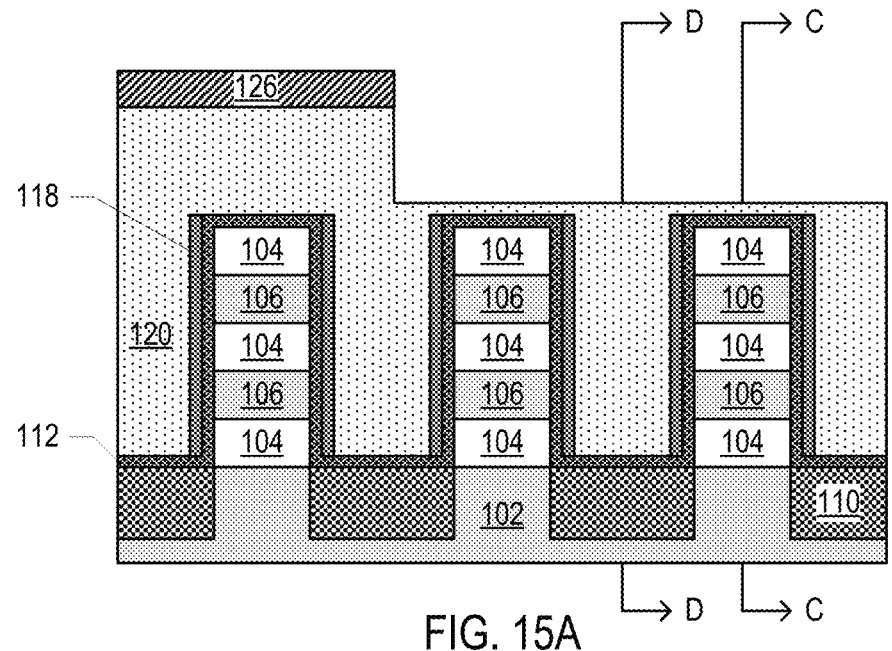
Figure 15B:
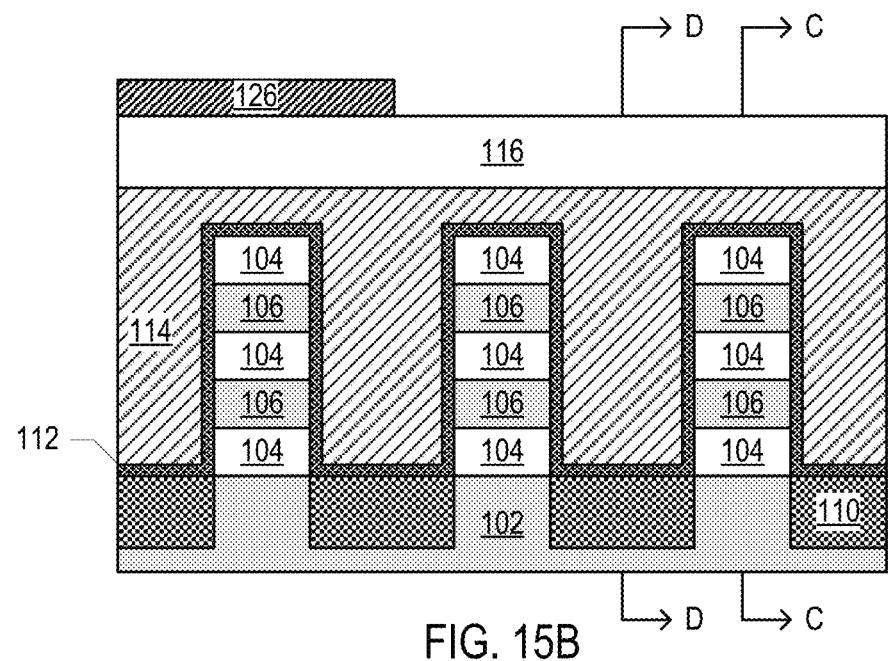
Figure 15C:
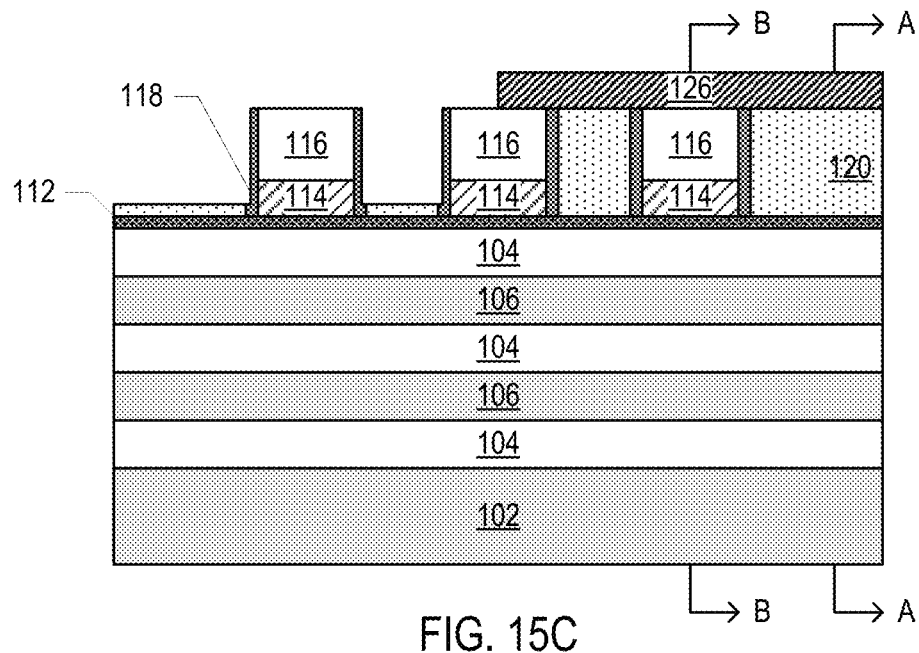
Figure 15D:
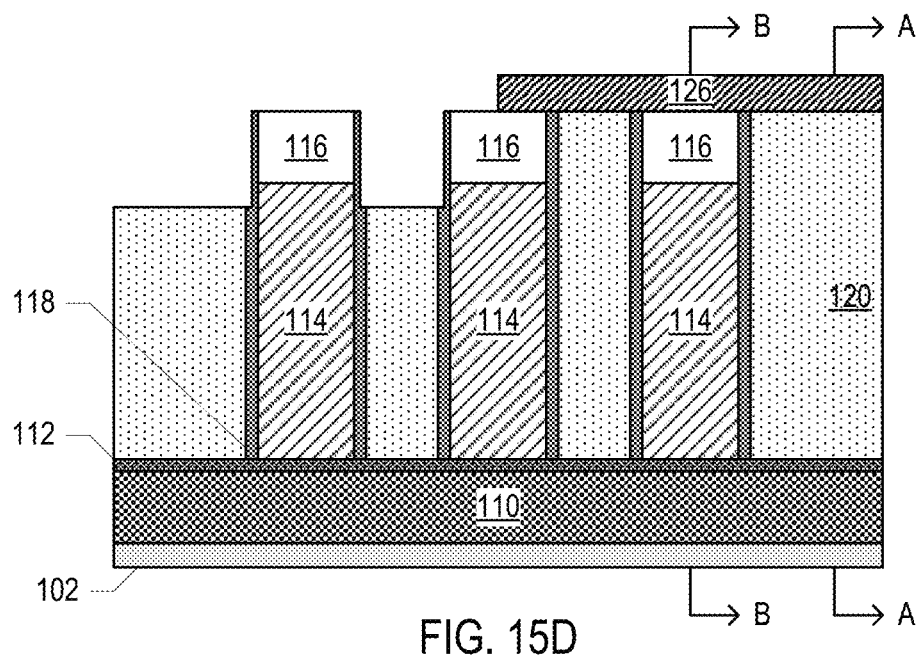
Figure 16A:
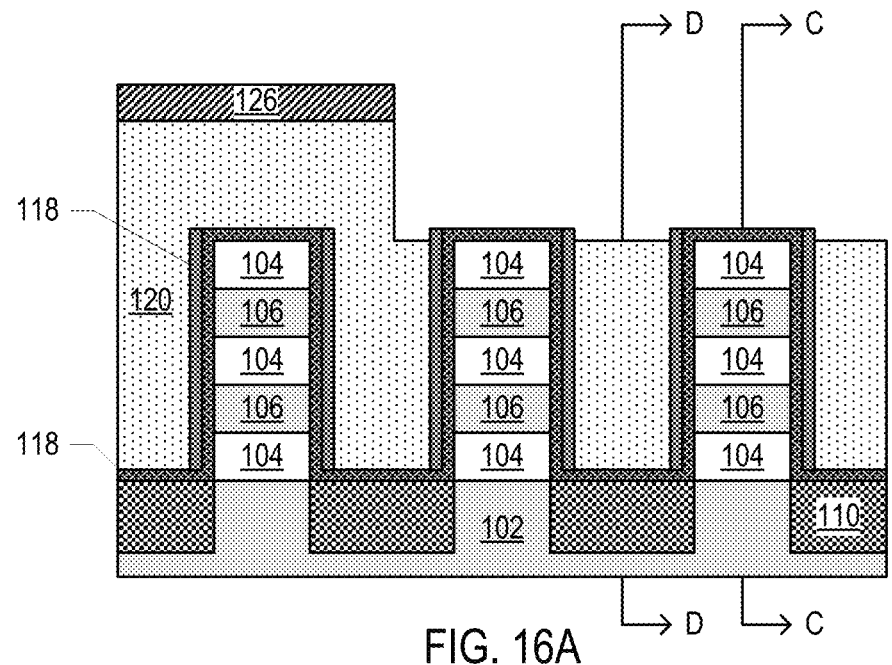
Figure 16B:
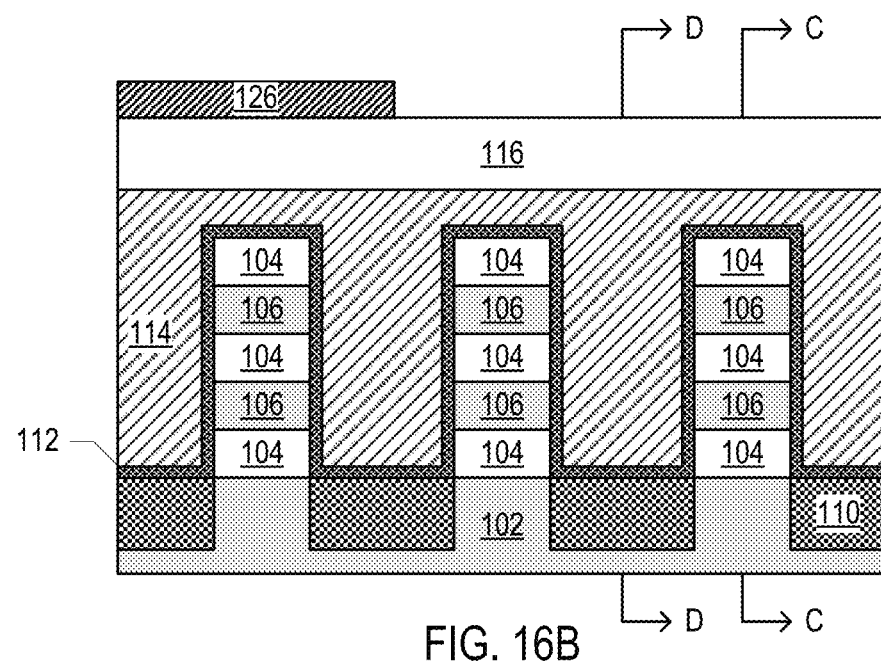
Figure 16C:
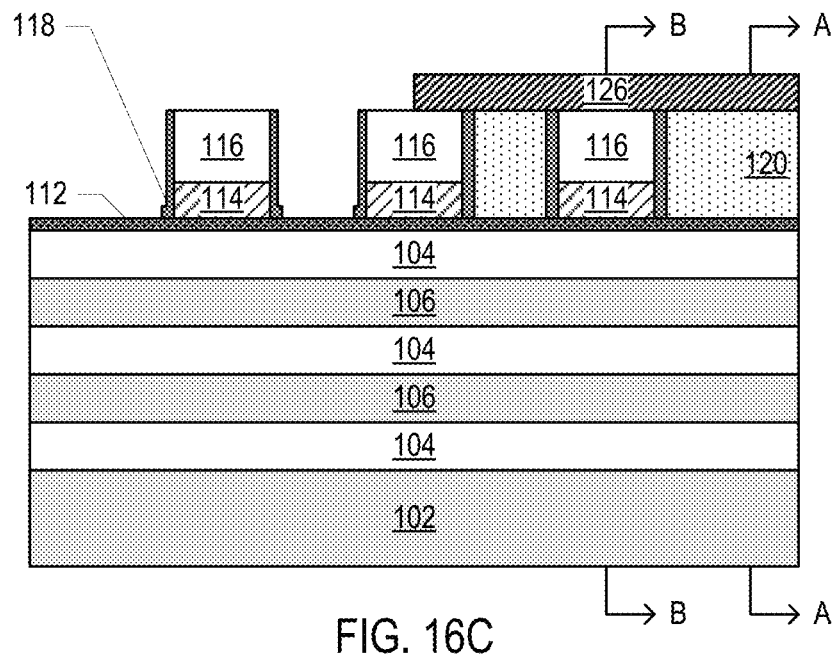
Figure 16D:
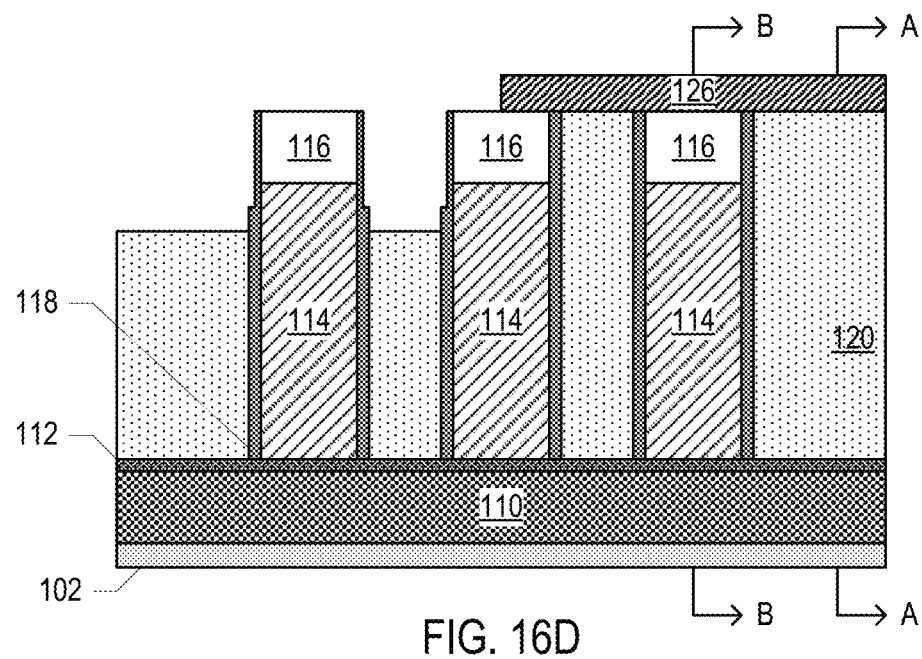
Figure 17A:
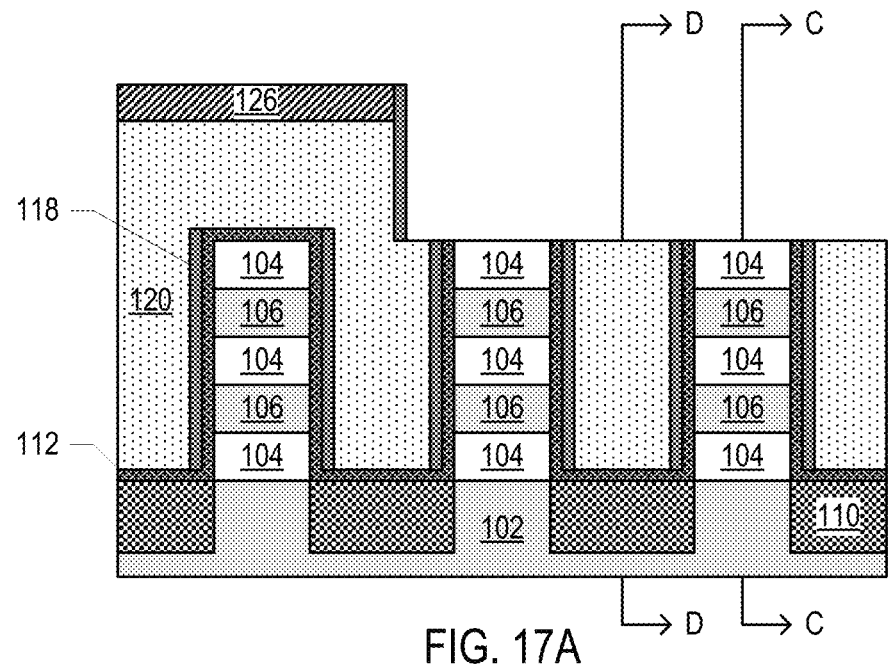
Figure 17B:
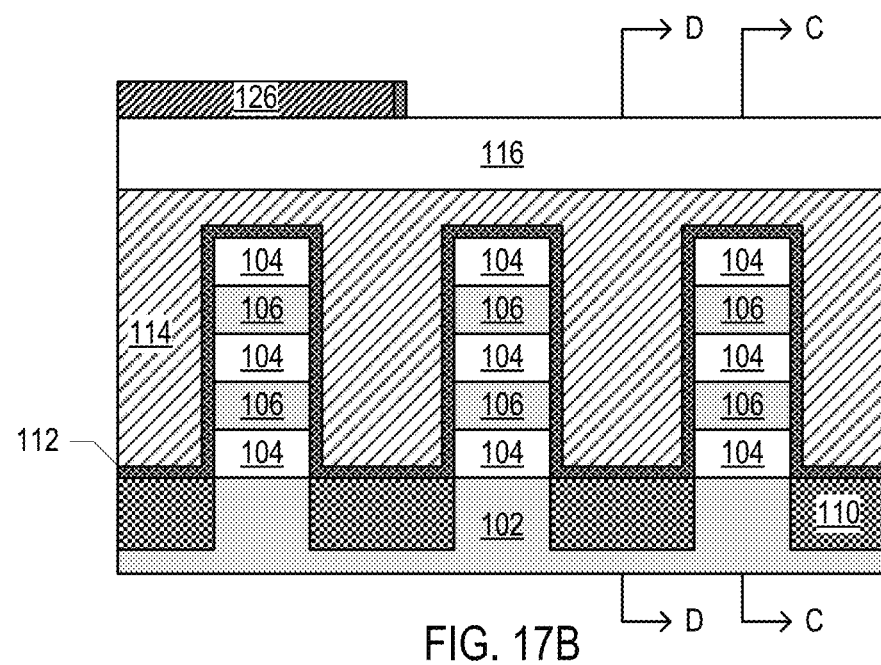
Figure 17C:
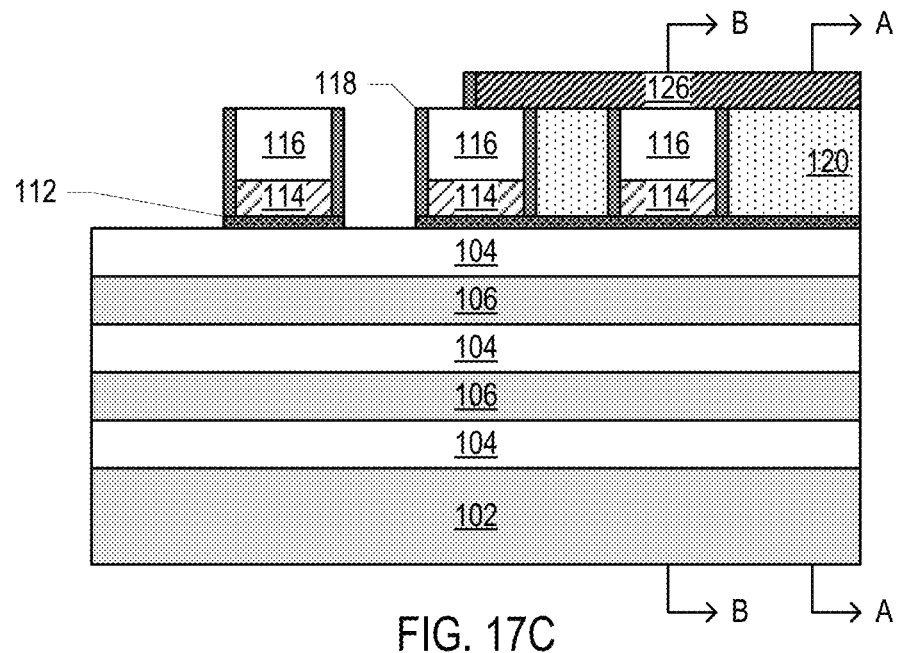
Figure 17D:
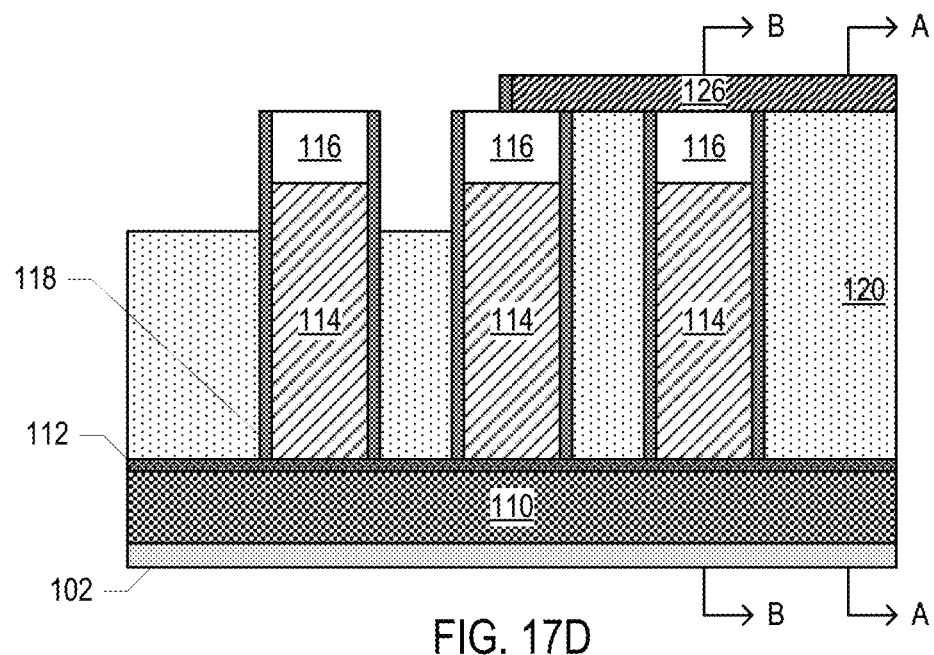
Figure 18A:
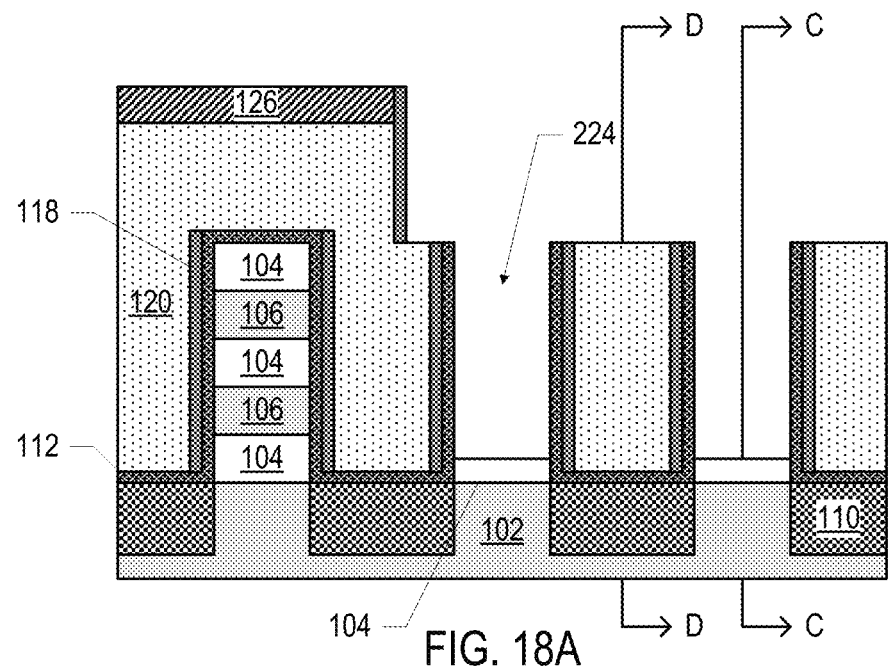
Figure 18B:
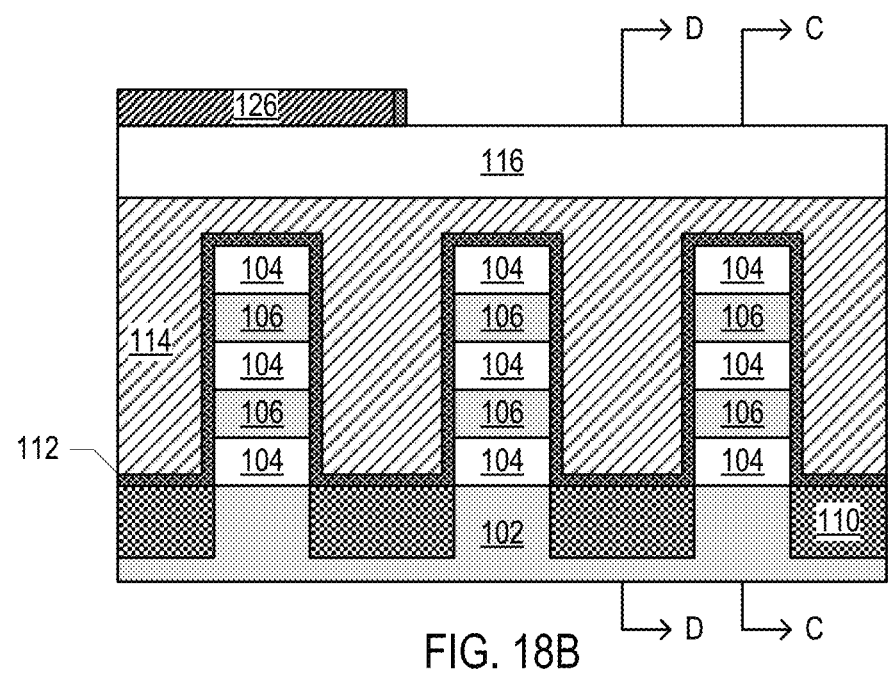
Figure 18C:
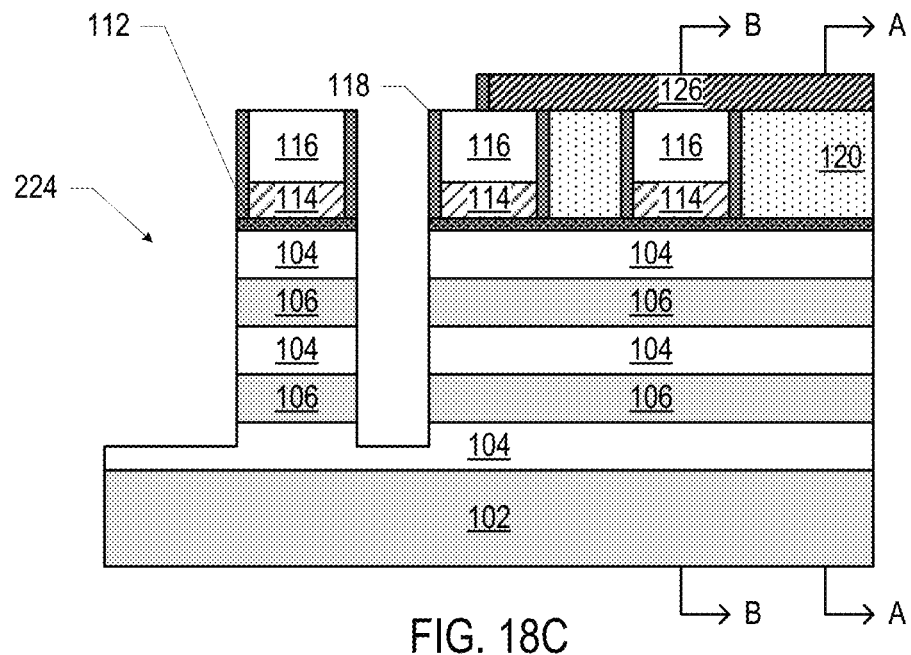
Figure 18D:
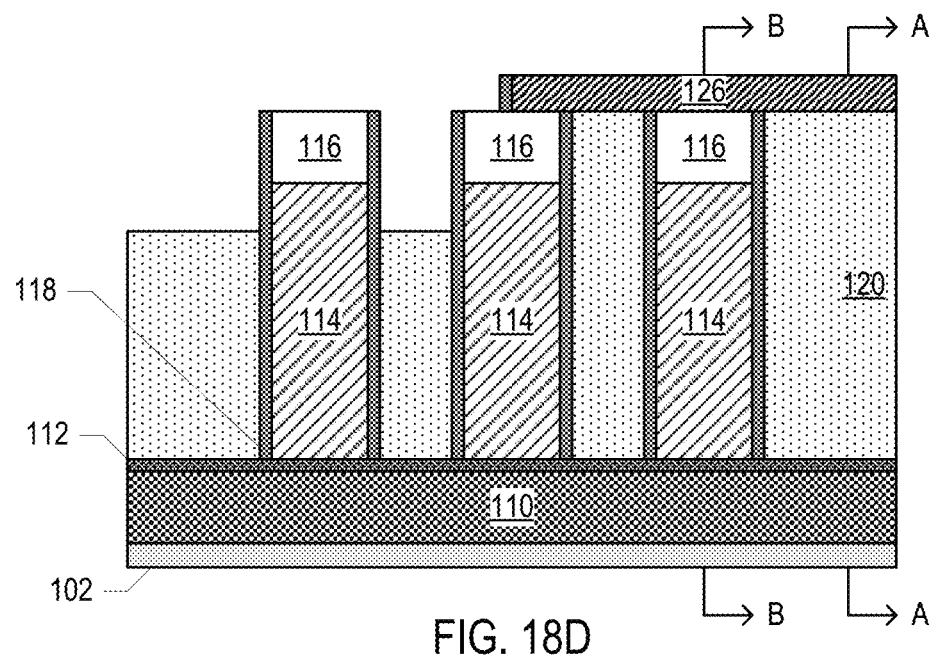

The S/D regions 150/152 may also include a contact metal 164. The contact metal 164 may be in contact with the semiconductor regions 128/130 of the S/D regions 150/152, and may extend above the semiconductor regions 128/130 to facilitate electrical contact with the S/D regions 150/152 (e.g., through a conductive via in contact with the contact metal 164, not shown). The surface of the semiconductor regions 128/130 in contact with the contact metal 164 may be undulating, as shown. In some embodiments, the surface of the semiconductor regions 128/130 may have protrusions toward the contact metal 164, with individual protrusions corresponding to an individual associated channel material 106. In some embodiments, the individual protrusions in a semiconductor region 128/130 associated with adjacent channel materials 106 may contact each other, while in other embodiments, the individual protrusions in a semiconductor region 128/130 may not contact each other. FIG. 10 and others of the accompanying drawings illustrate an embodiment in which the individual protrusions in a semiconductor region 128/130 associated with adjacent channel materials 106 may just contact each other, while in other embodiments, the individual protrusions may not contact each other (e.g., as shown in FIG. 1E) or may contact each other more fully (e.g., as shown in FIG. 1F). The protrusions in the semiconductor regions 128/130 may allow at least some contact metal 164 to be located between adjacent ones of the protrusions (e.g., as shown in FIGS. 10, 1E, and 1F). Although FIG. 1A (and others of the accompanying drawings) depicts a single portion of contact metal 164 spanning ("shorting") multiple S/D regions 150/152, this is simply illustrative, and the contact metal 164 may be arranged so as to isolate and connect various ones of the S/D regions 150/152 as desired.

The S/D regions 150/152 may be partially laterally confined by insulating material regions including dielectric material 112, dielectric material 118, and dielectric material 120 between adjacent device regions 206. As shown in FIG. 1A, in some embodiments, the dielectric material 112 may have a U-shaped cross-section, with "spacers" formed of the dielectric material 118 thereon, and the dielectric material 120 therebetween.

The S/D regions 150/152 disclosed herein may increase the contact area between the contact metal 164 and the adjacent semiconductor regions 128/130 relative to conventional structures, substantially reducing the contact resistance and thereby improving device performance (e.g., improving power efficiency). As discussed below with reference to FIGS. 2-44, the S/D regions 150/152 of the IC structure 100 may be manufactured by growing "epitaxial nubs" as the semiconductor regions 128/130, and then filling the volume between opposing sets of semiconductor regions 128/130 with the contact metal 164. Such manufacturing techniques do not add significant complexity to a manufacturing flow, and thus may be quickly and efficiently adopted.

In the IC structure 100 of FIG. 1, a dielectric material 166 may be present between the S/D regions 150/152 and the base 102; the presence of such a dielectric material 166 may help isolate the S/D regions 150/152 from the underlying material, and thus mitigate or eliminate the formation of an undesirable parasitic channel in the underlying material, as discussed above. The dielectric material 166 may include any suitable dielectric material, such as an oxide (e.g., silicon oxide). Together, a channel material 106, gate dielectric 136, gate metal 138, and associated S/D regions 150/152 may form a transistor.

The dimensions of the elements of the IC structure of FIG. 1 (and others of the embodiments disclosed herein) may take any suitable form. For example, in some embodiments, a gate length 208 of a gate 204 may be between 3 nanometers and 100 nanometers; different ones of the gates 204 in a device region 206 may have the same gate length 208, or different gate lengths 208, as desired. In some embodiments, the width 210 of the channel material 106 may be between 3 nanometers and 30 nanometers. In some embodiments, the thickness 212 of the channel material 106 may be between 1 nanometer and 500 nanometers (e.g., between 5 nanometers and 40 nanometers when the channel material 106 is a wire). In some embodiments in which a channel region 202 includes semiconductor wires, the spacing 214 between adjacent ones of the wires in a channel region 202 may be between 5 nanometers and 40 nanometers.

In some embodiments, the IC structure 100 may be part of a memory device, and transistors of the IC structure 100 may store information in the IC structure 100 or facilitate access to (e.g., read and/or write) storage elements of the memory device. In some embodiments, the IC structure 100 may be part of a processing device. In some embodiments, the IC structure 100 may be part of a device that includes memory and logic devices (e.g., in a single die 1502, as discussed below), such as a processor and cache. More generally, the IC structures 100 disclosed herein may be part of memory devices, logic devices, or both.

FIGS. 2-44 illustrate stages in an example process for manufacturing the IC structure 100 of FIG. 1. Although the operations of the process may be illustrated with reference to particular embodiments of the IC structures 100 disclosed herein, the process of FIGS. 2-44 and variants thereof may be used to form any suitable IC structure. Operations are illustrated a particular number of times and in a particular order in FIGS. 2-44, but the operations may be reordered and/or repeated as desired (e.g., with different operations performed in parallel when manufacturing multiple IC structures 100 simultaneously).

FIG. 2 illustrates an assembly including a base 102 and a stack of material layers on the base 102. The stack of material layers may include one or more layers of the channel material 106 spaced apart from each other (and from the base 102) by intervening layers of sacrificial material 104. The size and arrangement of the material layers in the stack of the assembly of FIG. 2 corresponds to the desired size and arrangement of the channel material 106 in the IC structure 100, as will be discussed further below, and thus the material layers in the assembly of FIG. 2 may vary from the particular embodiment illustrated in FIG. 2. For example, the thickness of a layer of channel material 106 may correspond to the channel thickness 212 discussed above (though the thickness of the layer of channel material 106 may differ from the final channel thickness 212 due to material lost during processing, etc.), and the thickness of a layer of sacrificial material 104 may correspond to the wire spacing 214 discussed above (though the thickness of the layer of sacrificial material 104 may differ from the final wire spacing 214 due to material lost during processing, etc.). The sacrificial material 104 may be any material that may be appropriately selectively removed in later processing operations (as discussed below with reference to FIG. 30). For example, the sacrificial material 104 may be silicon germanium, and the channel material 106 may be silicon. In another example, the sacrificial material 104 may be silicon dioxide and the channel material 106 may be silicon or germanium. In another example, the sacrificial material 104 may be gallium arsenide and the channel material 106 may be indium gallium arsenide, germanium, or silicon germanium. The assembly of FIG. 2 may be formed using any suitable deposition techniques, such as chemical vapor deposition (CVD), metalorganic vapor phase epitaxy (MOVPE), molecular-beam epitaxy (MBE), physical vapor deposition (PVD), atomic layer deposition (ALD), or a layer transfer process.

FIG. 3 illustrates an assembly subsequent to forming a patterned hardmask 108 on the assembly of FIG. 2. Forming the patterned hardmask 108 may include depositing the hardmask (using any suitable method) and then selectively removing portions of the hardmask 108 (e.g., using lithographic techniques) to form the patterned hardmask 108. In some embodiments, the pattern of the patterned hardmask 108 may first be formed in another material on the initially deposited hardmask, and then the pattern may be transferred from the other material into the hardmask 108. The locations of the hardmask 108 may correspond to the device regions 206 in the IC structure 100, as discussed further below. In the embodiment of FIG. 3, the hardmask 108 may be patterned into multiple parallel rectangular portions (corresponding to the fins 220 discussed below).

FIG. 4 illustrates an assembly subsequent to forming fins 220 in the material stack of the assembly of FIG. 2, in accordance with the pattern of the patterned hardmask 108. Etch techniques may be used to form the fins 220, including wet and/or dry etch schemes, as well as isotropic and/or anisotropic etch schemes. The fins 220 may include the sacrificial material 104 and the channel material 106, as well as a portion of the base 102; the portion of the base 102 included in the fins 220 provides a pedestal 222. The width of the fins 220 may be equal to the width 210 of the channel material 106, as discussed above. Any suitable number of fins 220 may be included in the assembly of FIG. 4 (e.g., more or fewer than 3). Although the fins 220 depicted in FIG. 4 (and others of the accompanying drawings) are perfectly rectangular, this is simply for ease of illustration, and in practical manufacturing settings, the shape of the fins 220 may not be perfectly rectangular. For example, the fins 220 may be tapered, widening toward the base 102. The top surface of the fins 220 may not be flat, but may be curved, rounding into the side surfaces of the fins 220, and these non-idealities may carry over into subsequent processing operations. In some embodiments, the pitch 101 of the fins 220 may be between 20 nanometers and 50 nanometers (e.g., between 20 nanometers and 40 nanometers).

FIG. 5 illustrates an assembly subsequent to forming a dielectric material 110 on the base 102 of the assembly of FIG. 4, between the fins 220. The dielectric material 110 may include any suitable material, such as an STI material (e.g., an oxide material, such as silicon oxide). The dielectric material 110 may be formed by blanket-depositing the dielectric material 110 and then recessing the dielectric material 110 back to a desired thickness. In some embodiments, the thickness of the dielectric material 110 may be selected so that the top surface of the dielectric material 110 is approximately coplanar with the top surface of the pedestals 222. In some embodiments, the height 103 of a fin 220 above the top surface of the dielectric material 110 may be between 40 nanometers and 100 nanometers (e.g., between 50 nanometers and 70 nanometers).

FIG. 6 illustrates an assembly subsequent to forming a conformal layer of a dielectric material 112 over the assembly of FIG. 5. The dielectric material 112 may be formed using any suitable technique (e.g., ALD). The dielectric material 112 may include any suitable material (e.g., silicon oxide).

FIG. 7 illustrates an assembly subsequent to forming a dielectric material 114 over the assembly of FIG. 6. The dielectric material 114 may extend over the top surfaces of the fins 220, as shown, and may serve as a "dummy gate." The dielectric material 114 may include any suitable material (e.g., polysilicon).

FIG. 8 illustrates an assembly subsequent to forming a patterned hardmask 116 on the assembly of FIG. 7. The hardmask 116 may include any suitable materials (e.g., silicon nitride, carbon-doped silicon oxide, or carbon-doped silicon oxynitride). The hardmask 116 may be patterned into strips that are oriented perpendicular to the longitudinal axis of the fins 220 (into and out of the page in accordance with the perspective of FIGS. 8C and 8D), corresponding to the locations of the gates 204 in the IC structure 100, as discussed further below.

FIG. 9 illustrates an assembly subsequent to etching the dielectric material 114 (the "dummy gate") of the assembly of FIG. 8 using the patterned hardmask 116 as a mask. The locations of the remaining dielectric material 114 may correspond to the locations of the gates 204 in the IC structure 100, as discussed further below.

FIG. 10 illustrates an assembly subsequent to depositing a conformal layer of dielectric material 118 on the assembly of FIG. 9, and then performing a directional "downward" etch to remove the dielectric material 118 on horizontal surfaces, leaving the dielectric material 118 as "spacers" on side faces of exposed surfaces, as shown. The dielectric material 118 may be deposited to any desired thickness using any suitable technique (e.g., ALD). The dielectric material 118 may include any suitable dielectric material (e.g., silicon oxycarbonitride). The dielectric material 118 may border the fins 220 in the volumes that will be replaced by the S/D regions 150/152, as discussed below.

FIG. 11 illustrates an assembly subsequent to depositing a dielectric material 120 on the assembly of FIG. 10. The dielectric material 120 may be blanket deposited over the assembly of FIG. 10 and then the dielectric material 120 may be polished (e.g., by chemical mechanical polishing (CMP)) or otherwise recessed back so that the top surface of the dielectric material 120 is coplanar with the top surface of the patterned hardmask 116, as shown in FIGS. 11C and 11D. The dielectric material 120 may include any suitable material (e.g., an oxide, such as silicon oxide).

FIG. 12 illustrates an assembly subsequent to depositing a hardmask 126 on the assembly of FIG. 11. The hardmask 126 may have any suitable material composition; for example, in some embodiments, the hardmask 126 may include titanium nitride.

FIG. 13 illustrates an assembly subsequent to patterning the hardmask 126 of the assembly of FIG. 12 so as to selectively remove the hardmask 126 in areas that will correspond to the S/D regions 152, while otherwise leaving the hardmask 126 in place. Any suitable patterning technique (e.g., a lithographic technique) may be used to pattern the hardmask 126. The particular arrangement of the S/D regions 152 in an IC structure 100 (and thus the particular layout of the patterned hardmask 126) depicted in various ones of the accompanying figures is simply illustrative, and any desired arrangement may be used.

FIG. 14 illustrates an assembly subsequent to recessing the exposed dielectric material 120 of the assembly of FIG. 13 (i.e., the dielectric material 120 not protected by the hardmask 126). Any suitable selective etch technique may be used to recess the exposed dielectric material 120, such as an isotropic etch. In the areas not protected by the hardmask 126, the dielectric material 120 may remain.

FIG. 15 illustrates an assembly subsequent to removing some of the dielectric material 118 exposed in the assembly of FIG. 14. This operation may enlarge the "canyons" between adjacent portions of hardmask 116/dielectric material 114, facilitating subsequent operations. In some embodiments, the removal of some of the dielectric material 118 may be achieved by a partial isotropic etch (e.g., a nitride partial isotropic etch when the dielectric material 118 includes a nitride).

FIG. 16 illustrates an assembly subsequent to further recessing the exposed dielectric material 120 of the assembly of FIG. 15 (i.e., the dielectric material 120 not protected by the hardmask 126). Any suitable selective etch technique may be used to recess the exposed dielectric material 120, such as an isotropic etch. In the areas not protected by the hardmask 126, the dielectric material 120 may remain.

FIG. 17 illustrates an assembly subsequent to conformally depositing additional dielectric material 118 on the assembly of FIG. 16, and then performing another directional "downward" etch to remove the dielectric material 118 on horizontal surfaces, "repairing" the dielectric material 118 as "spacers" on side faces of exposed surfaces, as shown. The etch of FIG. 17 (e.g., a reactive ion etch (RIE)) may also remove the dielectric material 112 from the top faces of the sacrificial material 104, as shown.

FIG. 18 illustrates an assembly subsequent to removing most of the portions of the sacrificial material 104 and the channel material 106 in the assembly of FIG. 17 that are not covered by the hardmask 126 to form open volumes 224 (e.g., using any suitable etch techniques). Some of the bottommost portion of the sacrificial material 104 may remain, as shown. These open volumes 224 may correspond to the locations of the S/D regions 152 in the IC structure 100, as discussed further below, and are self-aligned to the dielectric material 112, as shown.

Figure 19A:
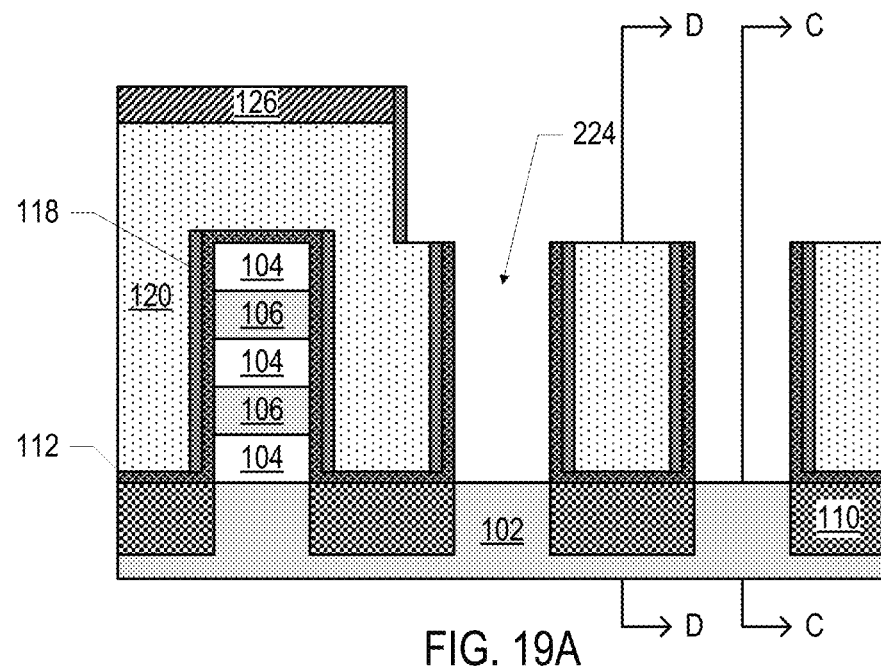
Figure 19B:
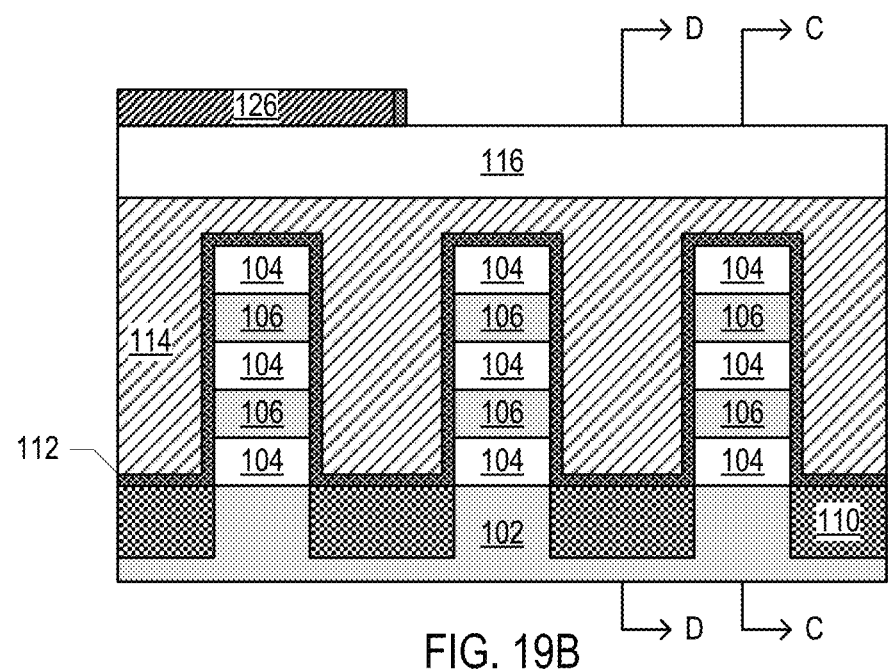
Figure 19C:
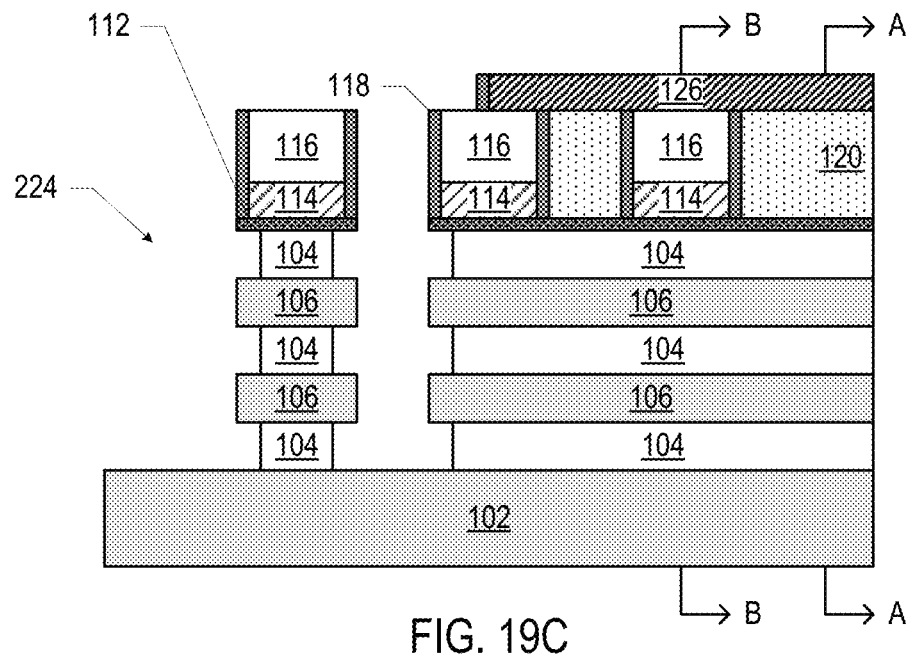
Figure 19D:
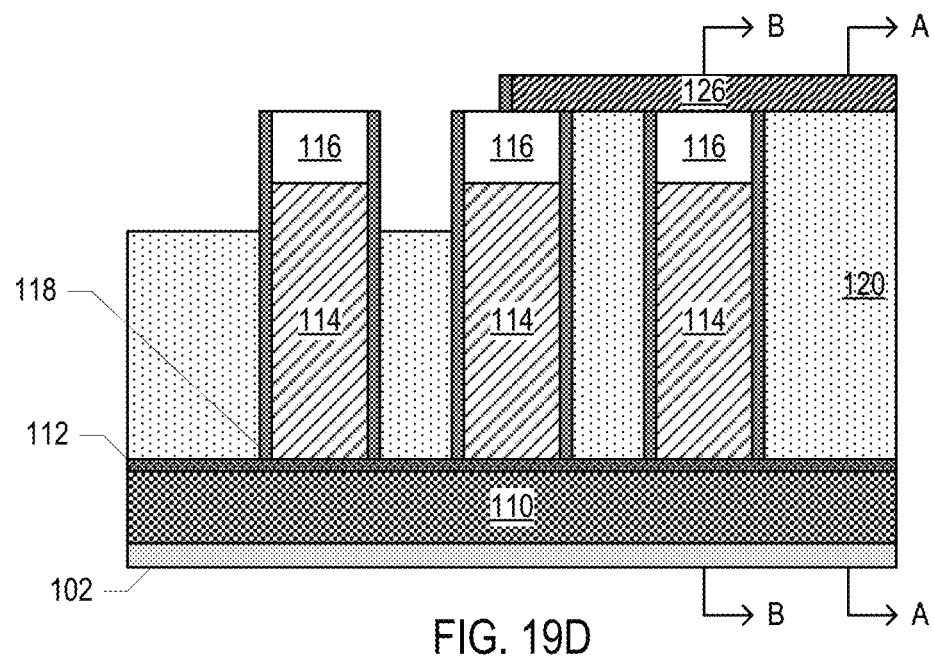
Figure 20A:
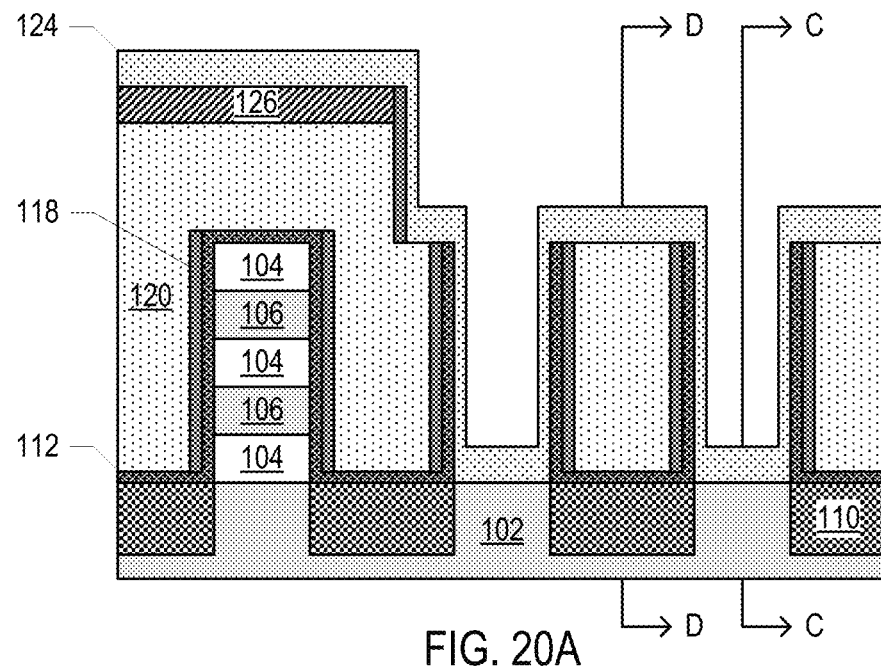
Figure 20B:
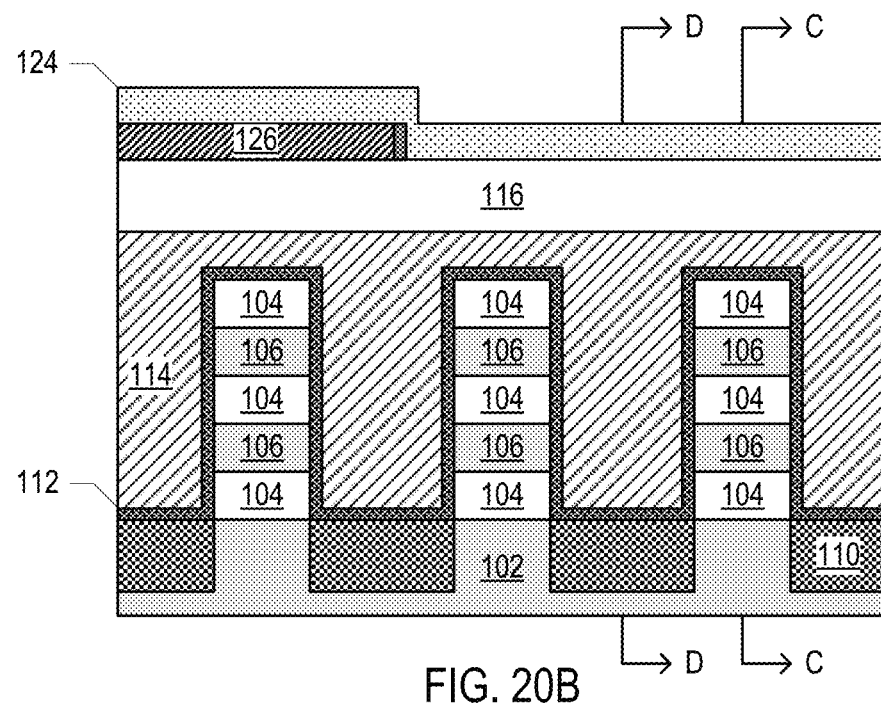
Figure 20C:
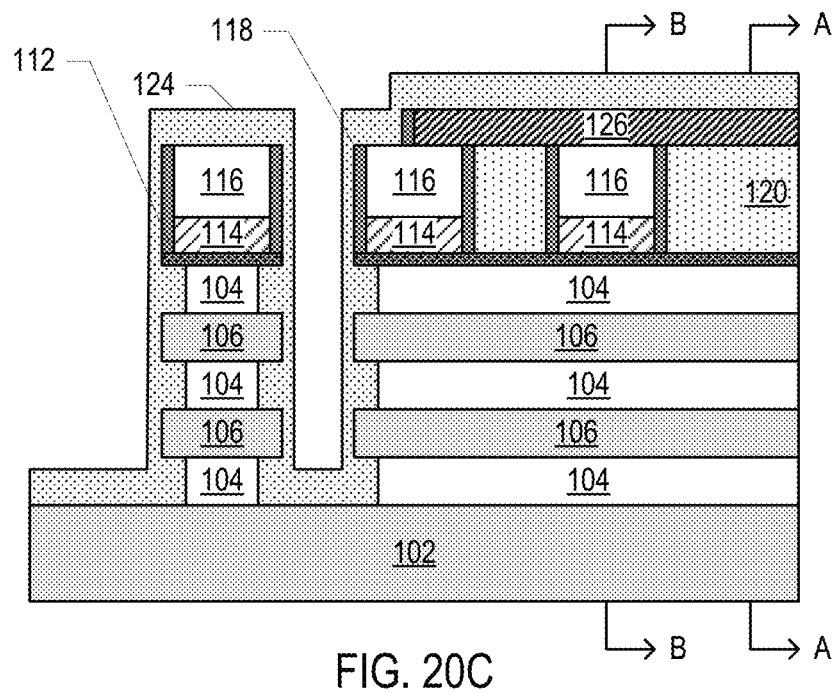
Figure 20D:
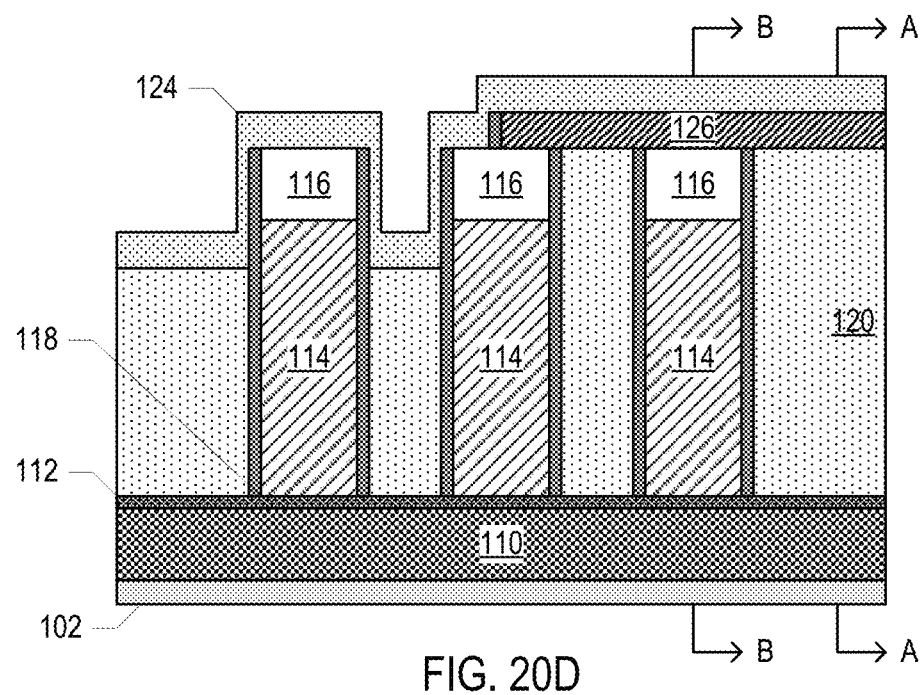
Figure 21A:
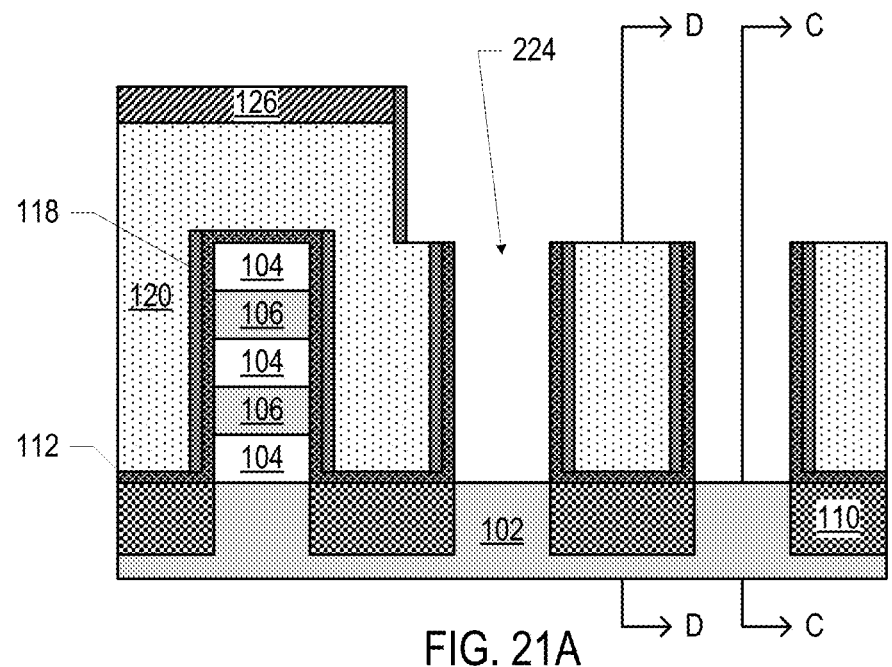
Figure 21B:
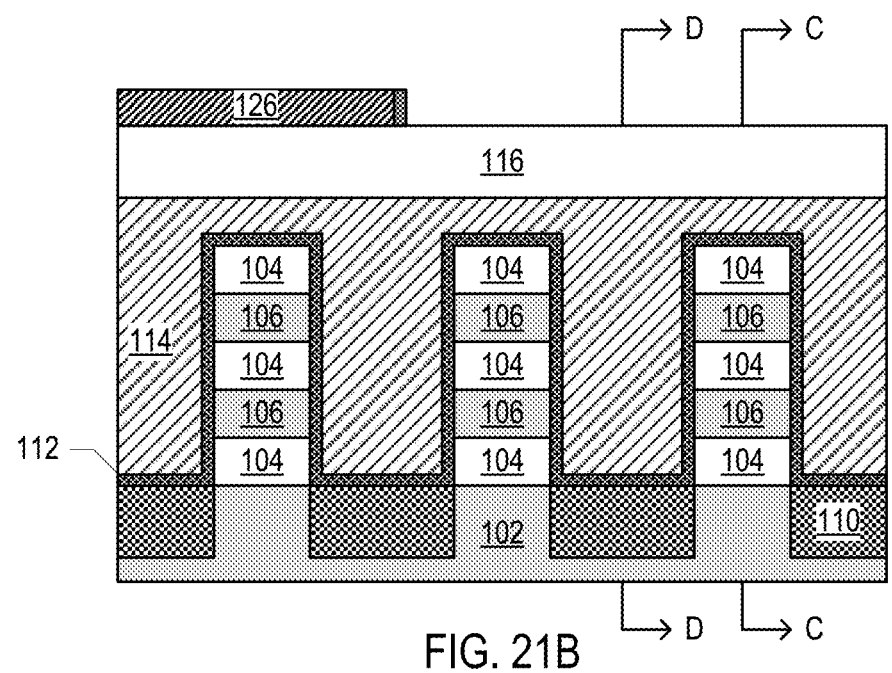
Figure 21C:
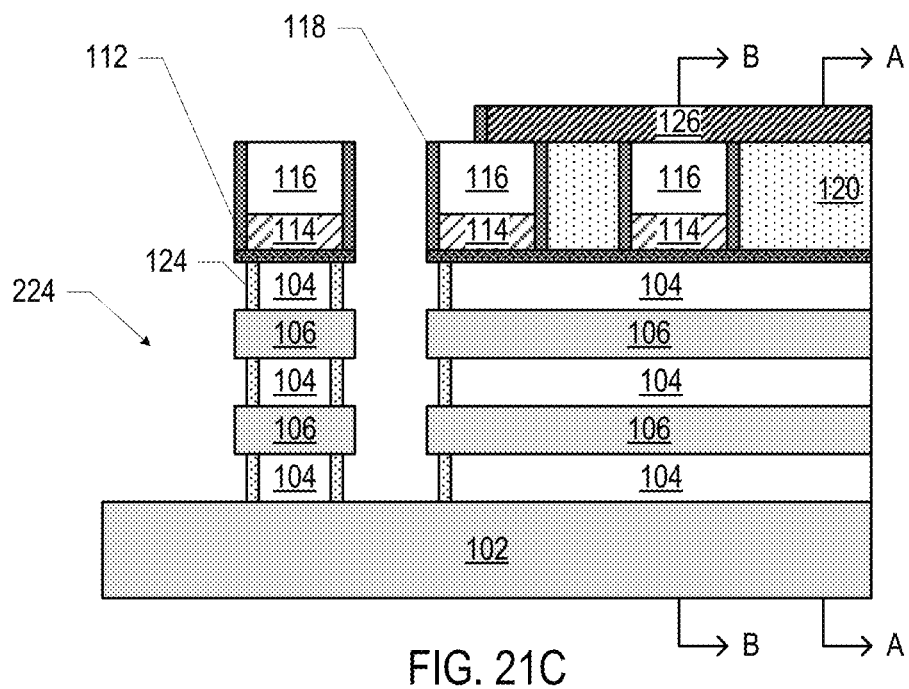
Figure 21D:
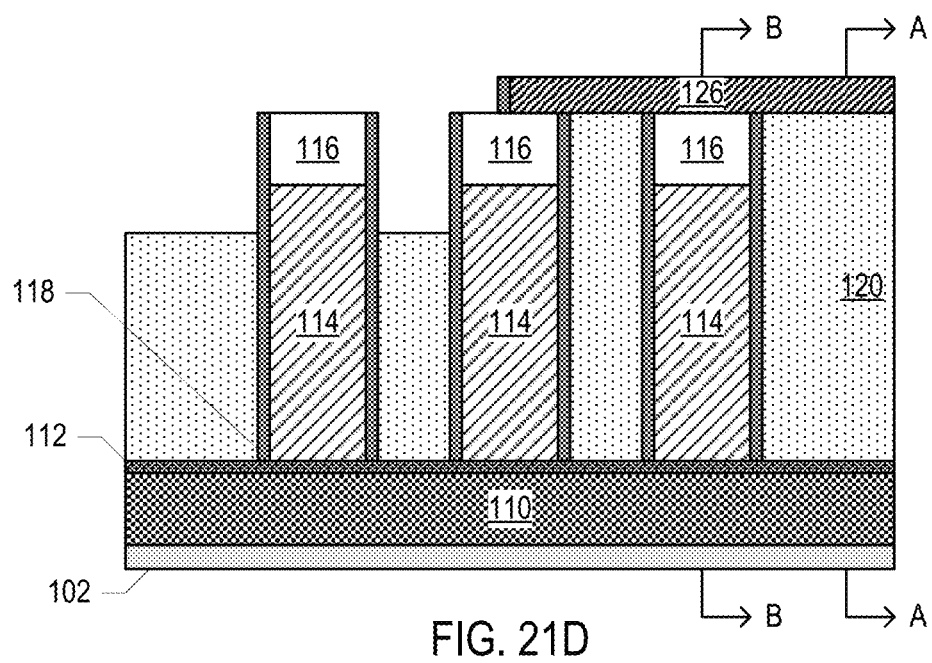
Figure 22A:
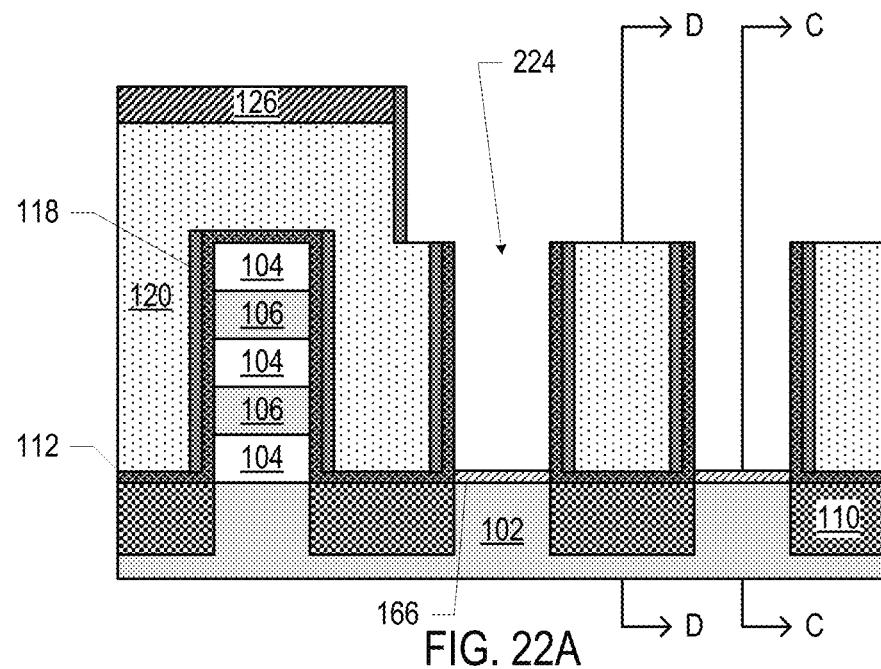
Figure 22B:
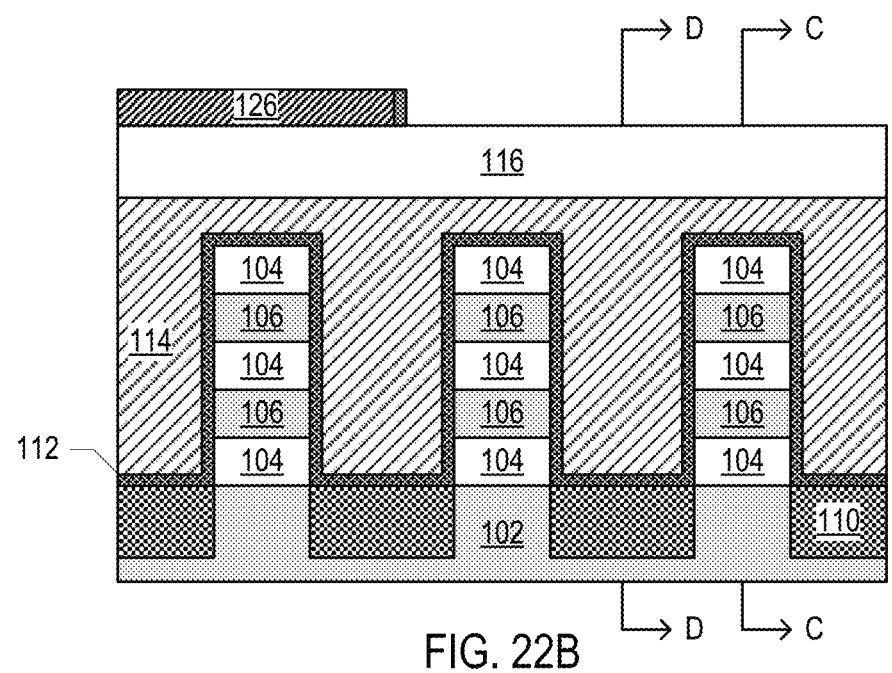
Figure 22C:
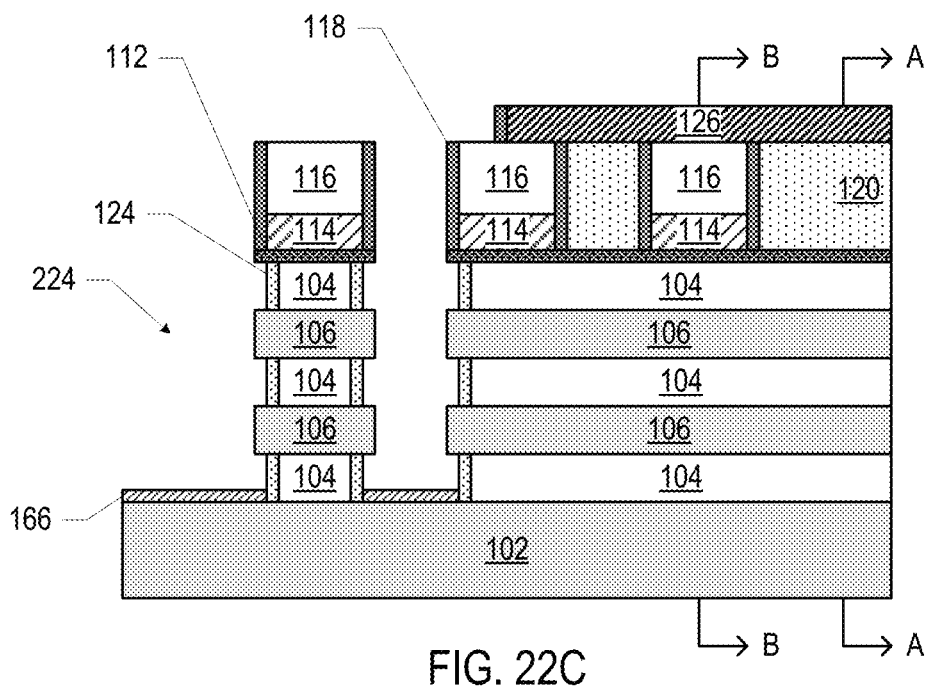
Figure 22D:
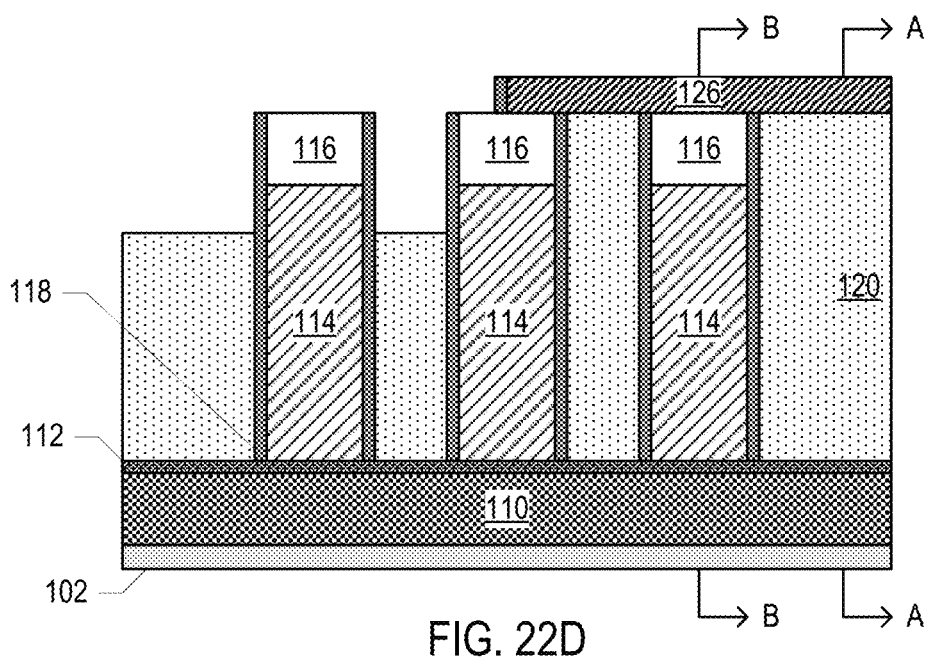
Figure 23A:
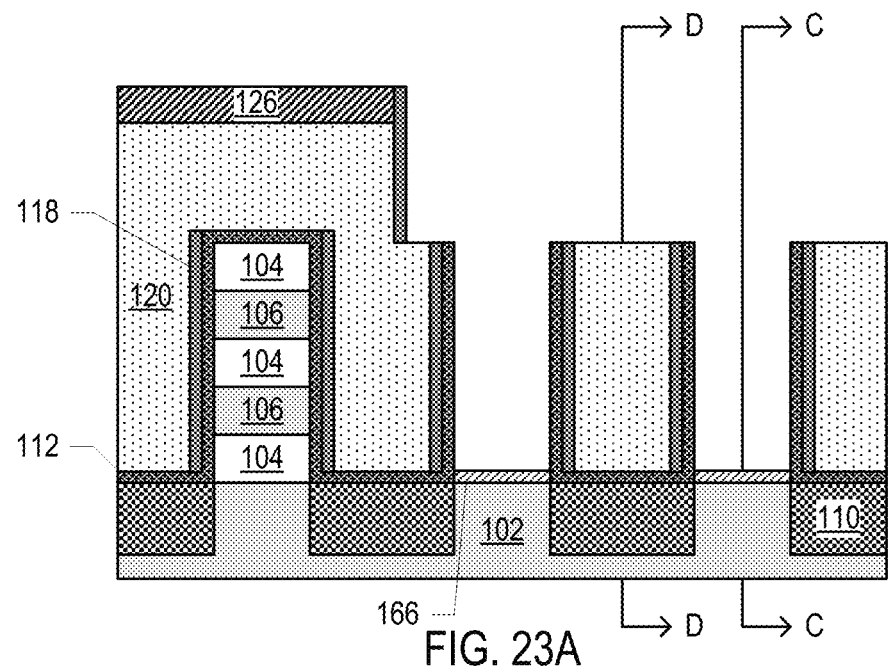
Figure 23B:
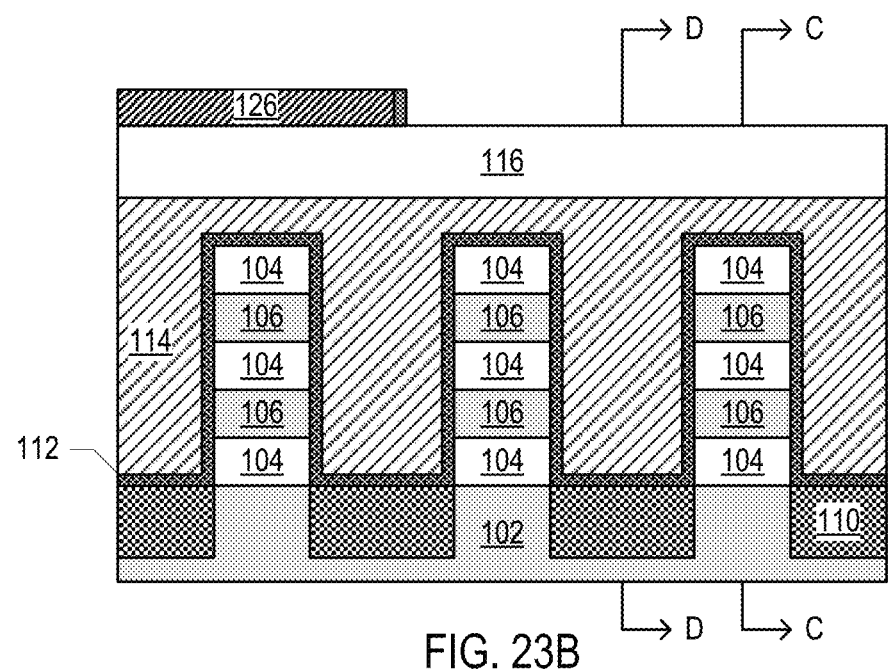
Figure 23C:
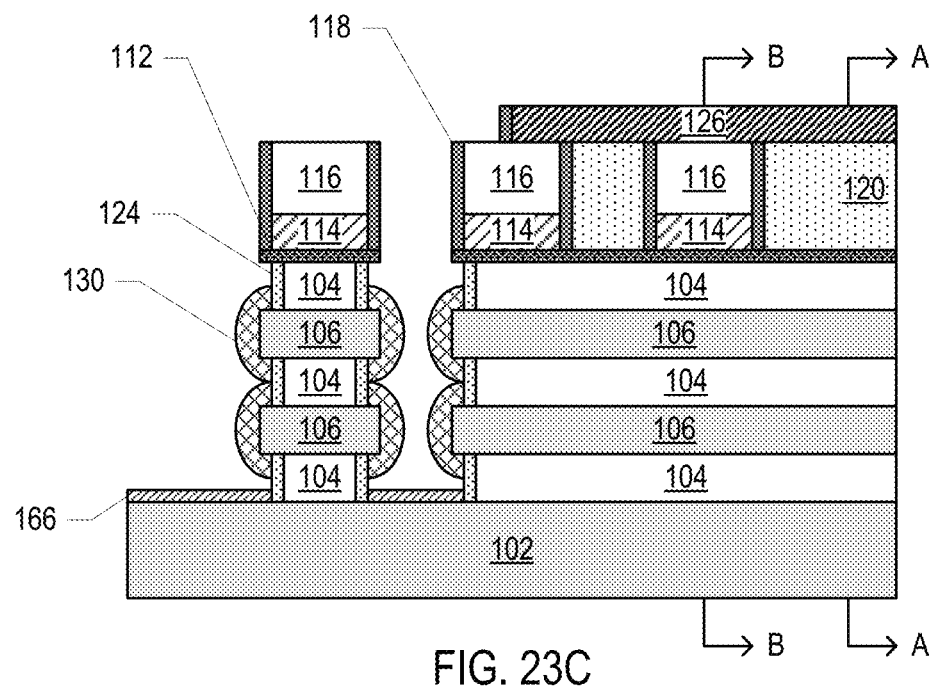
Figure 23D:
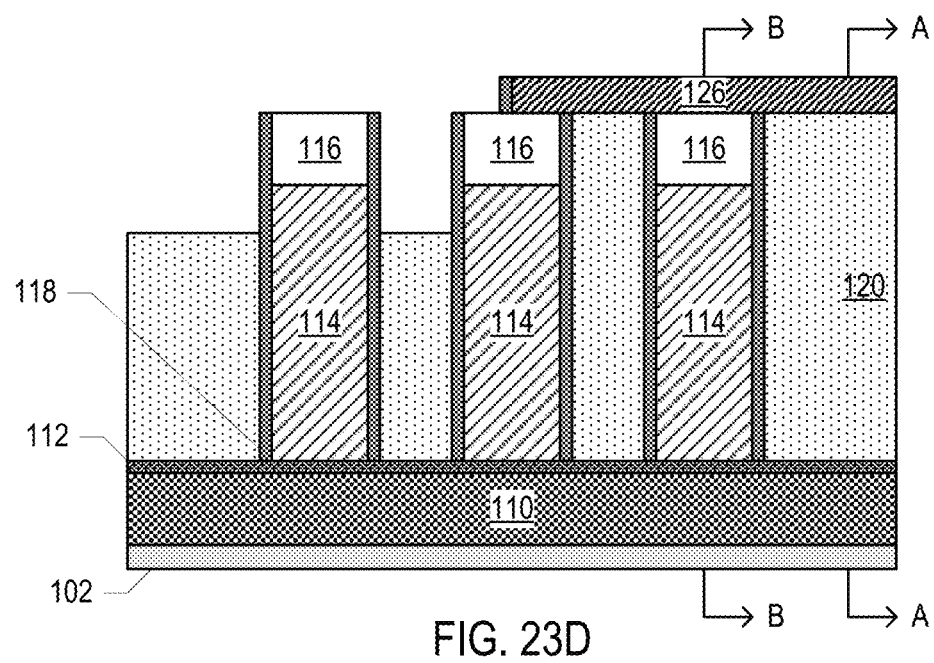
Figure 24A:
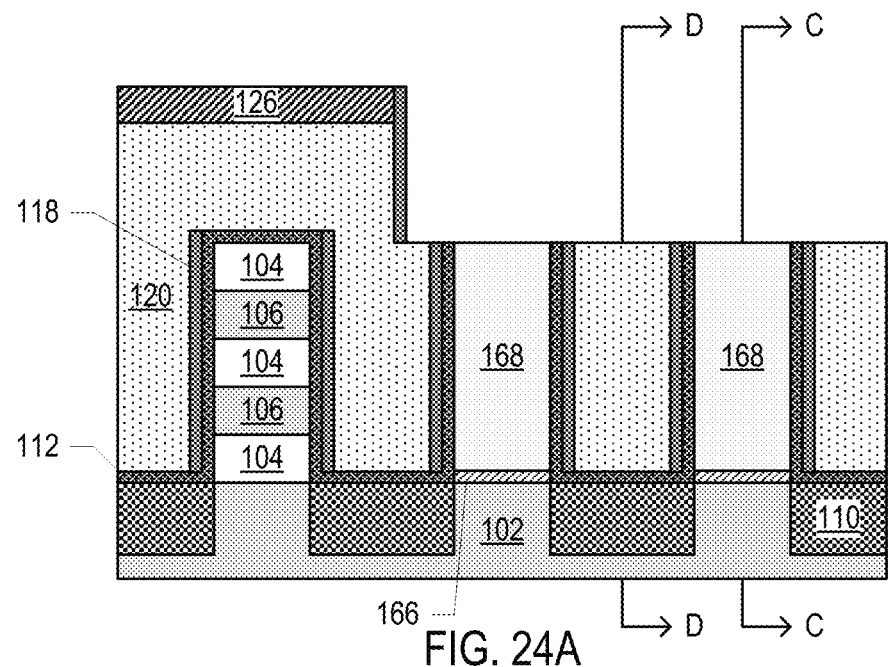
Figure 24B:
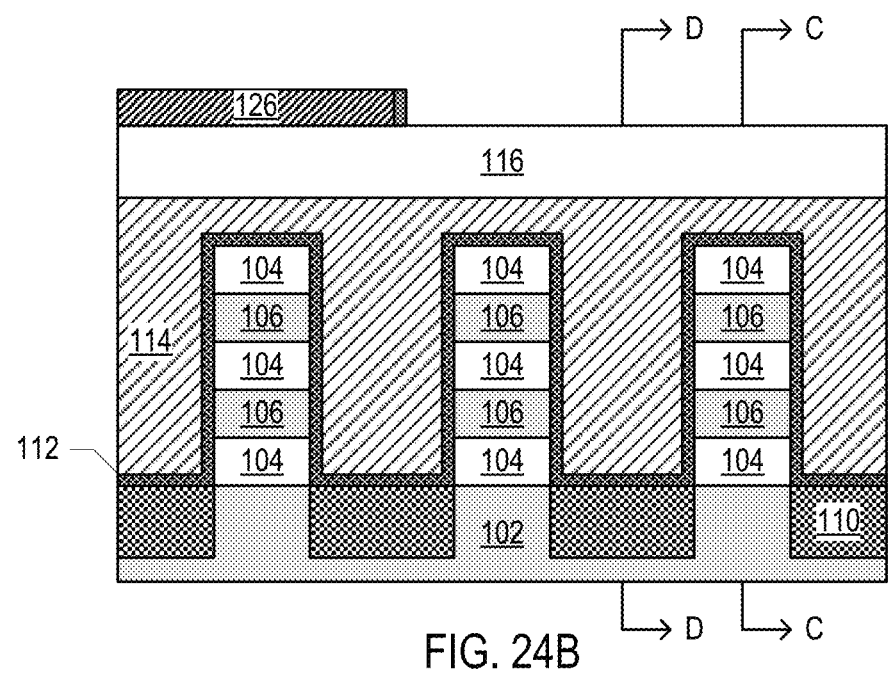
Figure 24C:
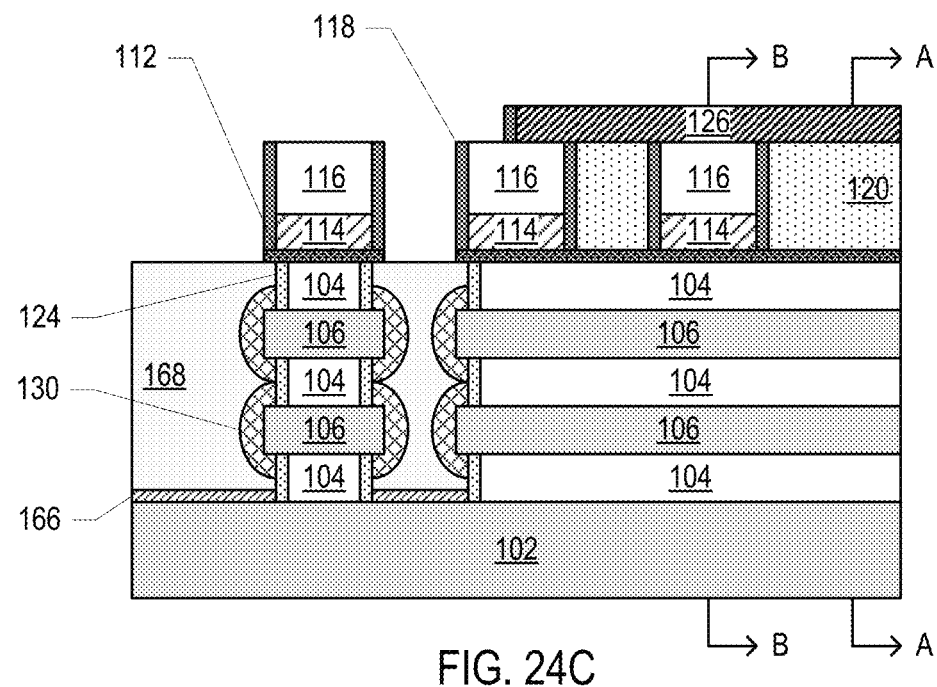
Figure 24D:
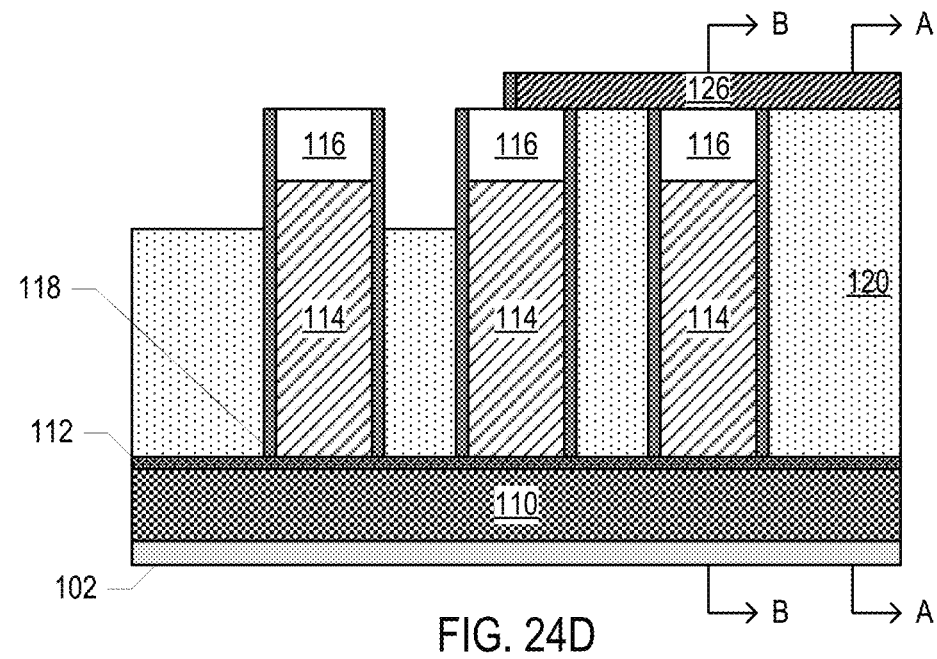
Figure 25A:
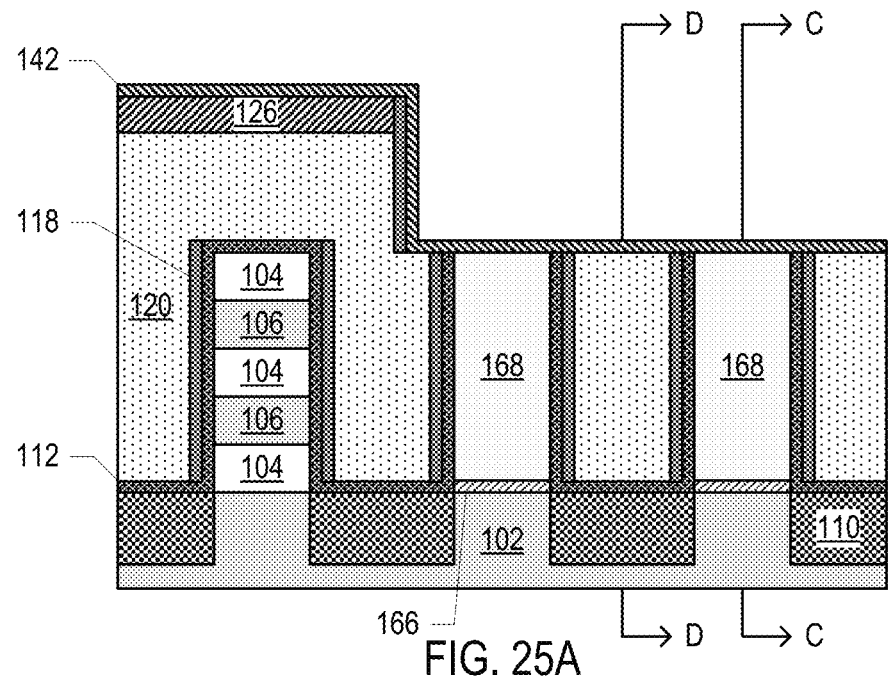
Figure 25B:
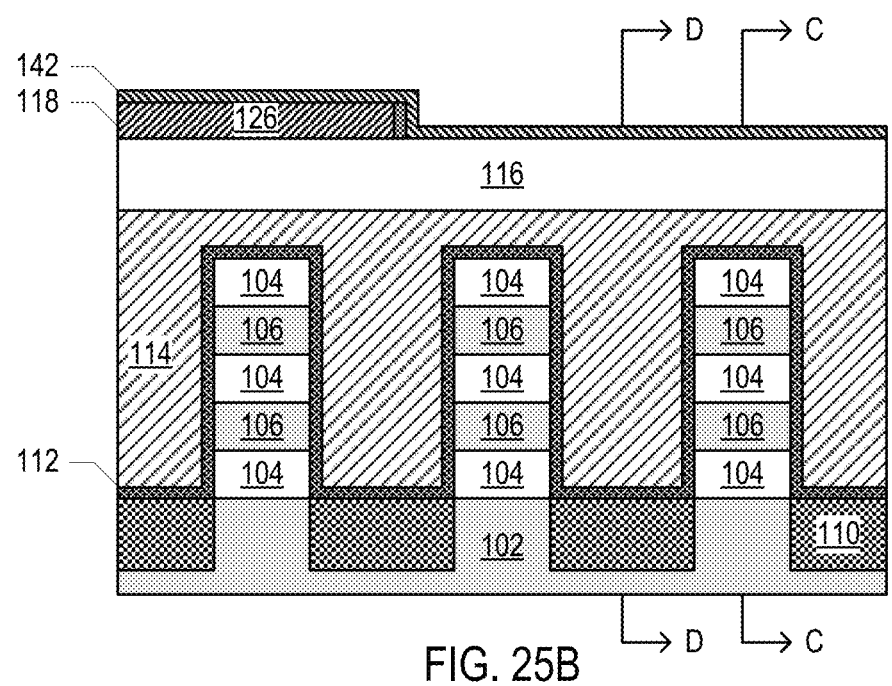
Figure 25C:
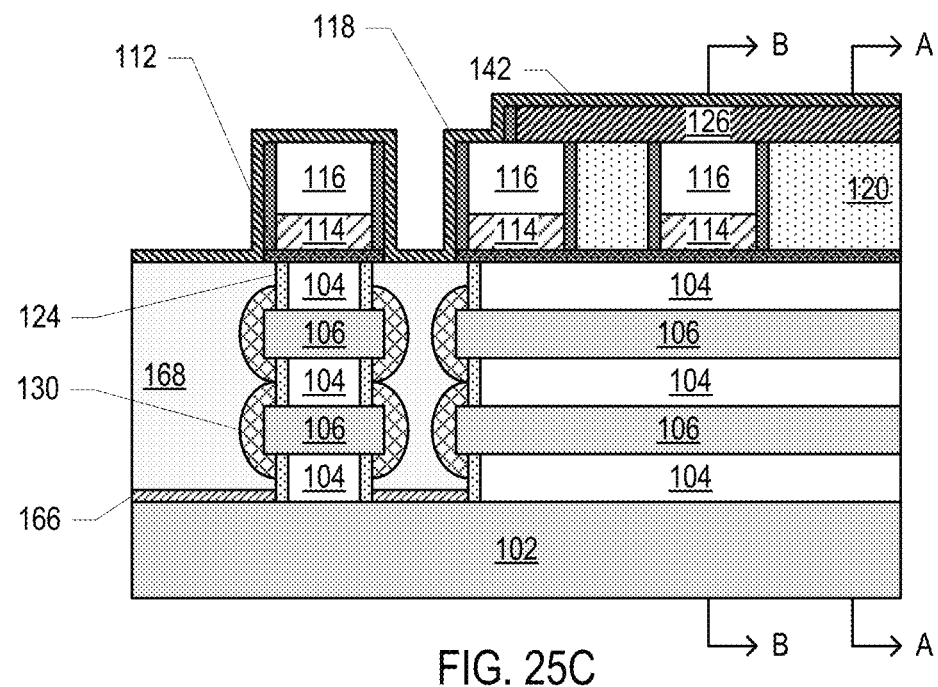
Figure 25D:
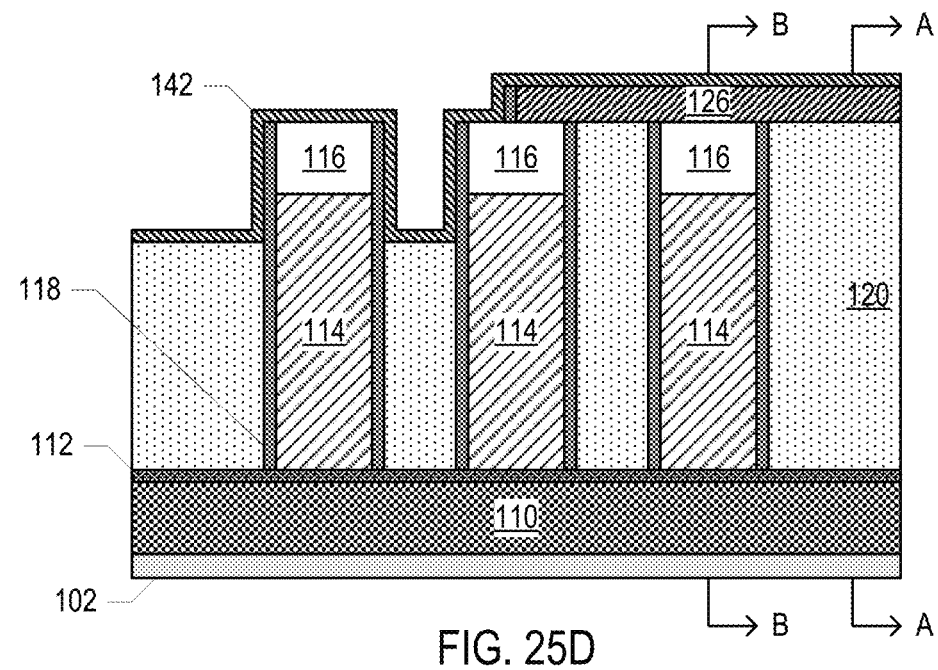
Figure 26A:
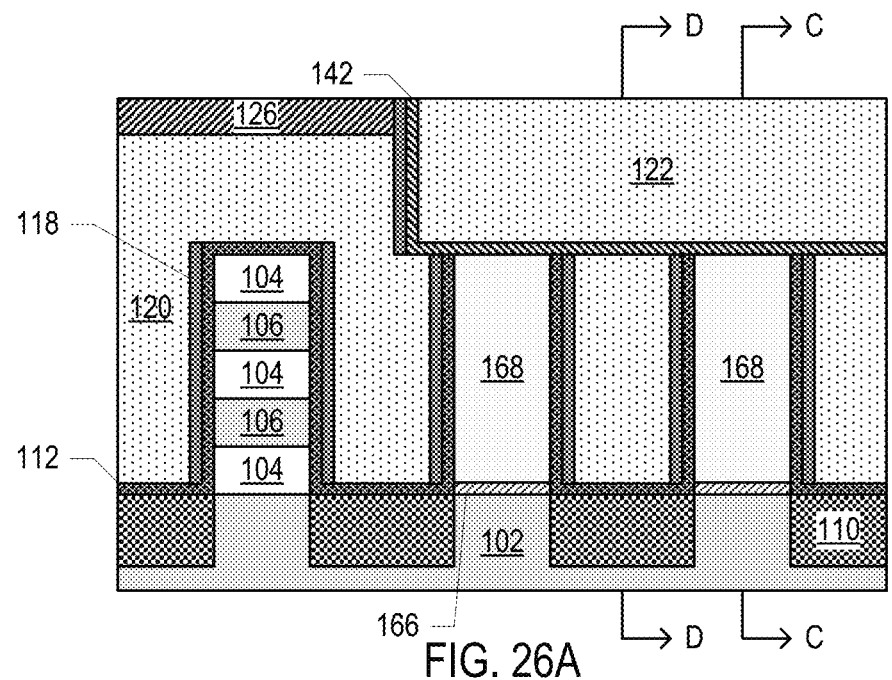
Figure 26B:
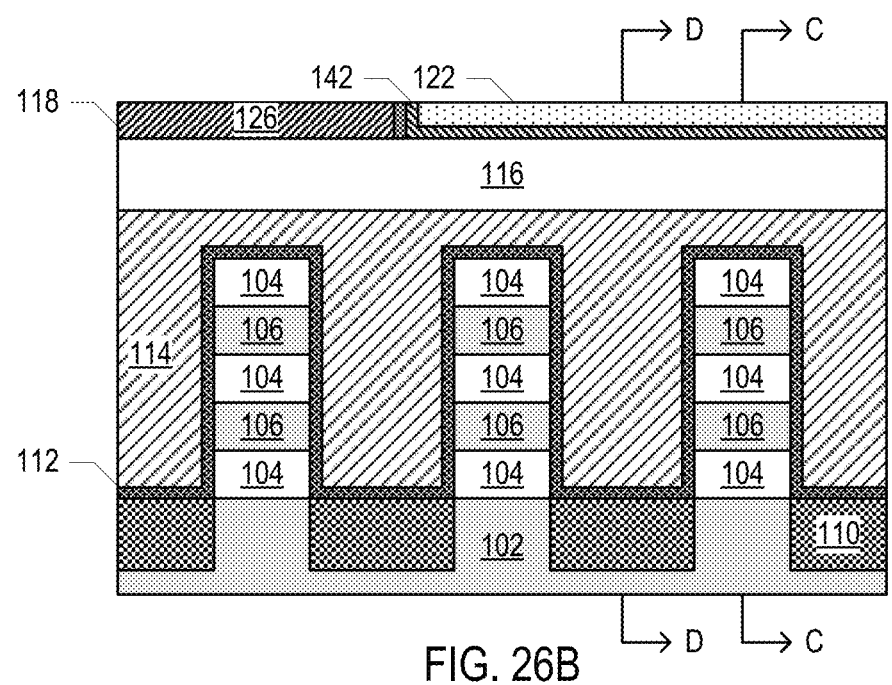
Figure 26C:
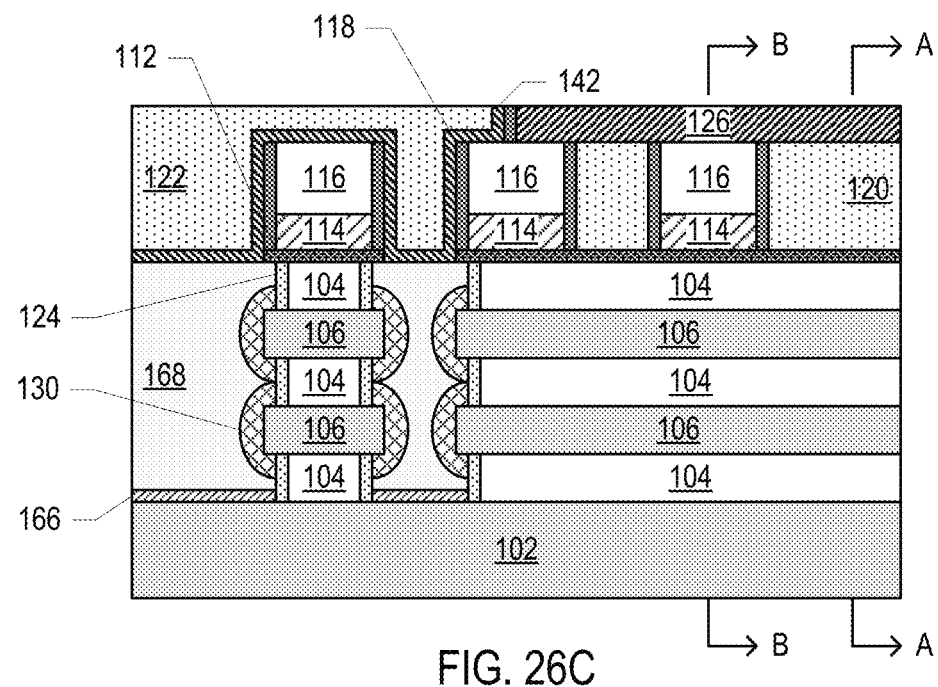
Figure 26D:
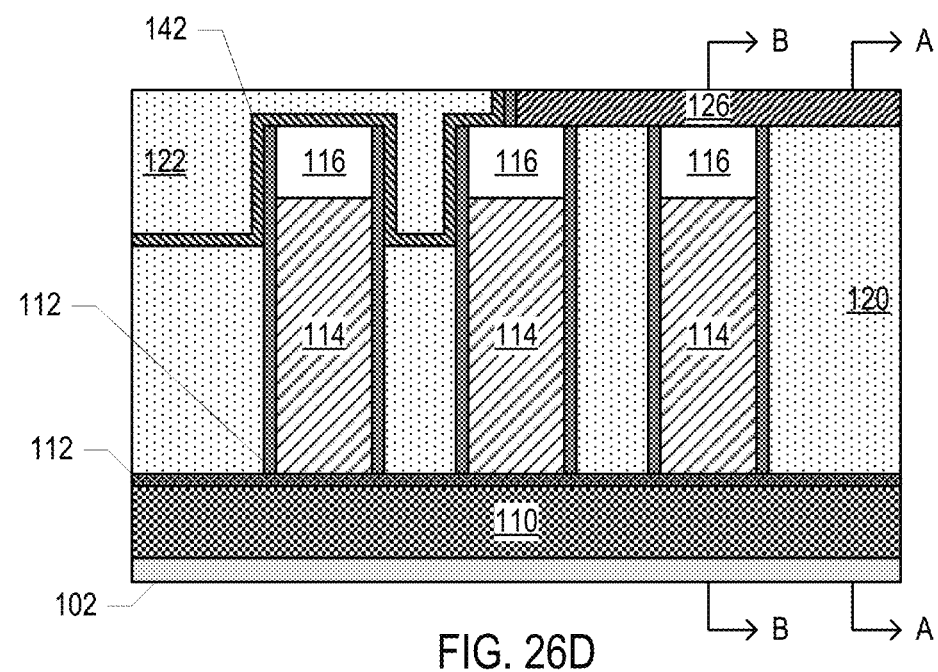
Figure 27A:
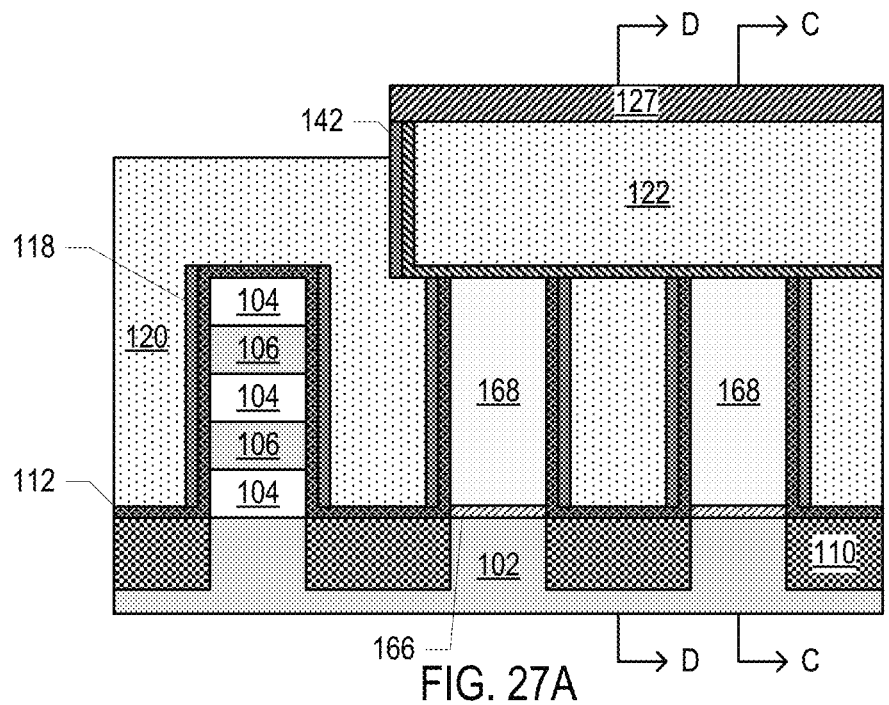
Figure 27B:
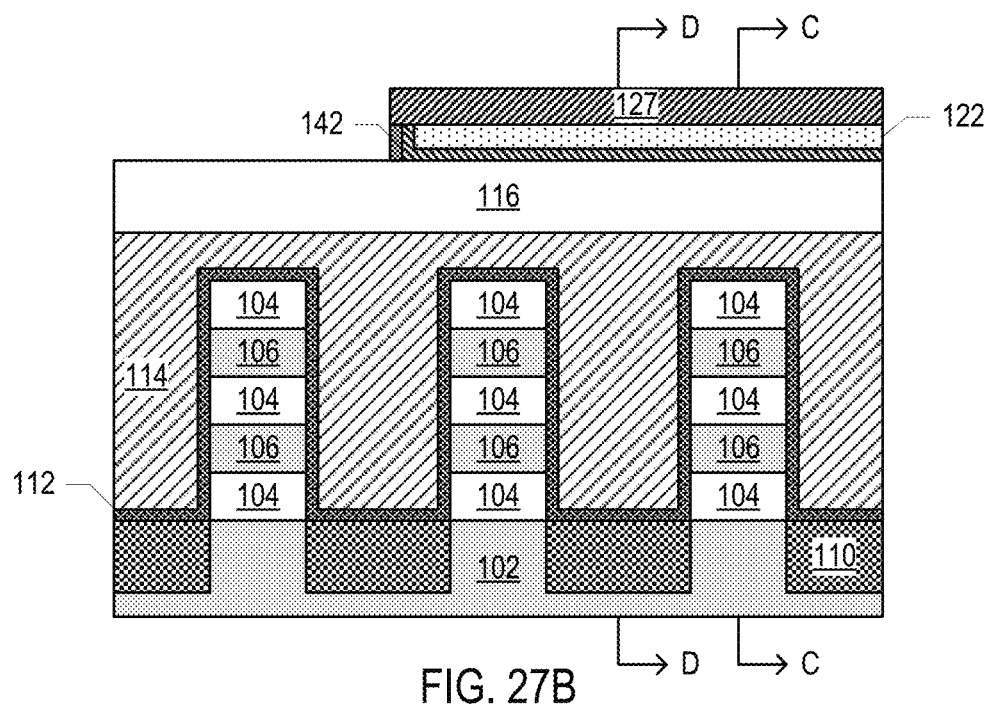
Figure 27C:
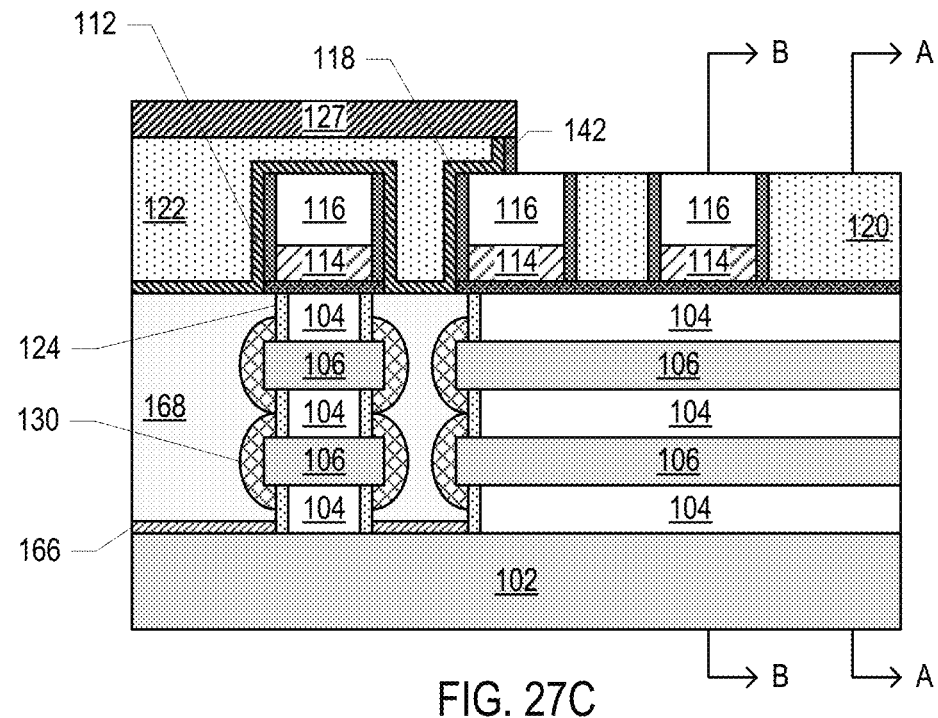
Figure 27D:
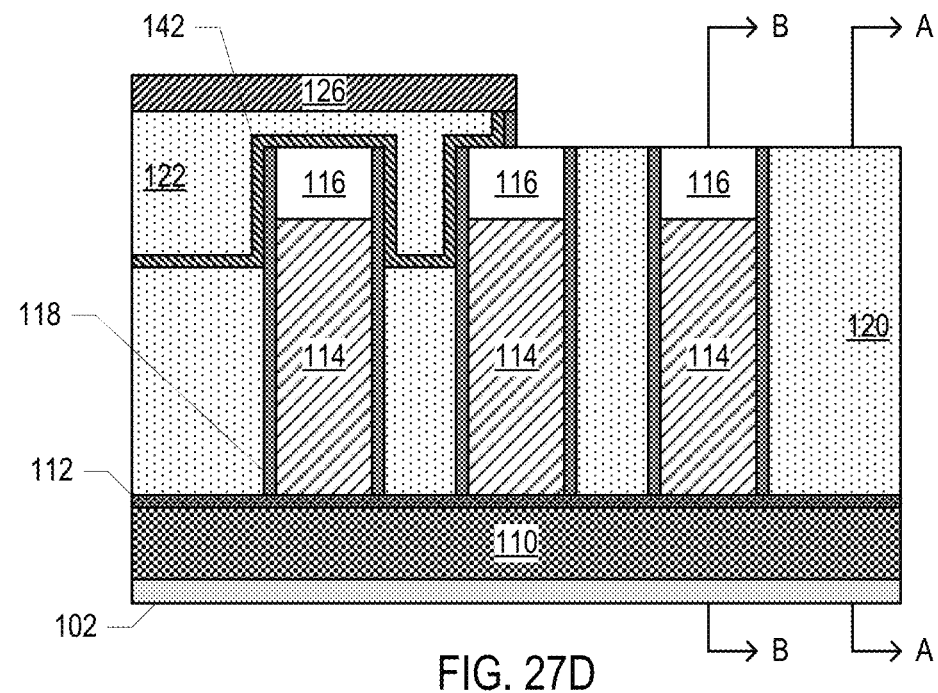
Figure 28A:
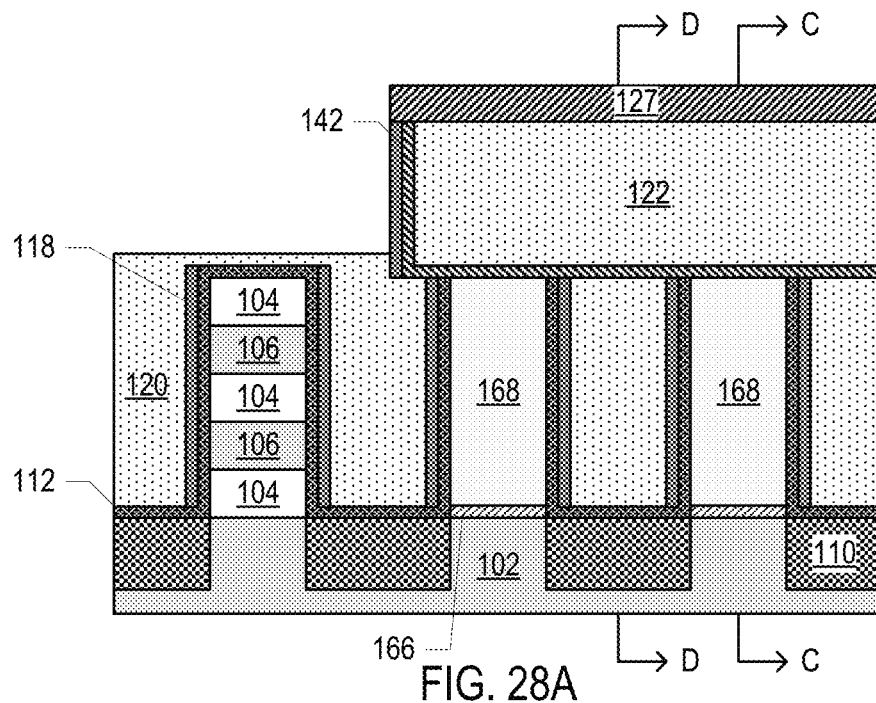
Figure 28B:
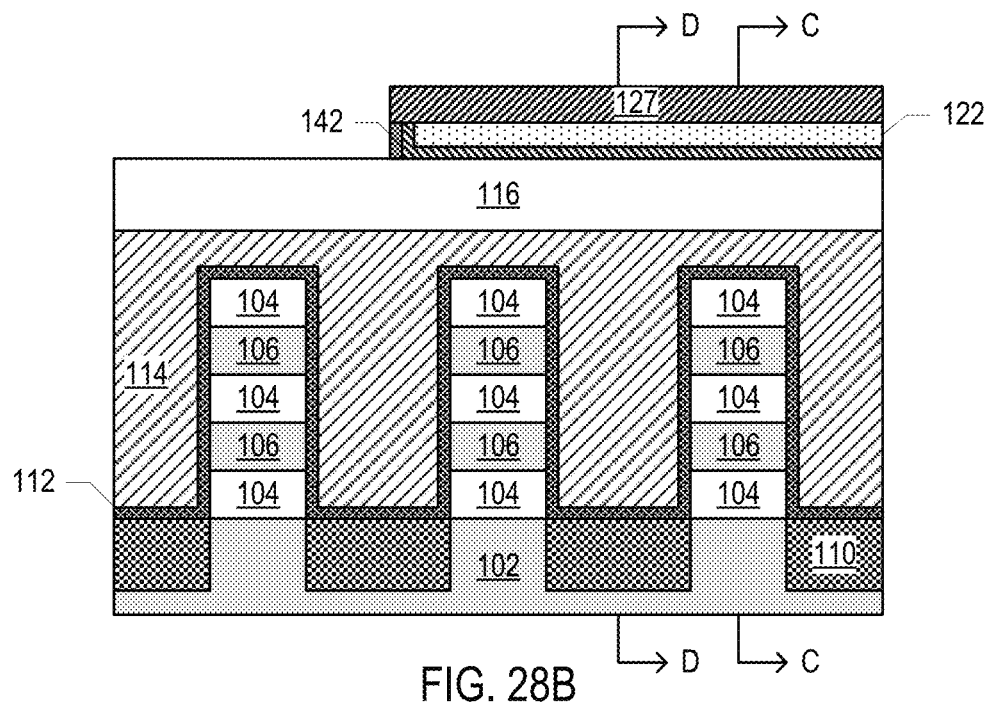
Figure 28C:
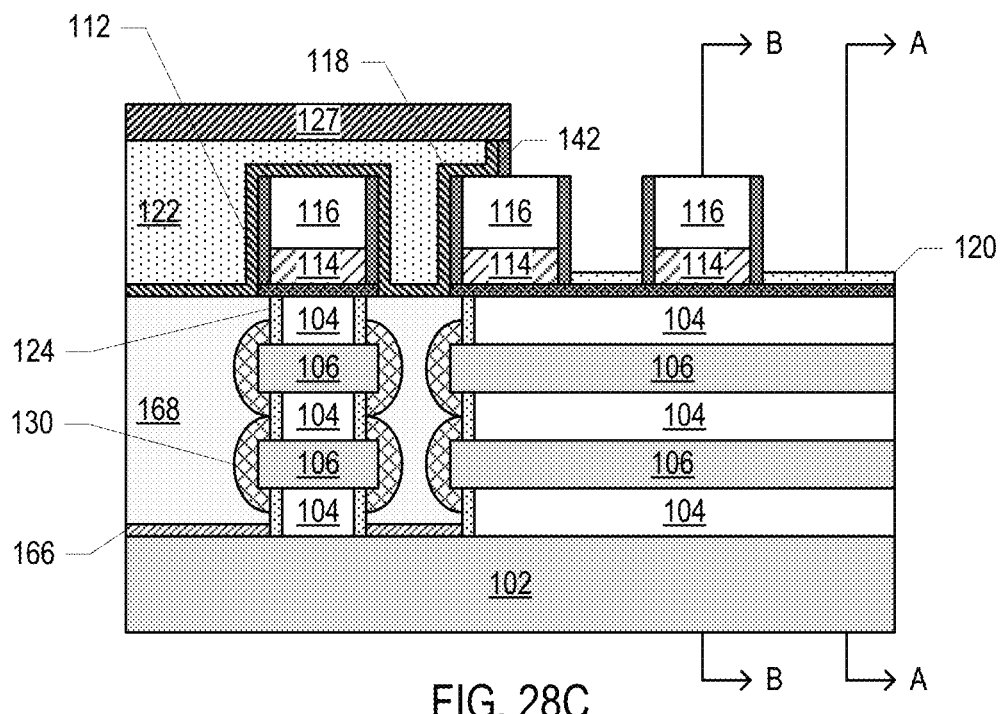
Figure 28D:
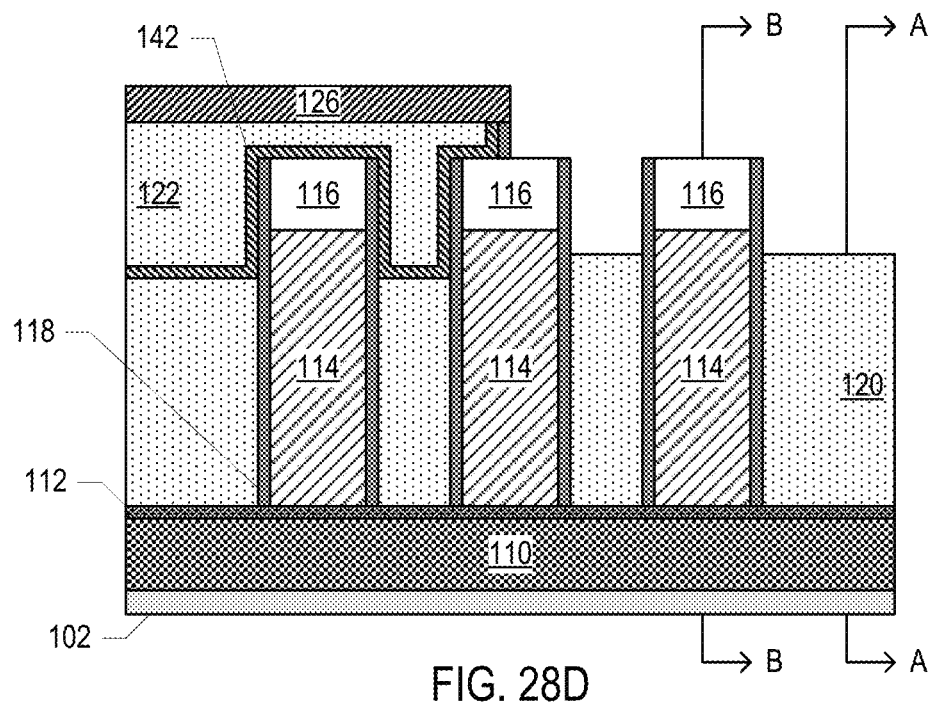
Figure 29A:
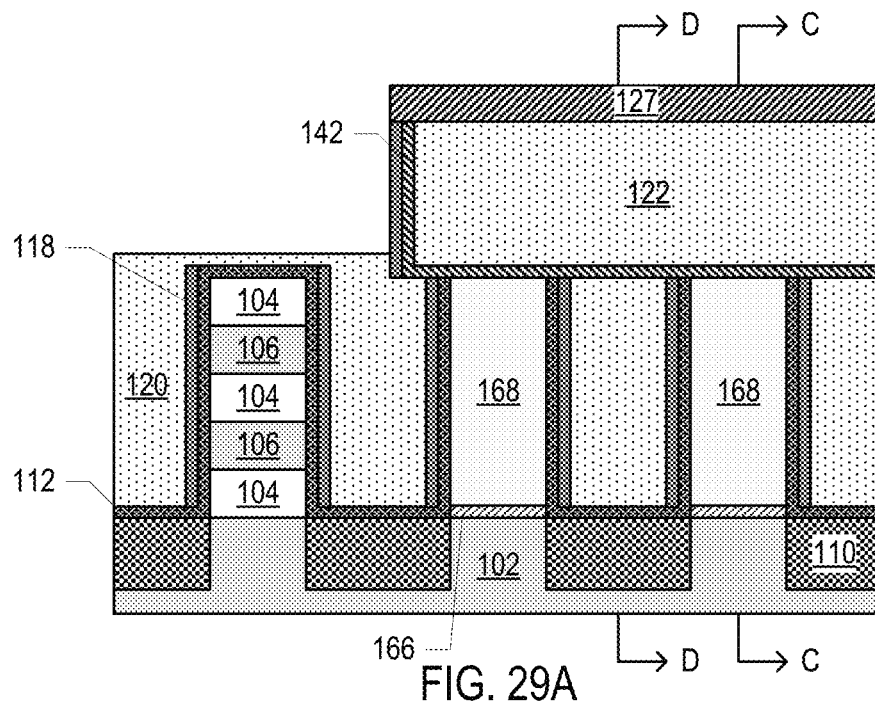
Figure 29B:
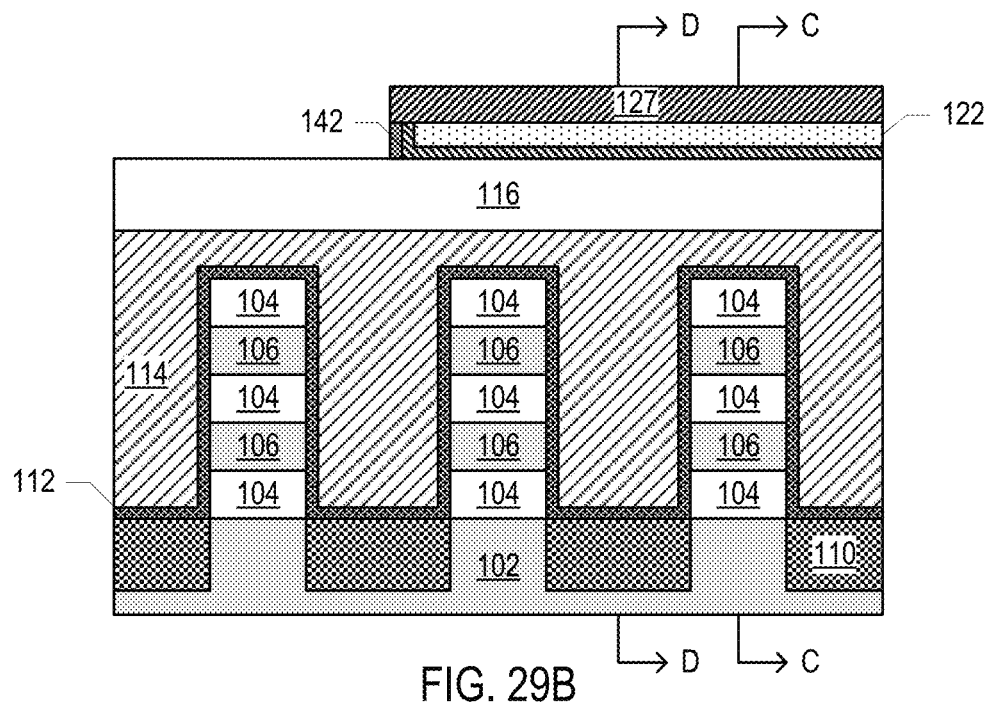
Figure 29C:
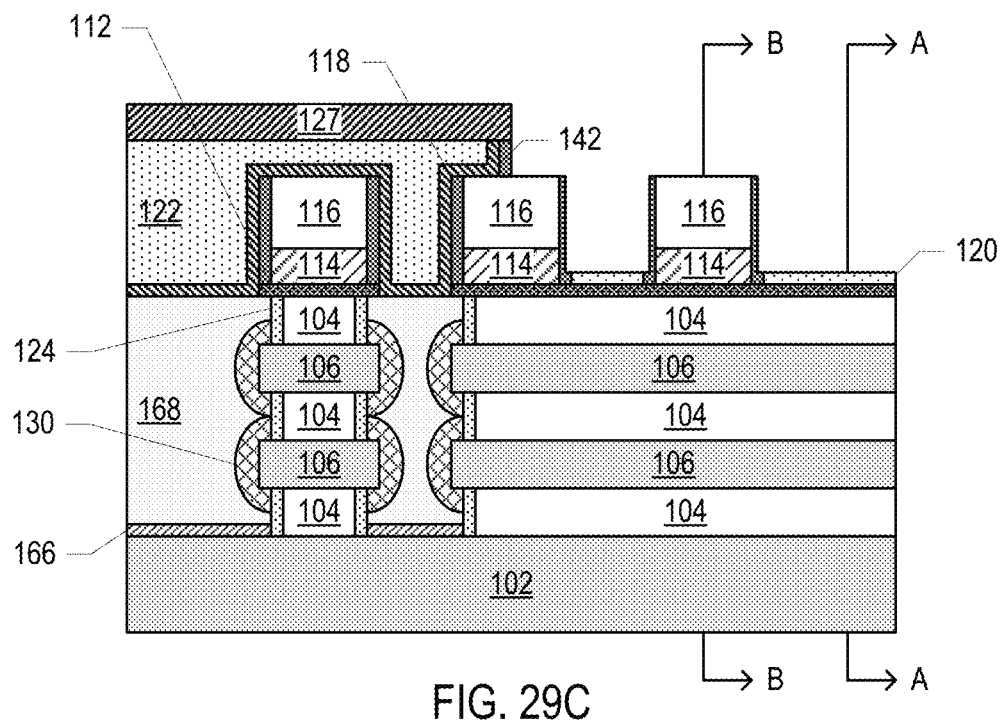
Figure 29D:
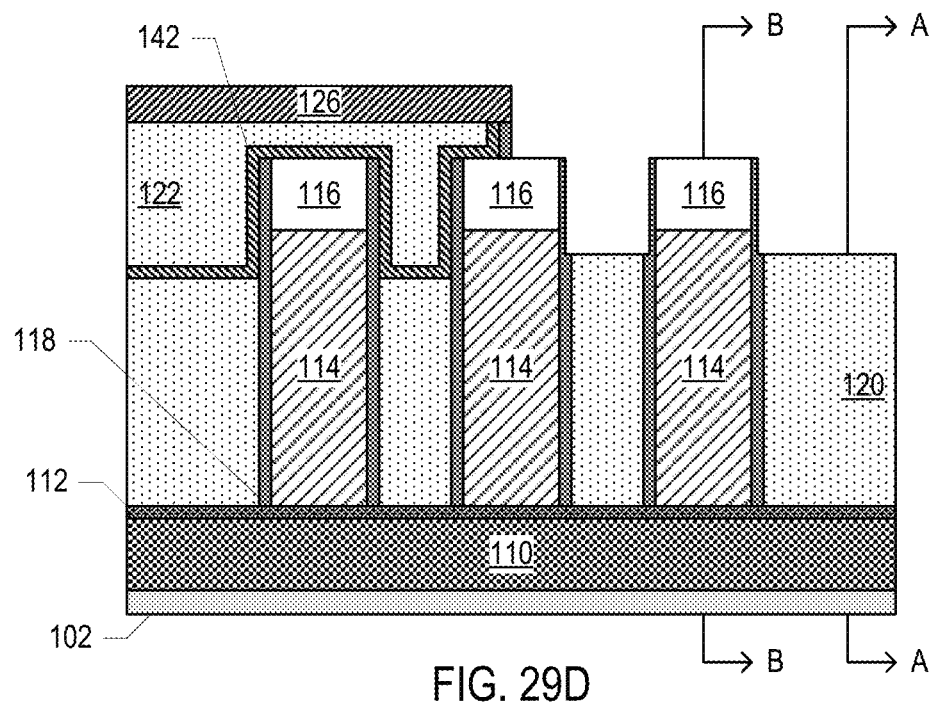
Figure 30A:
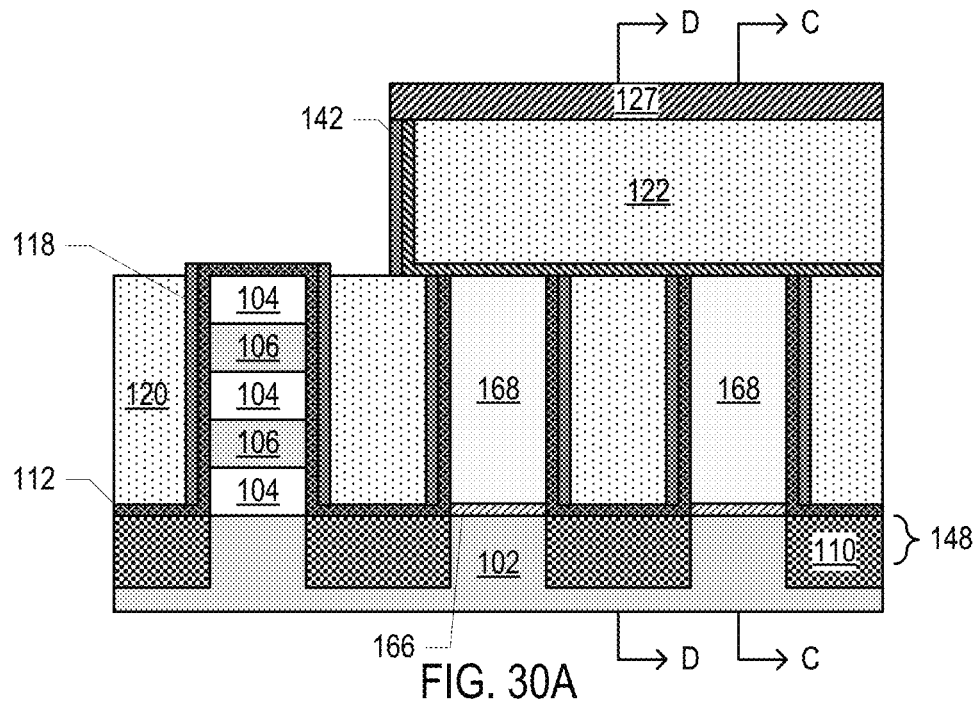
Figure 30B:
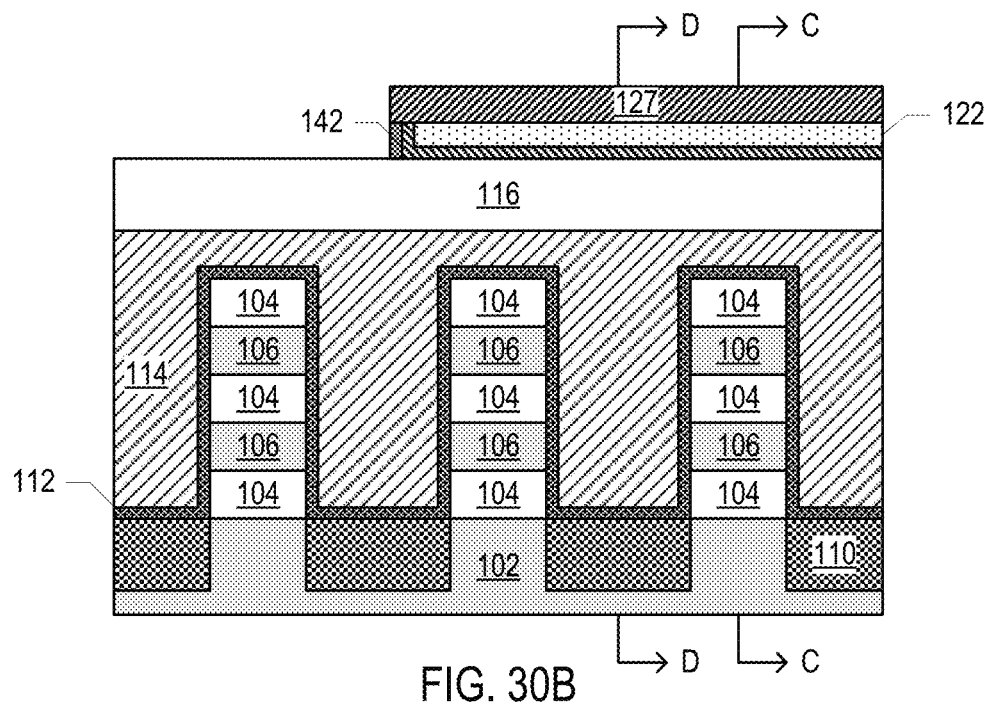
Figure 30C:
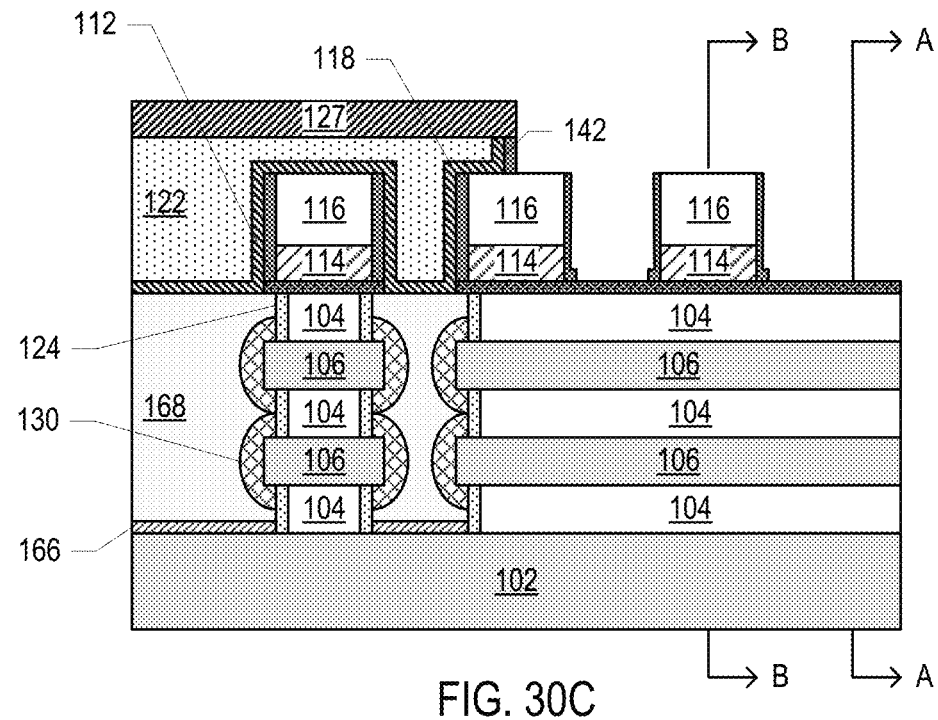
Figure 30D:
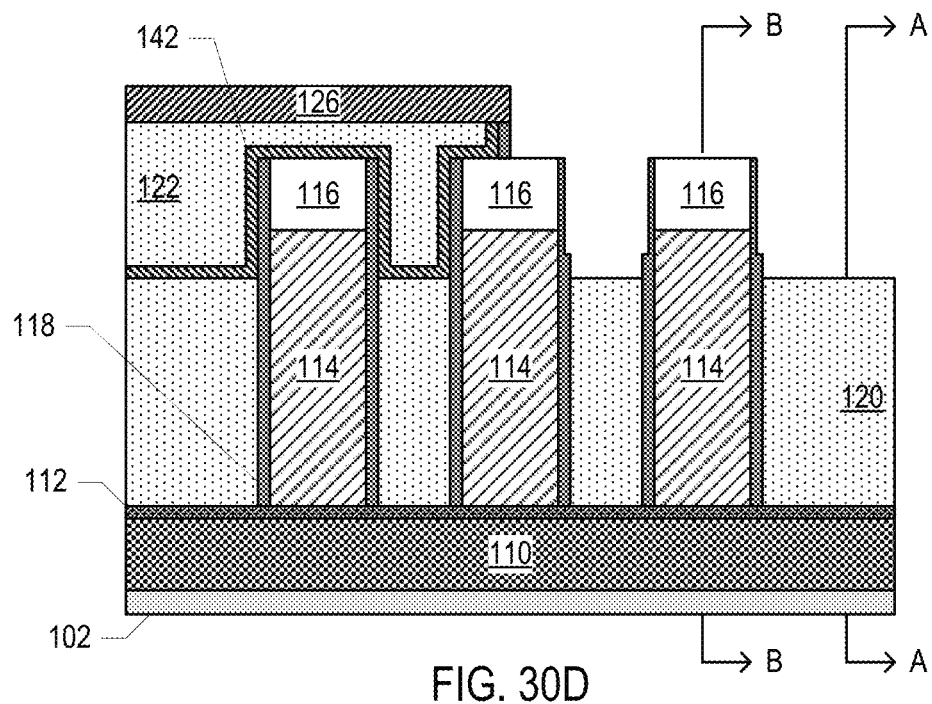
Figure 31A:
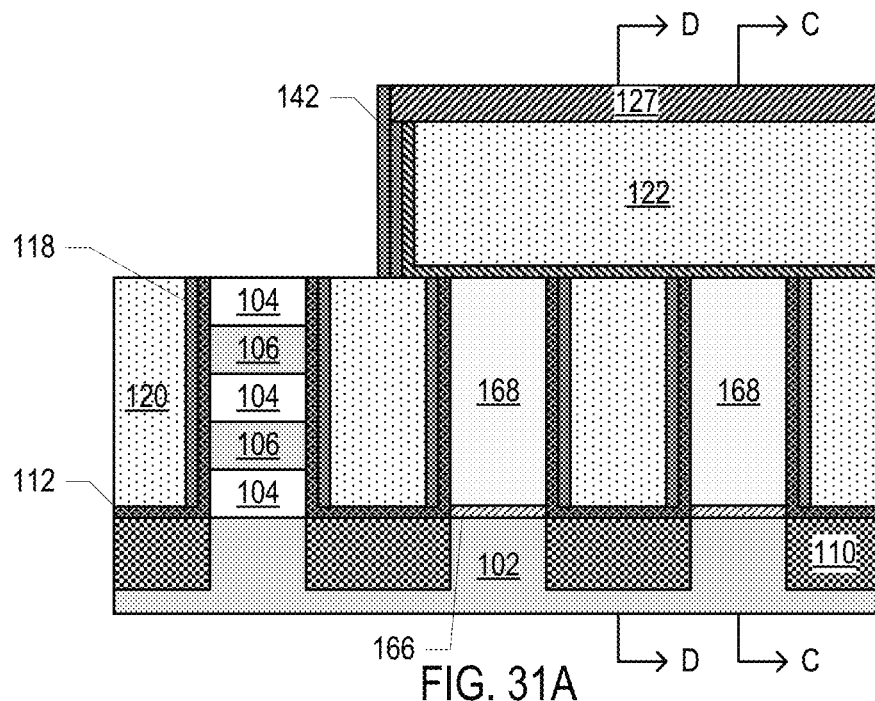
Figure 31B:
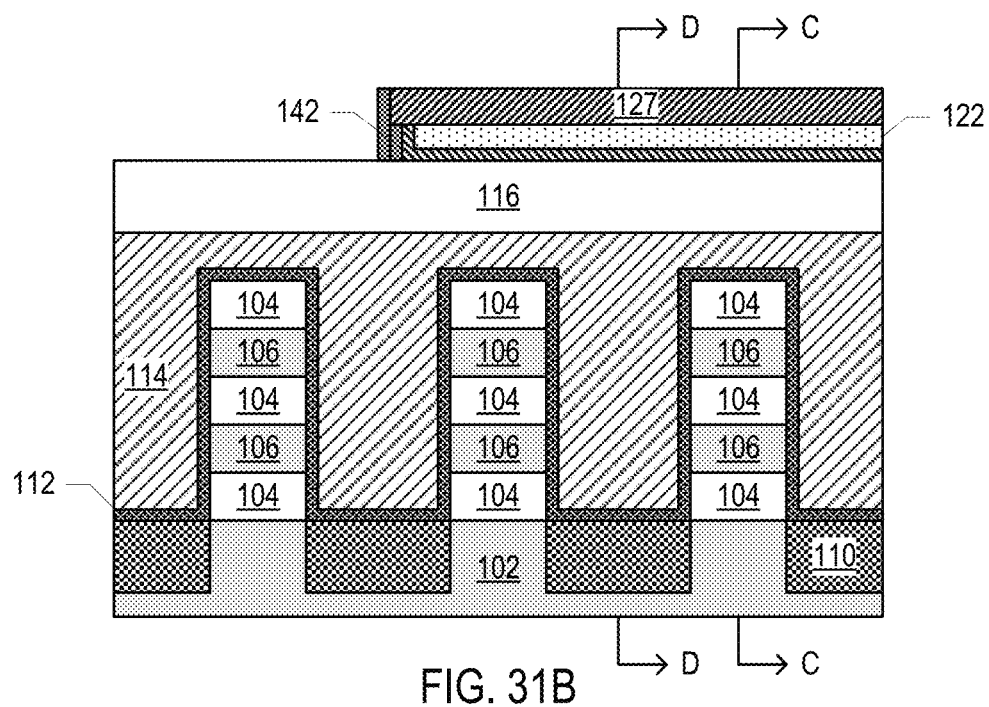
Figure 31C:
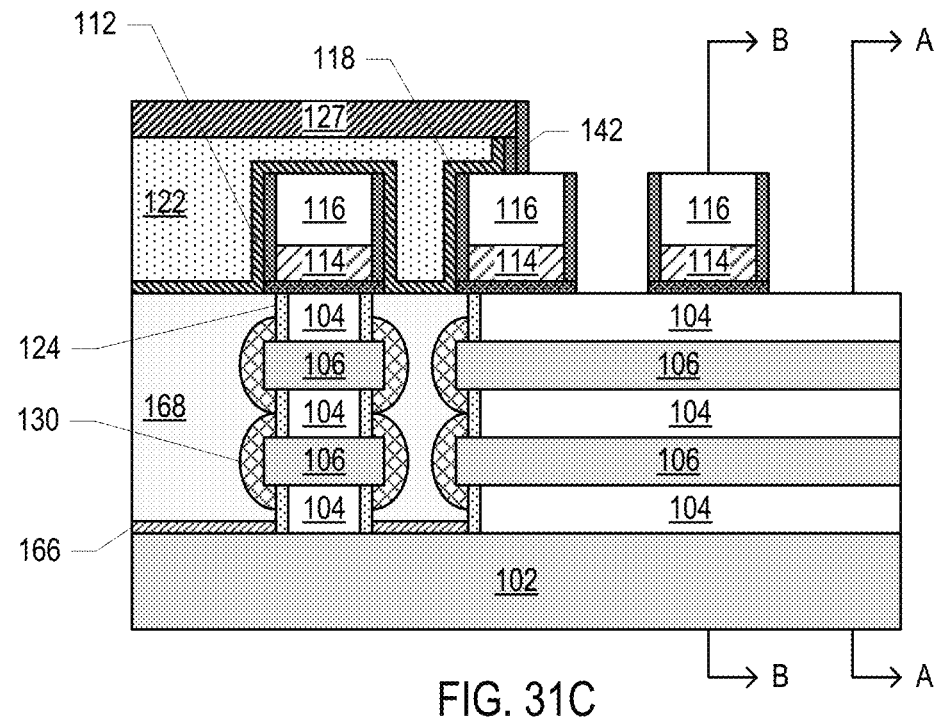
Figure 31D:
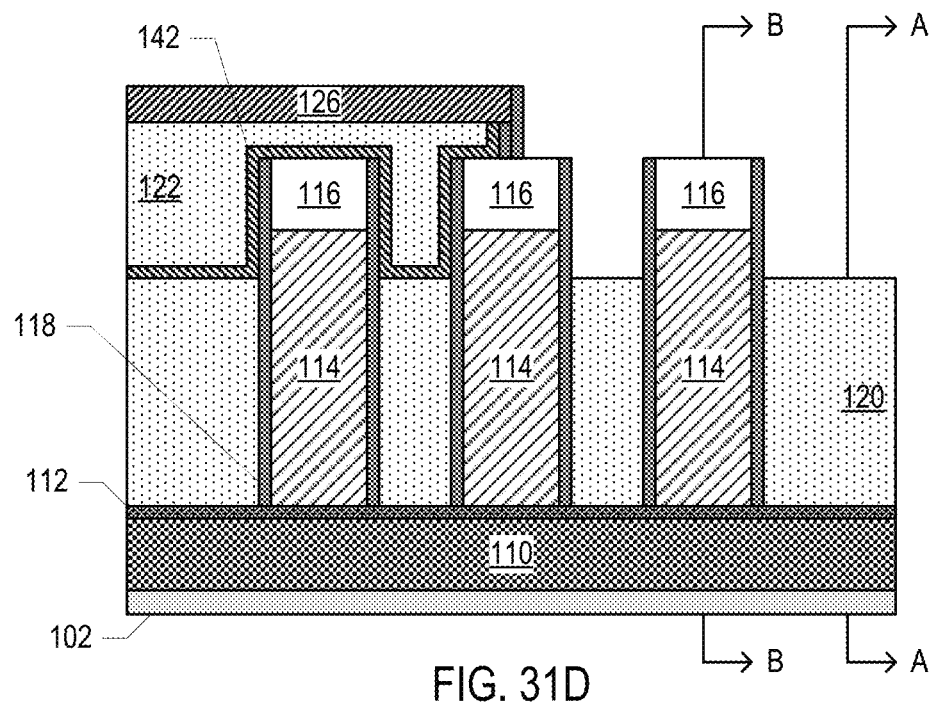
Figure 32A:
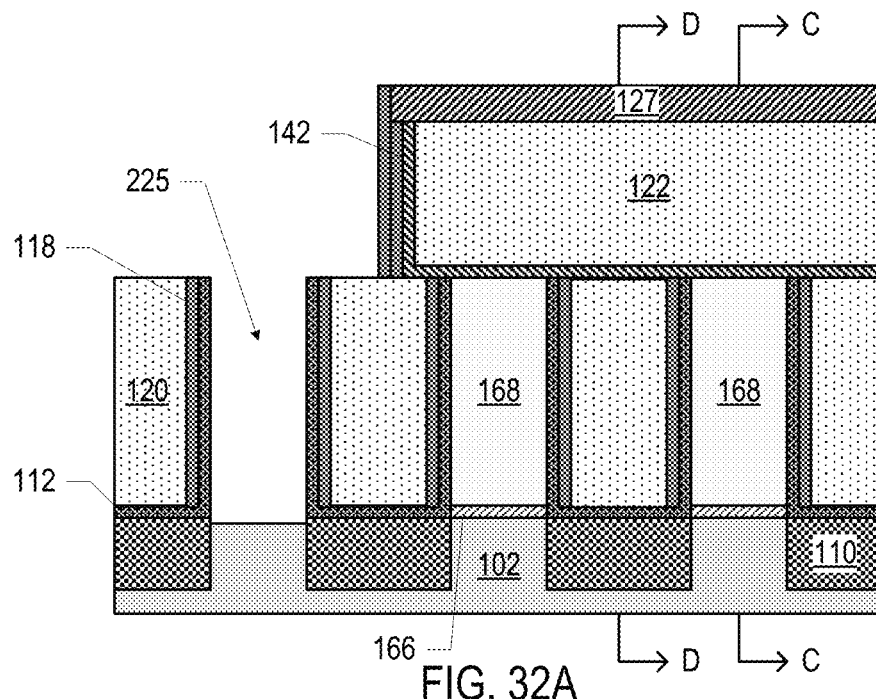
Figure 32B:
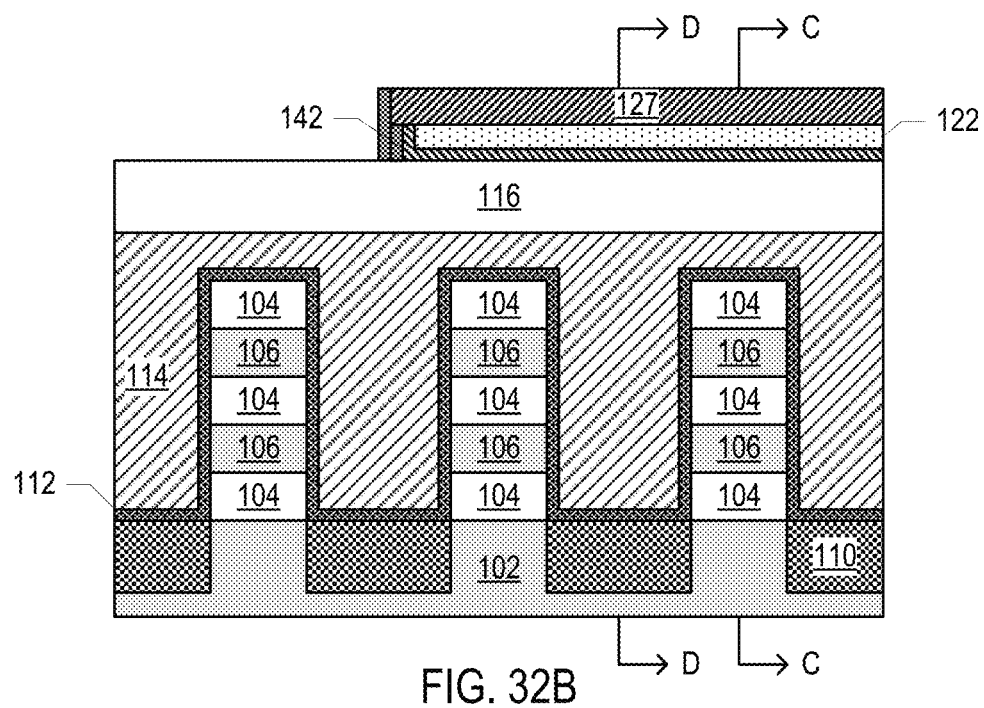
Figure 32C:
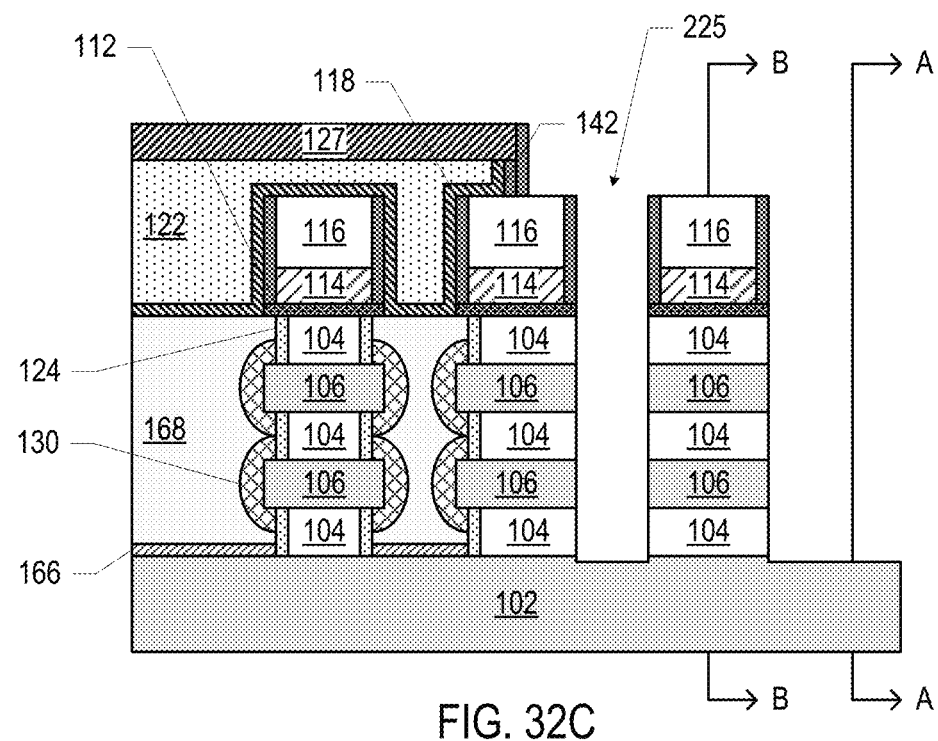
Figure 32D:
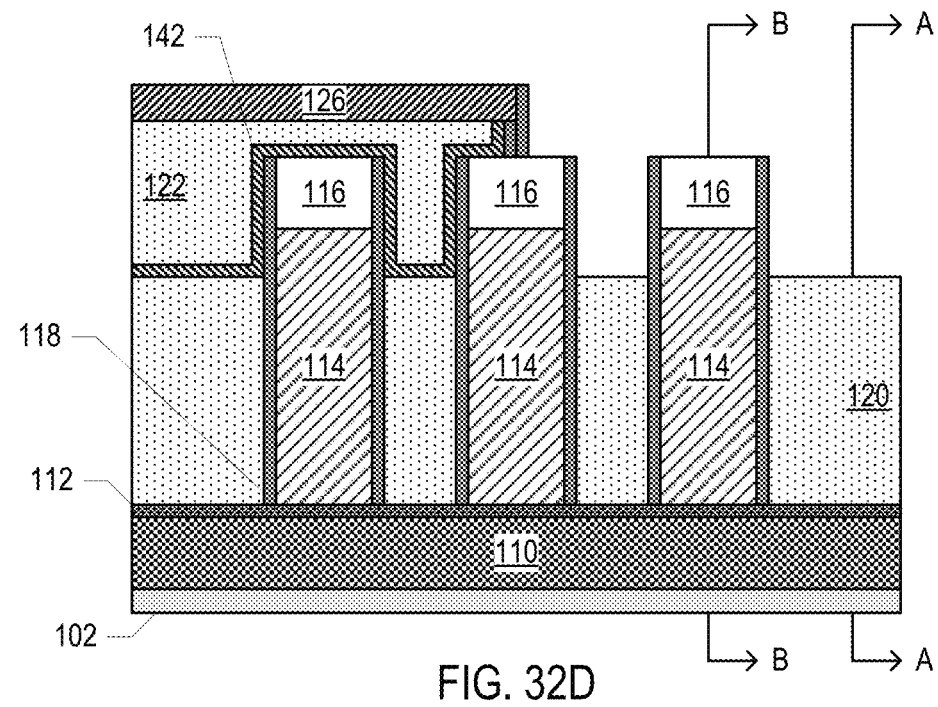
Figure 33A:
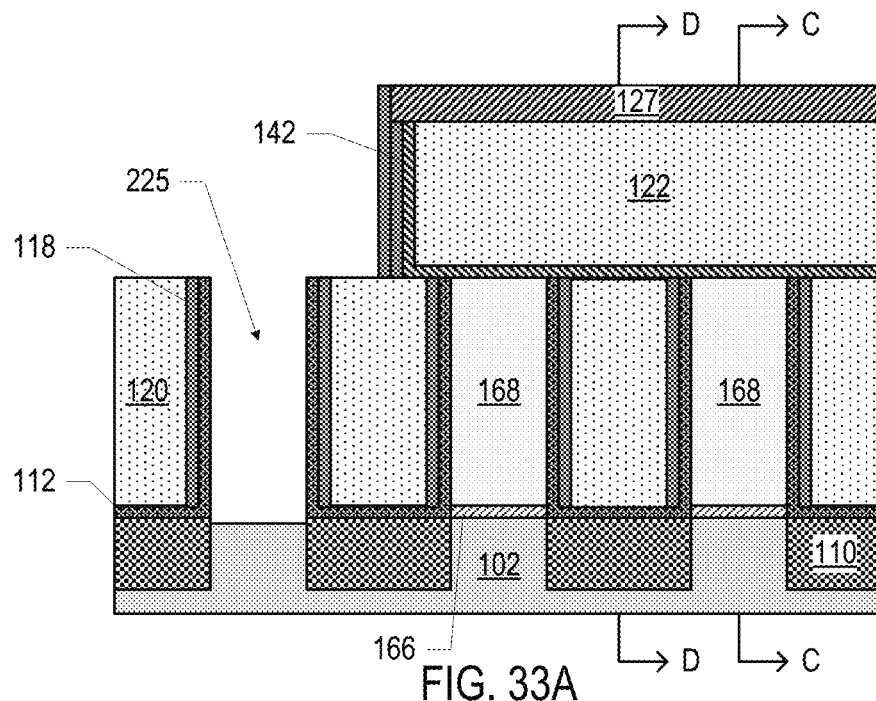
Figure 33B:
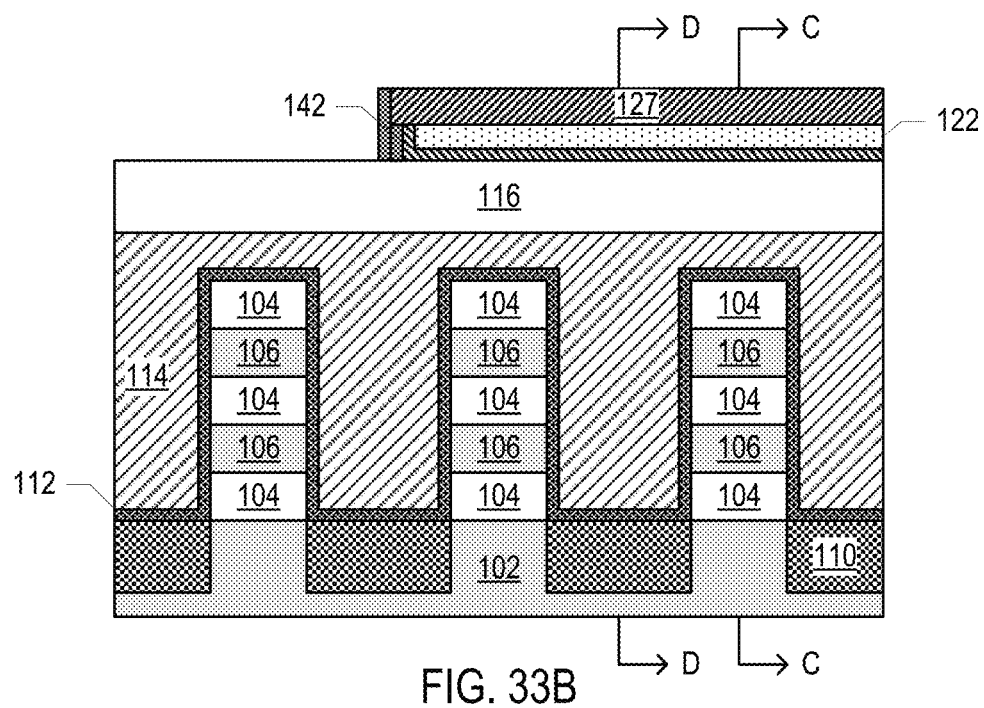
Figure 33C:
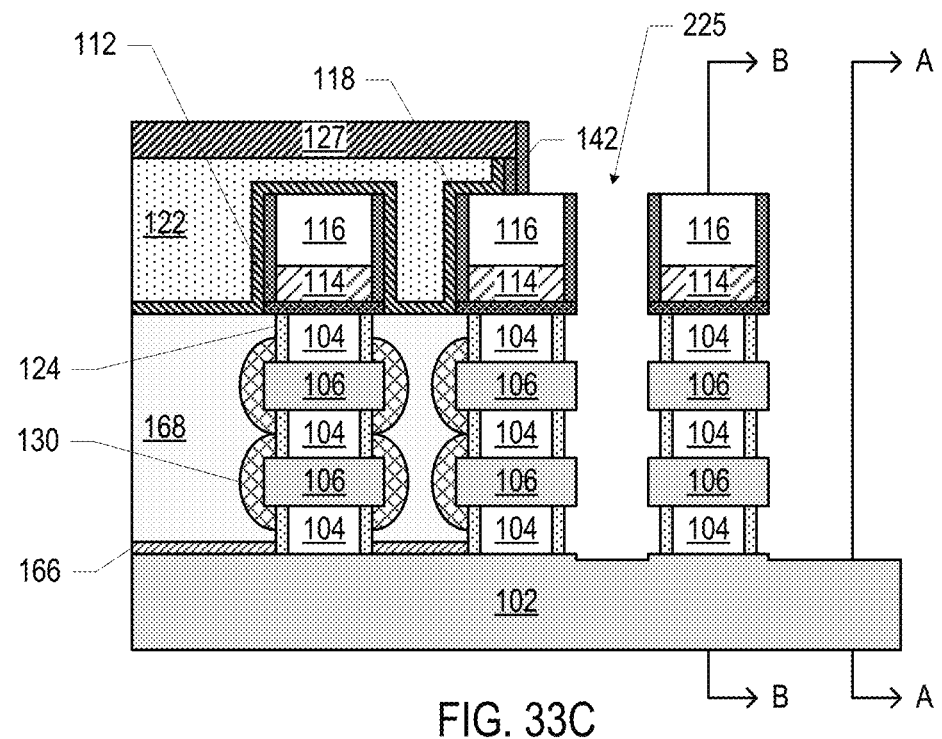
Figure 33D:
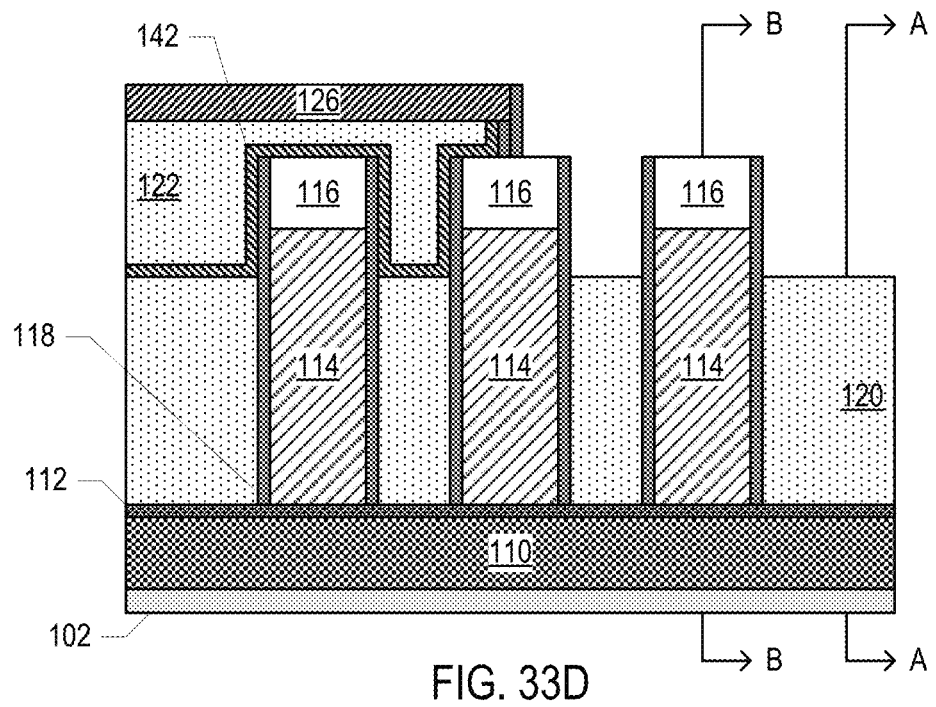
Figure 34A:
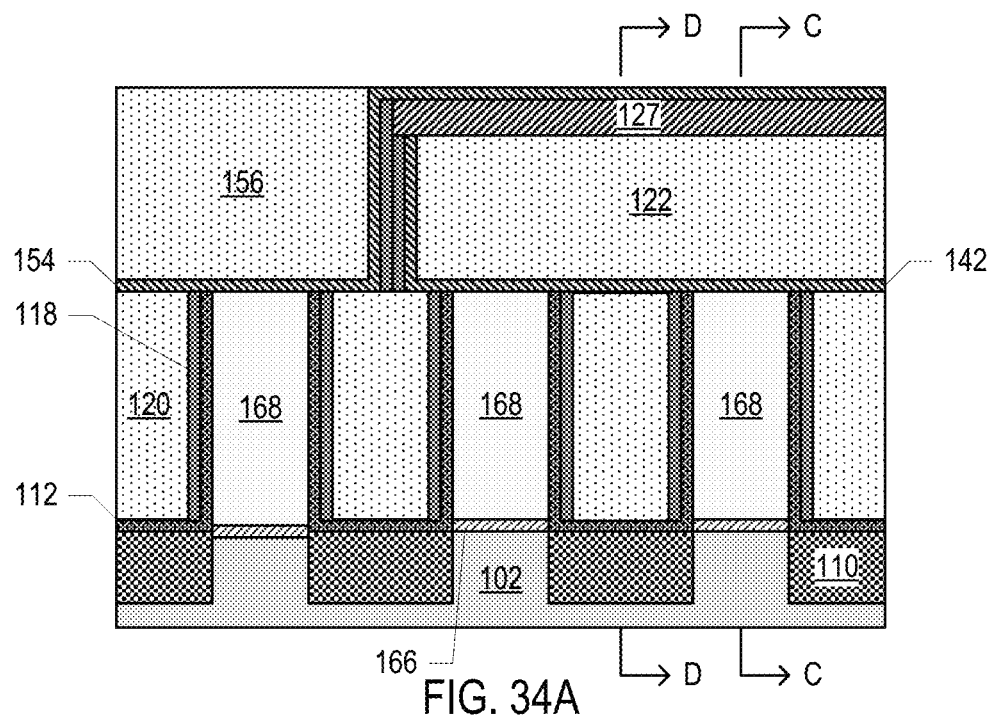
Figure 34B:
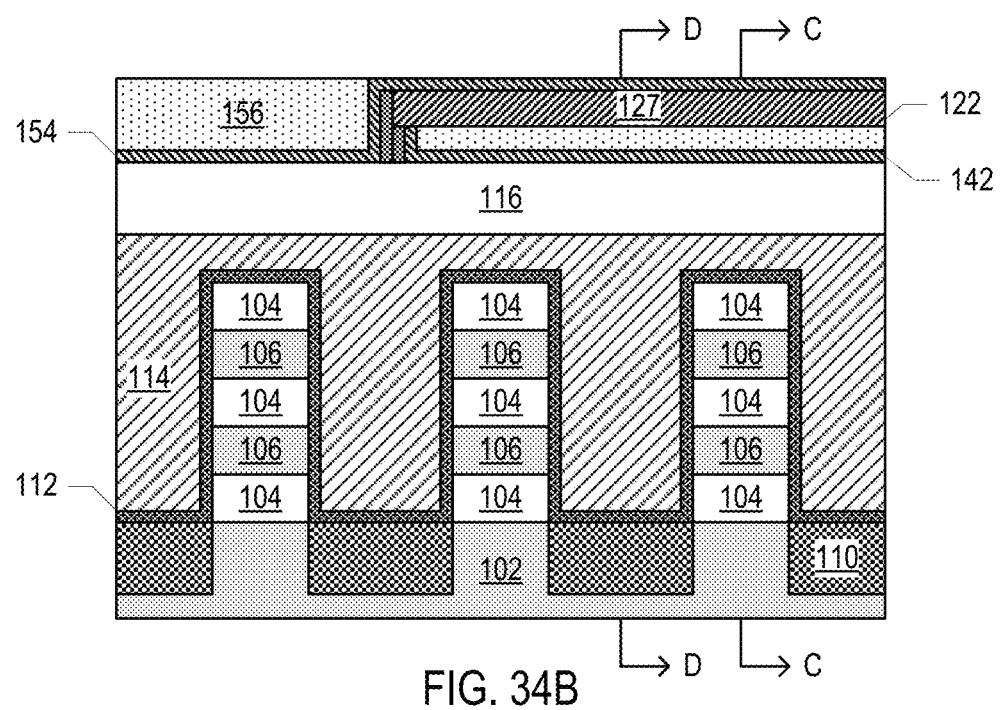
Figure 34C:
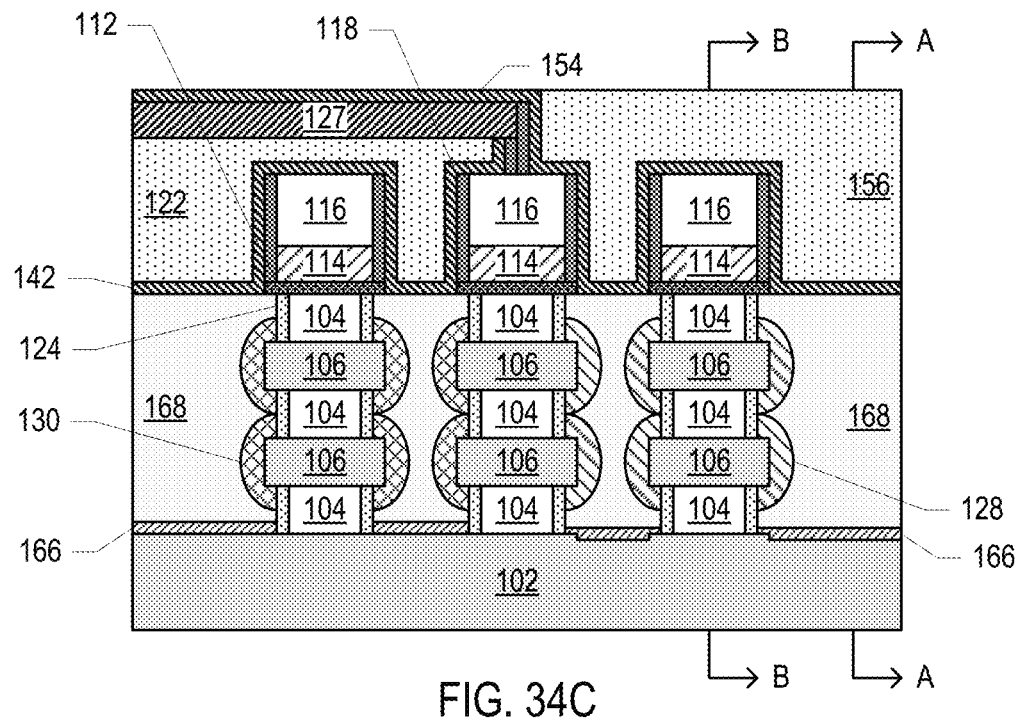
Figure 34D:
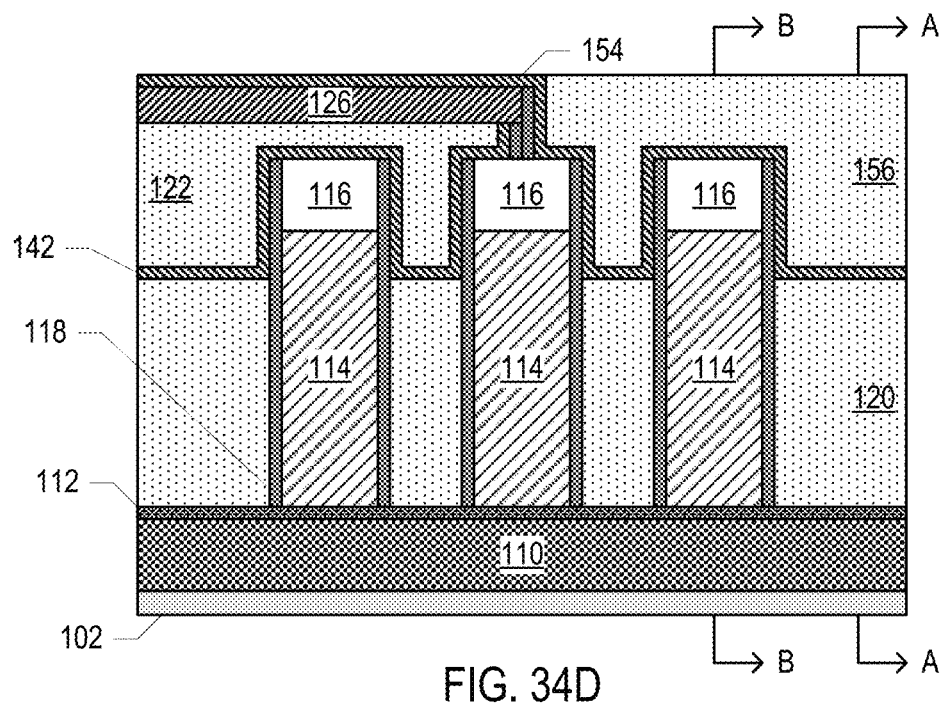
Figure 35A:
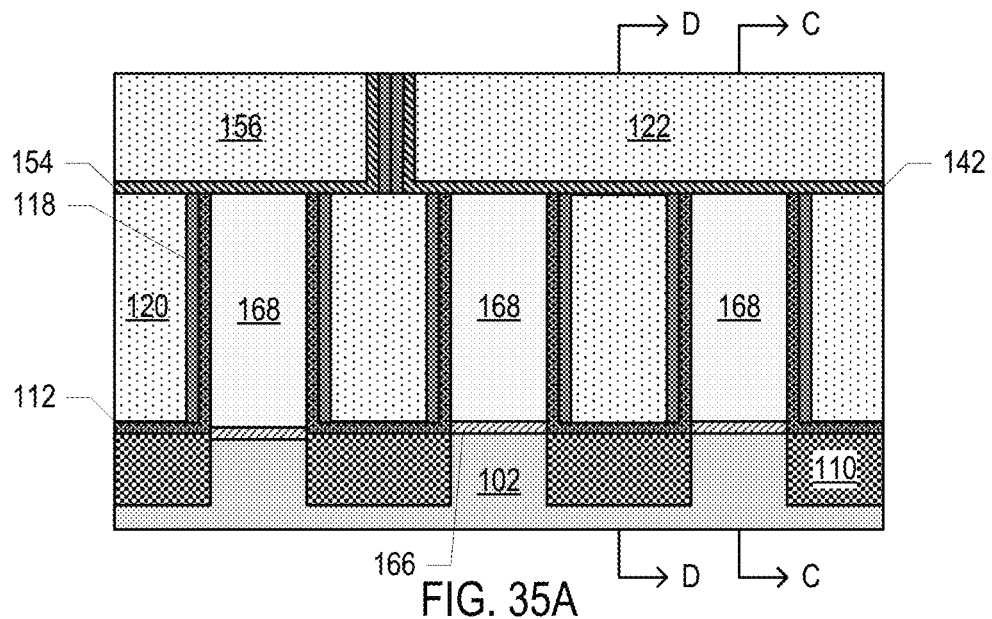
Figure 35B:
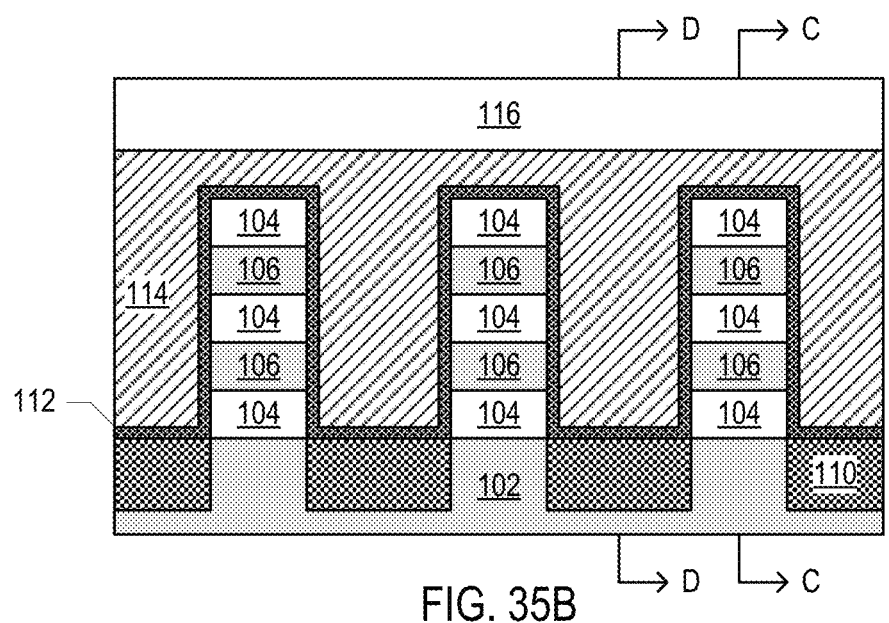
Figure 35C:
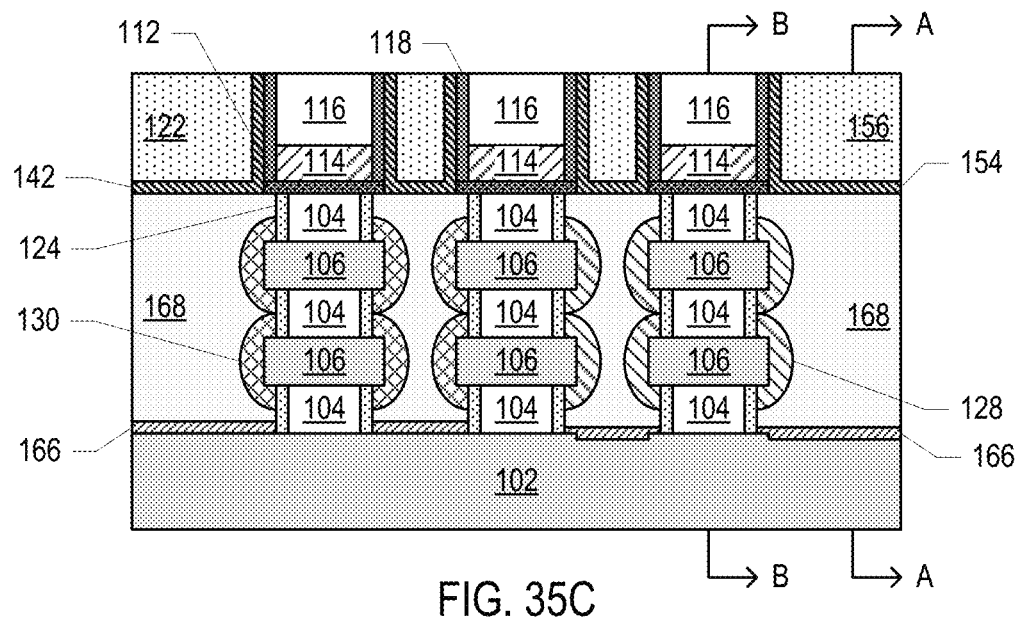
Figure 35D:
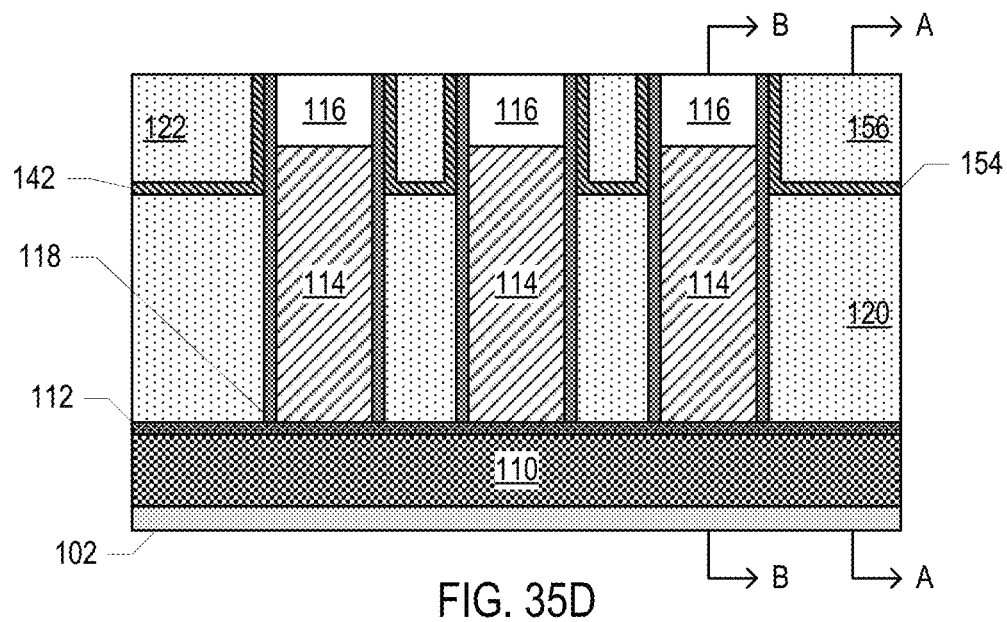
Figure 36A:
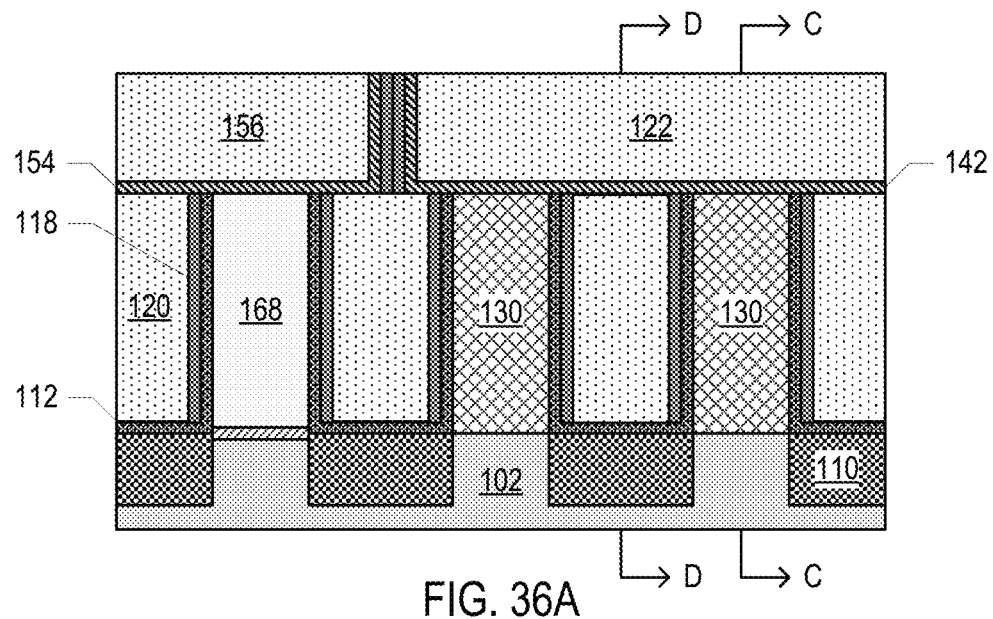
Figure 36B:
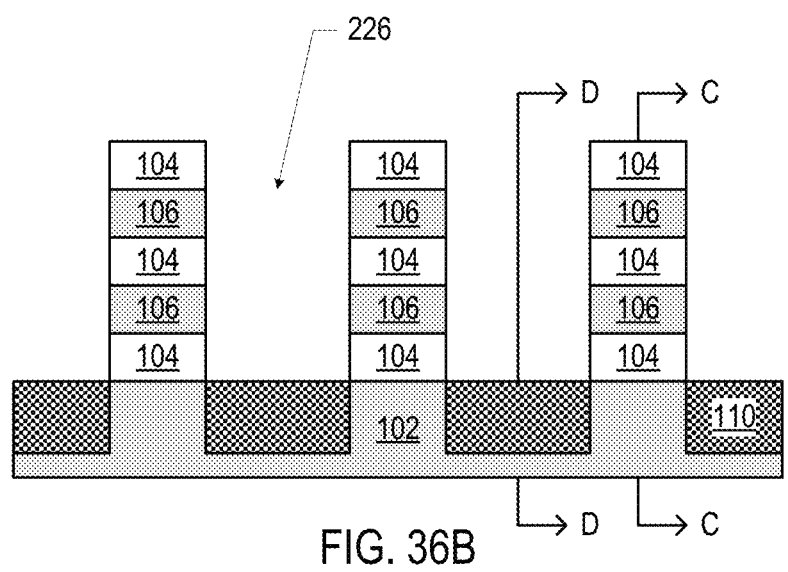
Figure 36C:
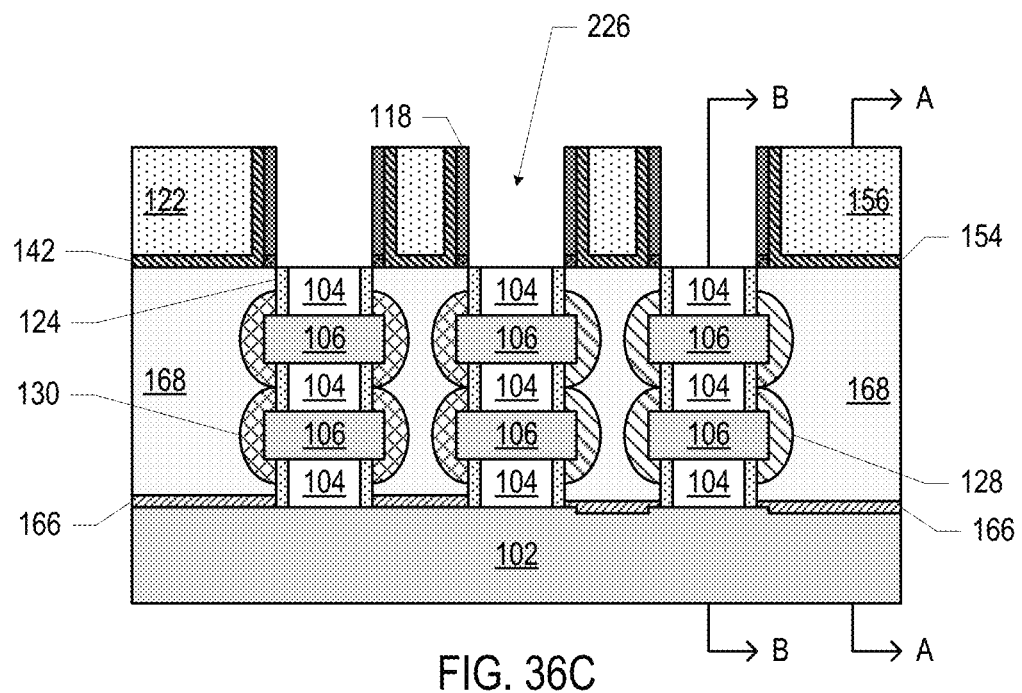
Figure 36D:
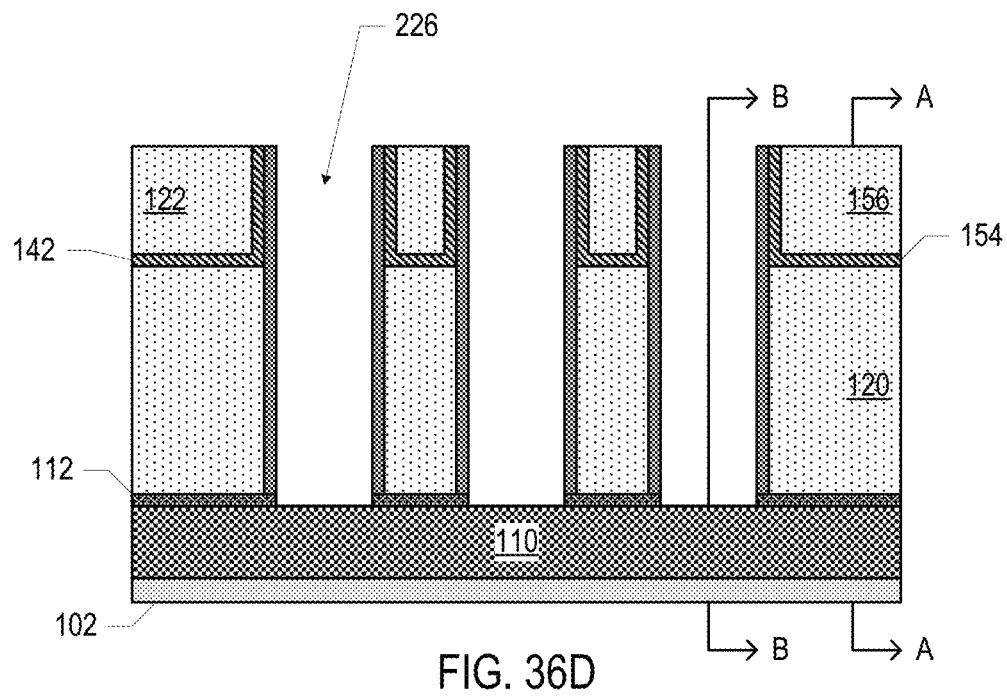
Figure 37A:
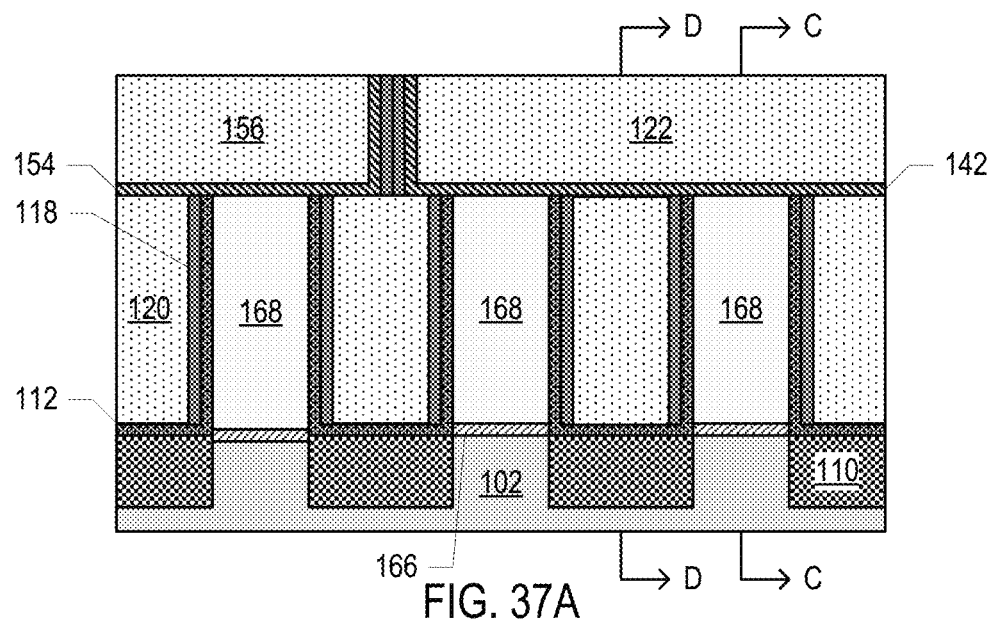
Figure 37B:
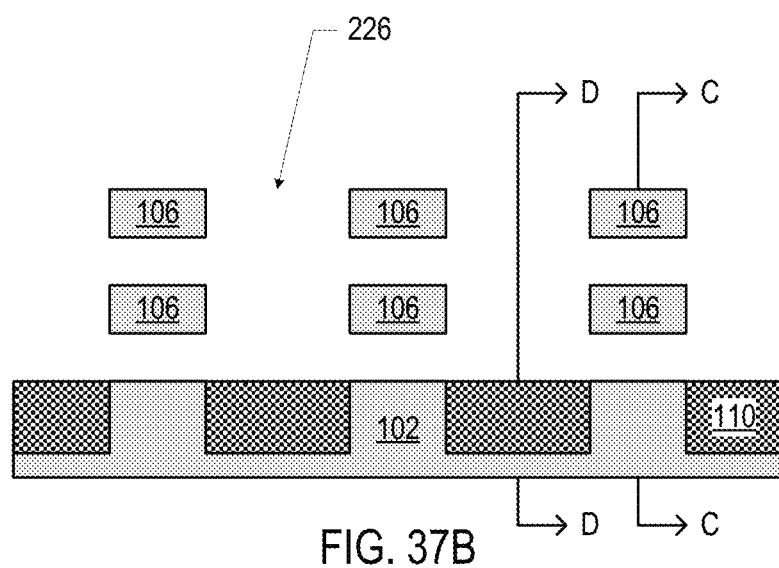
Figure 37C:
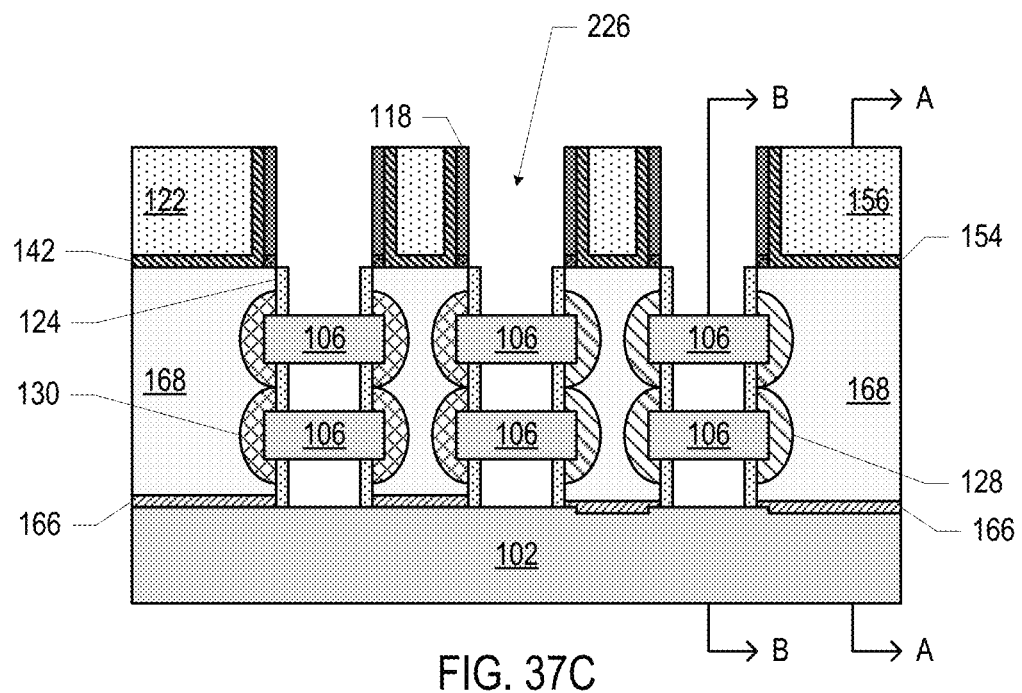
Figure 37D:
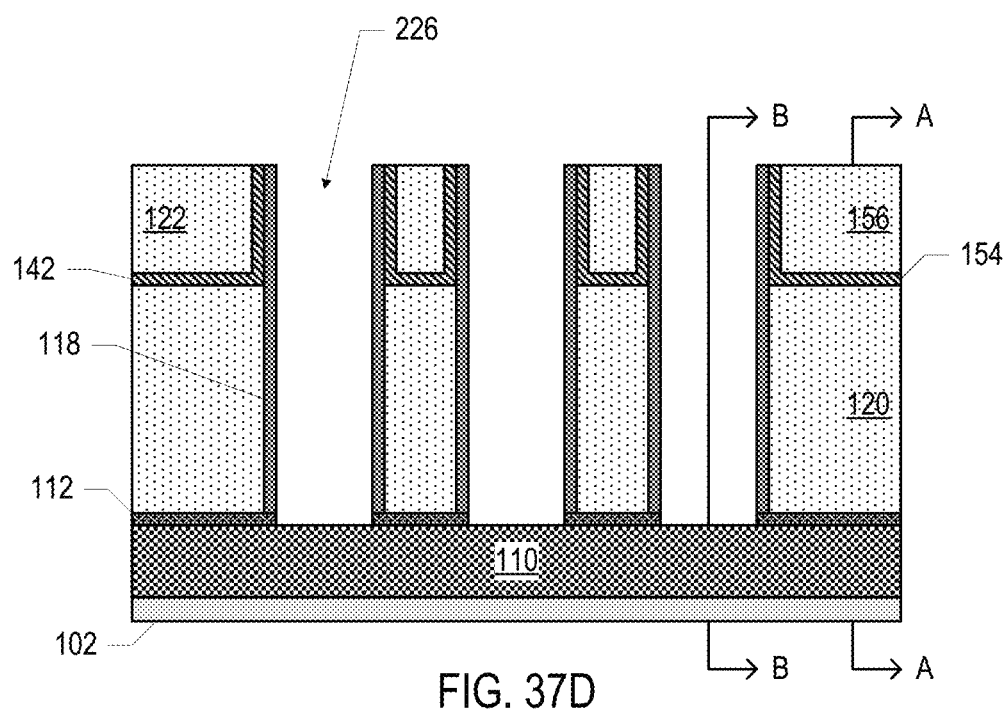
Figure 38A:
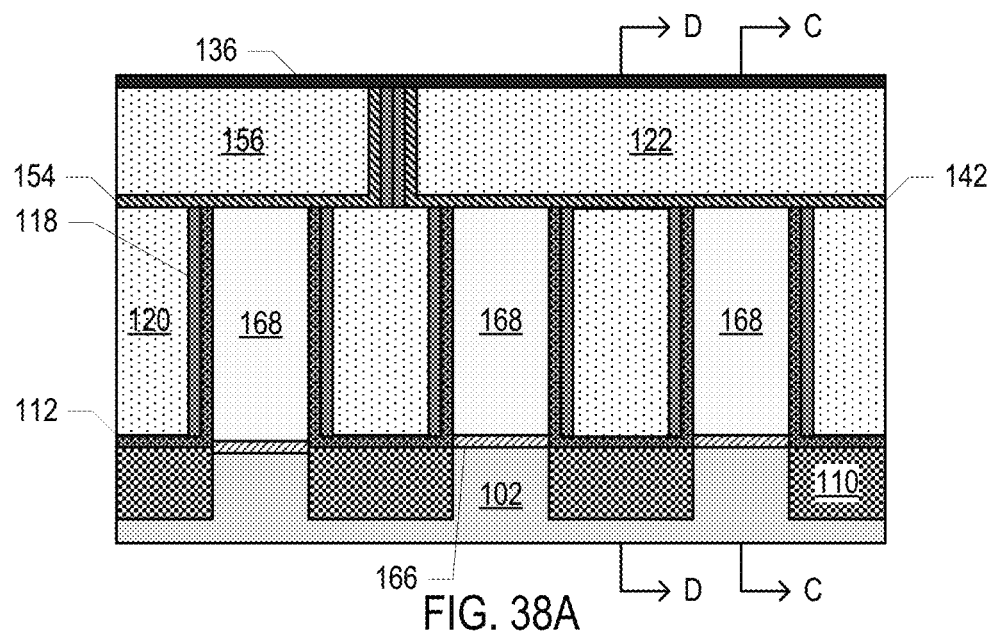
Figure 38B:
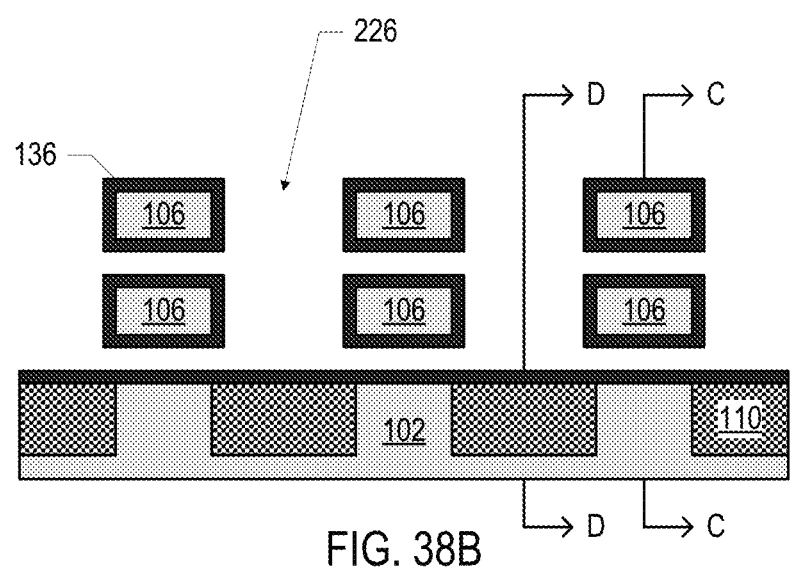
Figure 38C:
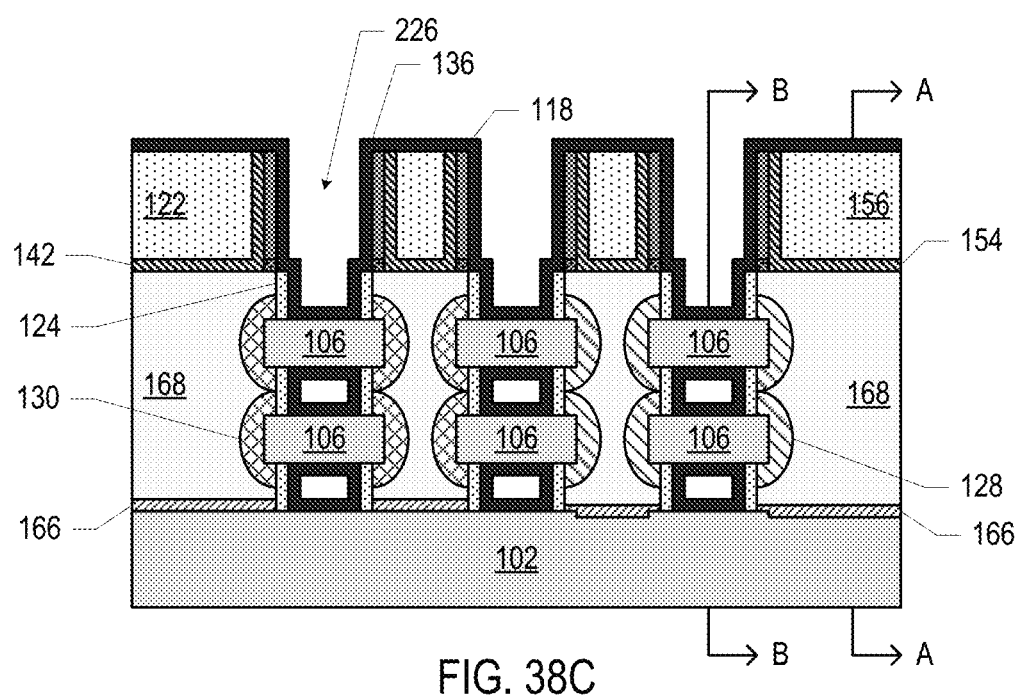
Figure 38D:
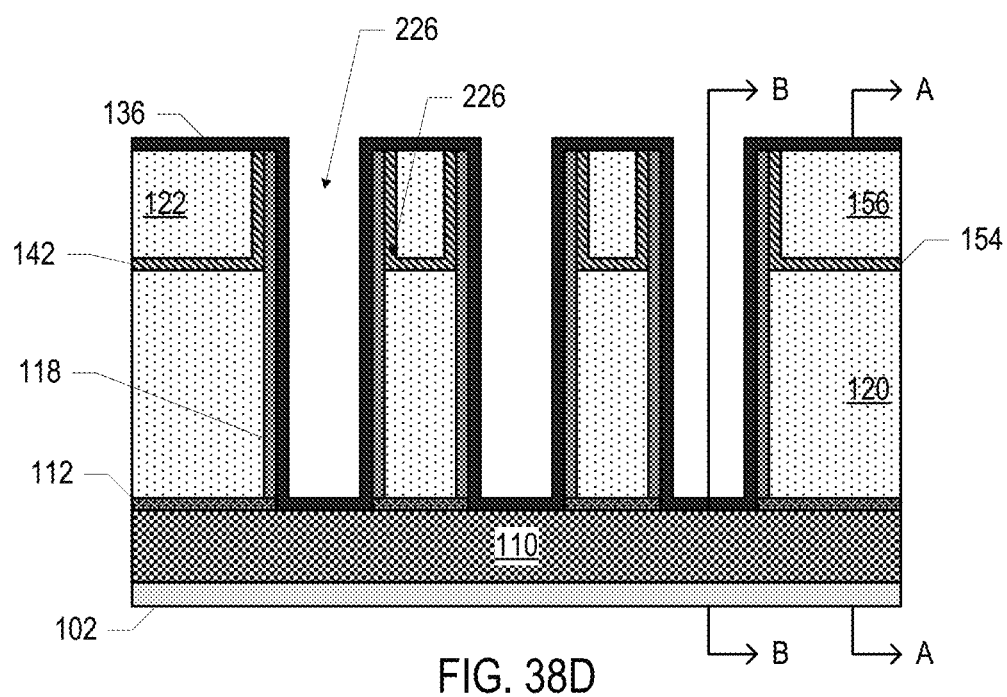
Figure 39A:
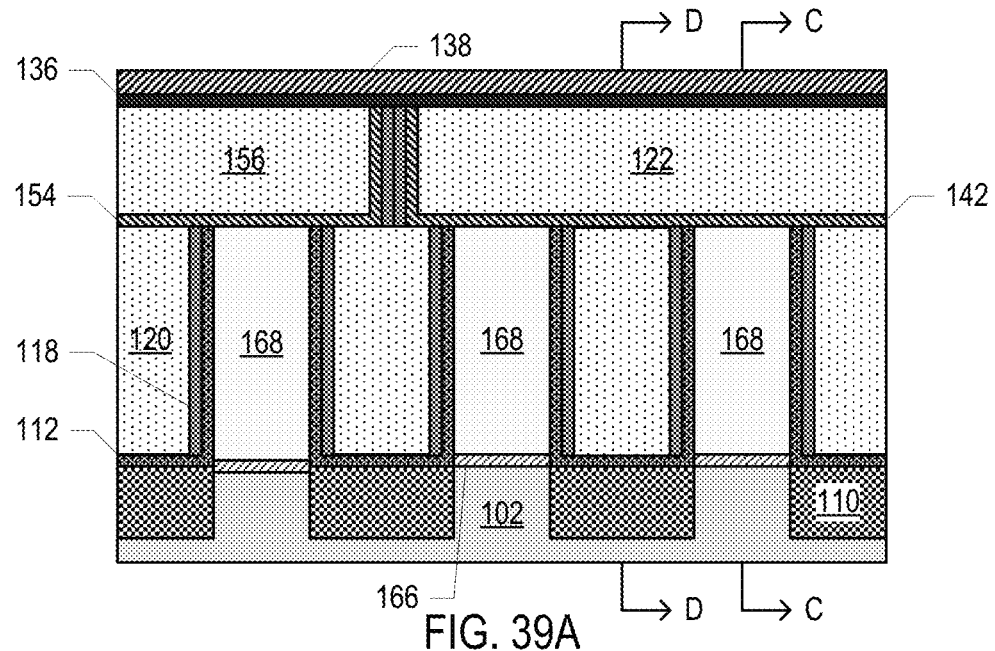
Figure 39B:
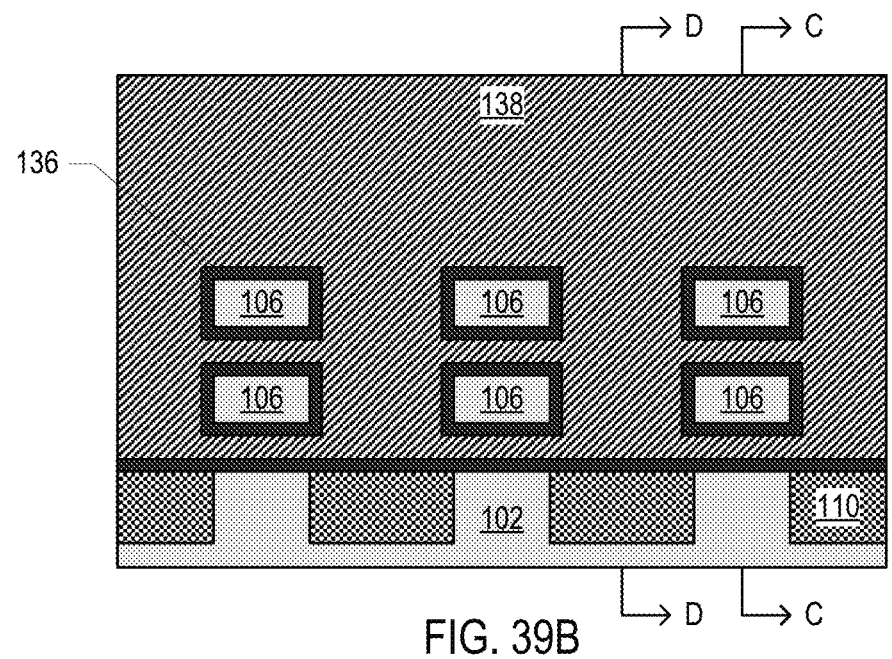
Figure 39C:
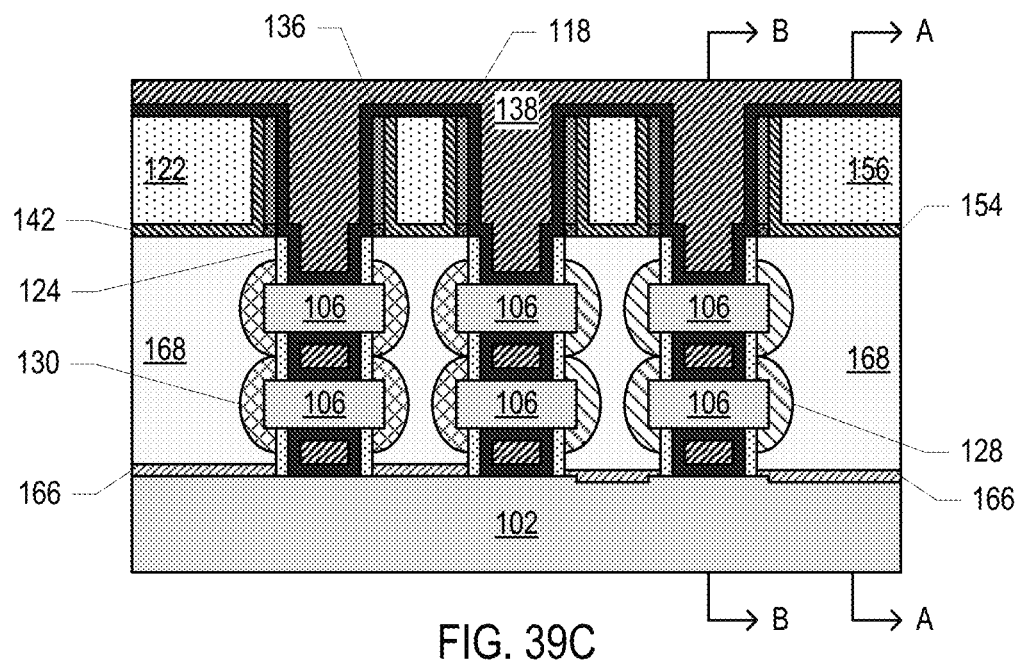
Figure 39D:
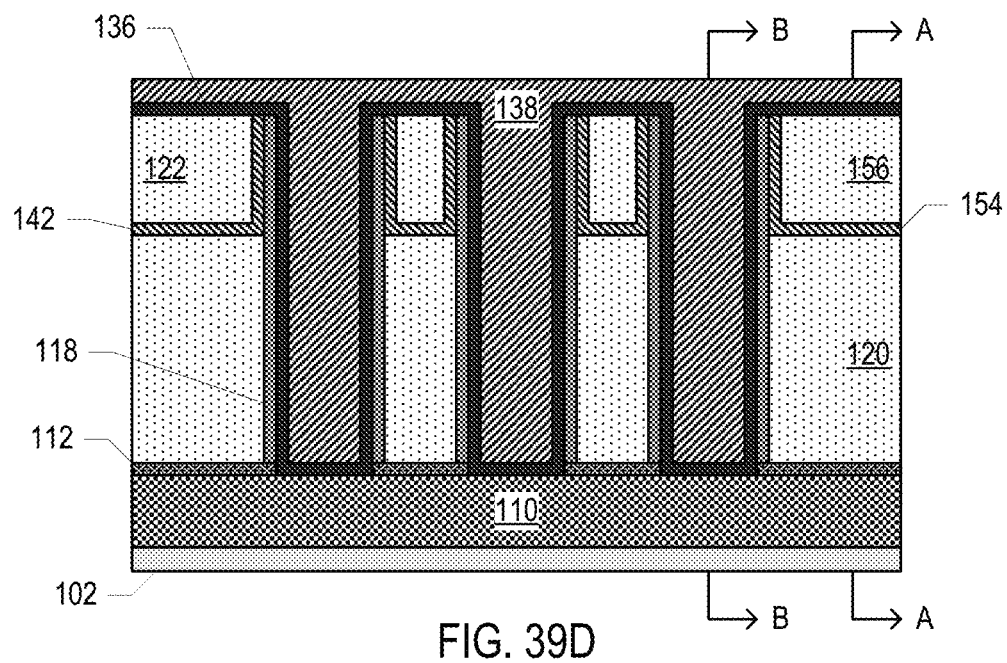
Figure 40A:
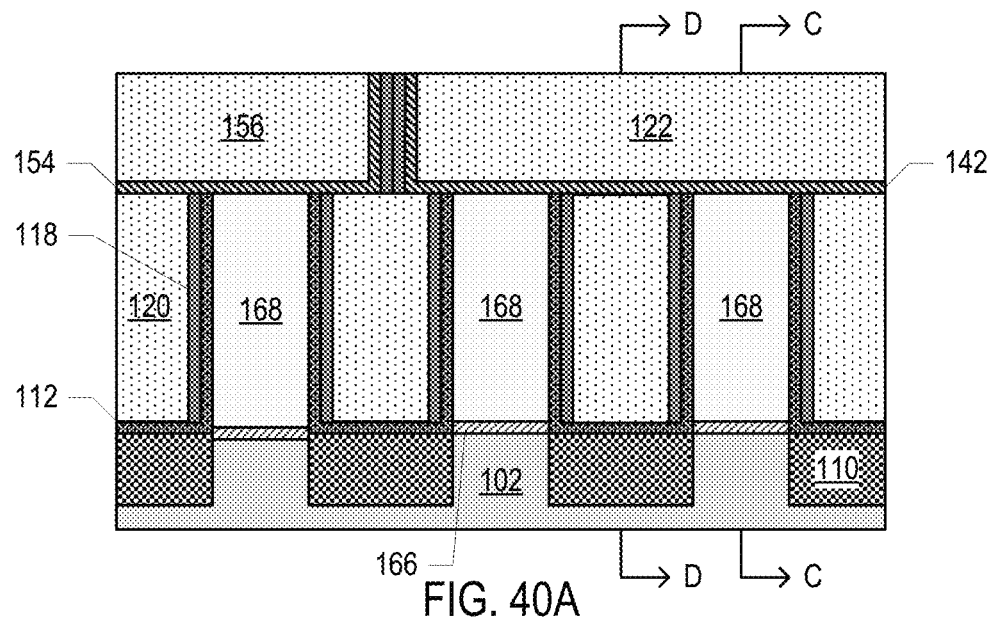
Figure 40B:
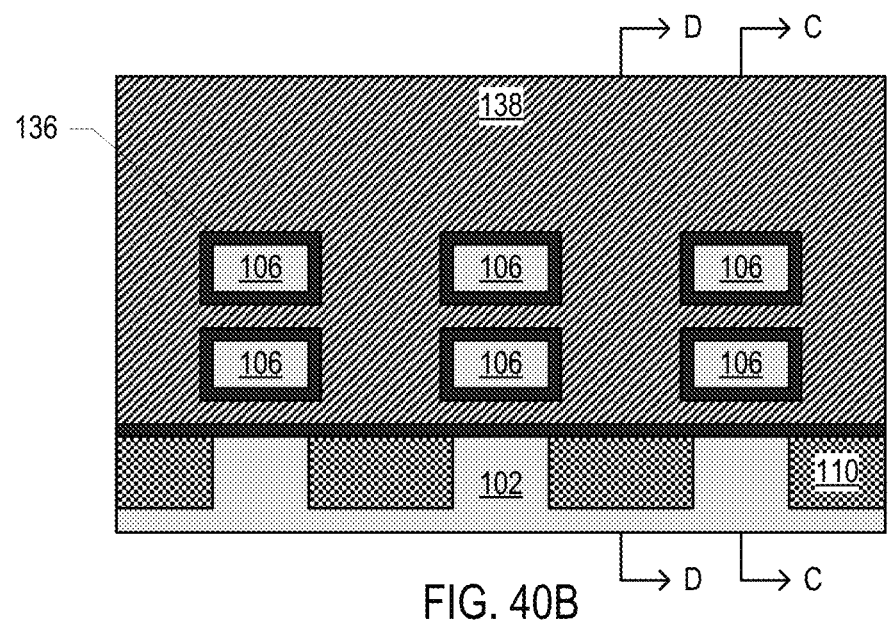
Figure 40C:
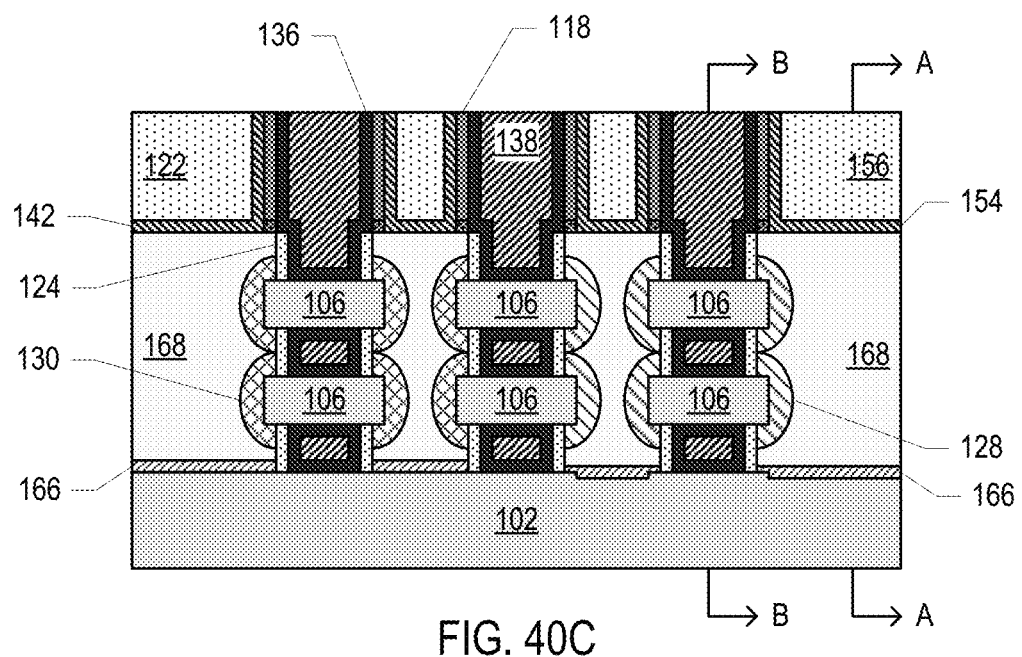
Figure 40D:
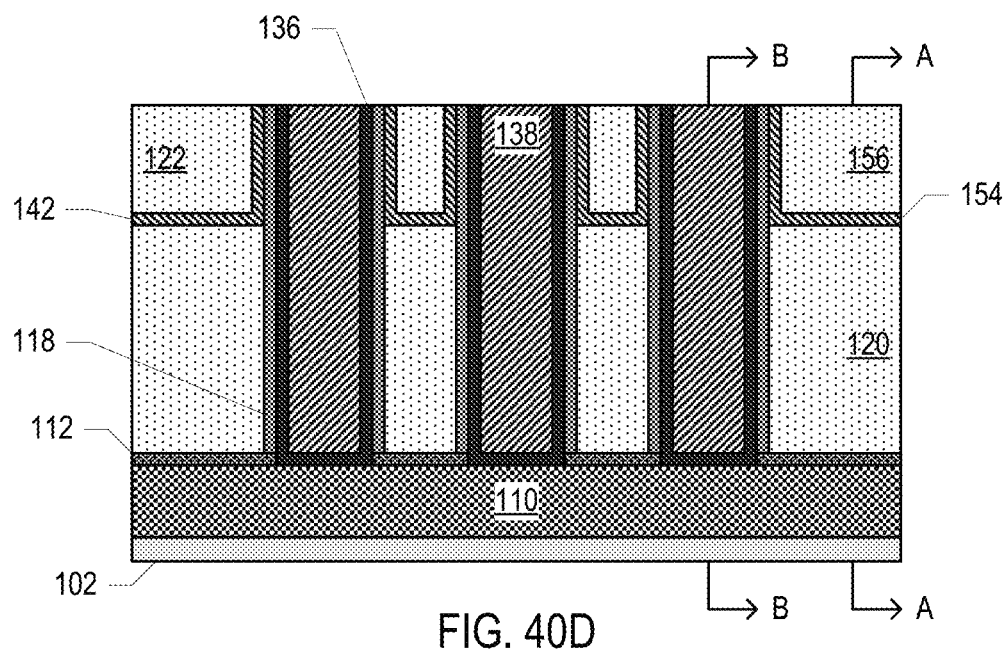
Figure 41A:
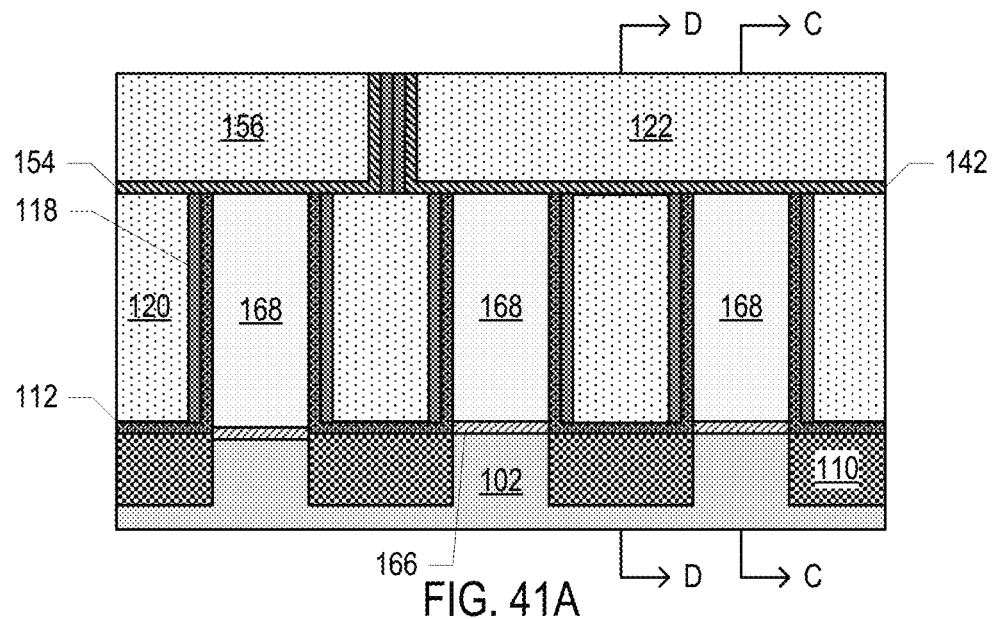
Figure 41B:
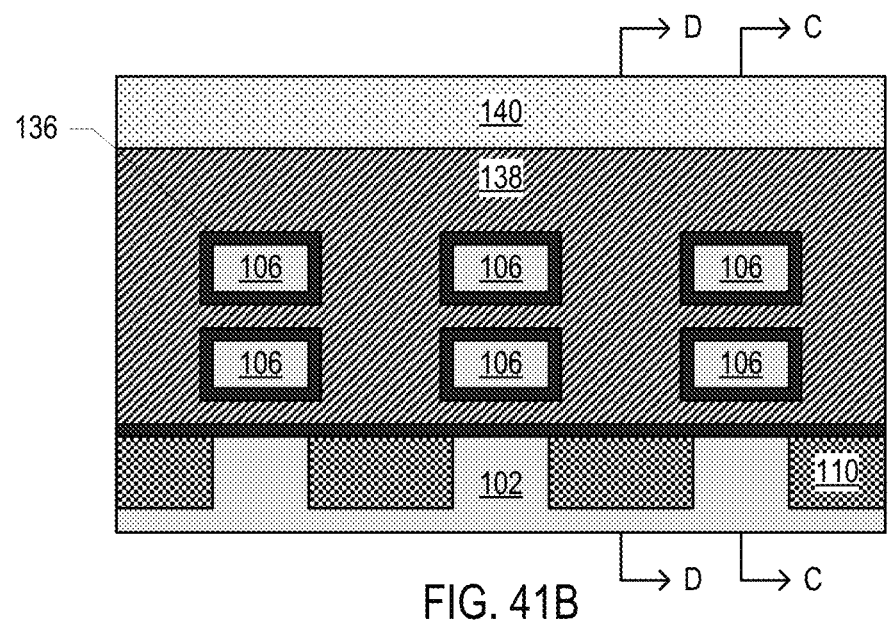
Figure 41C:
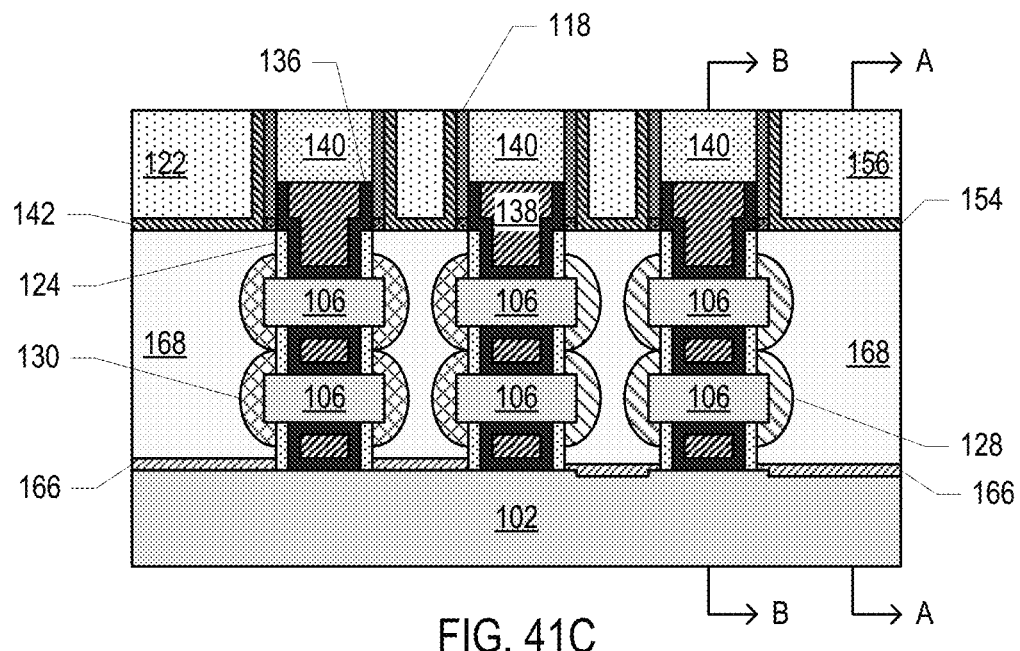
Figure 41D:
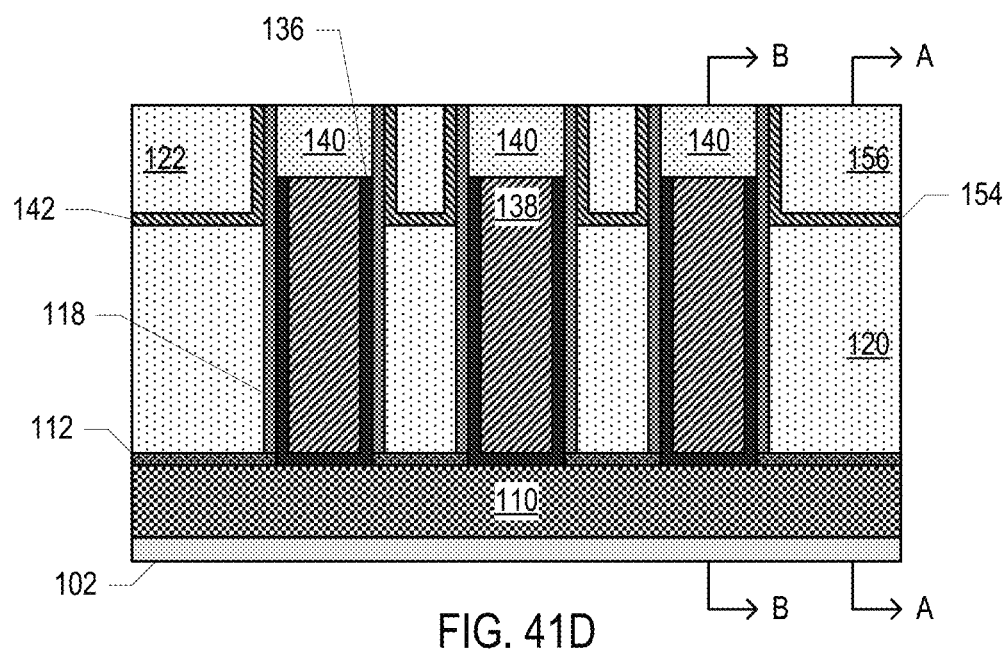
Figure 42A:
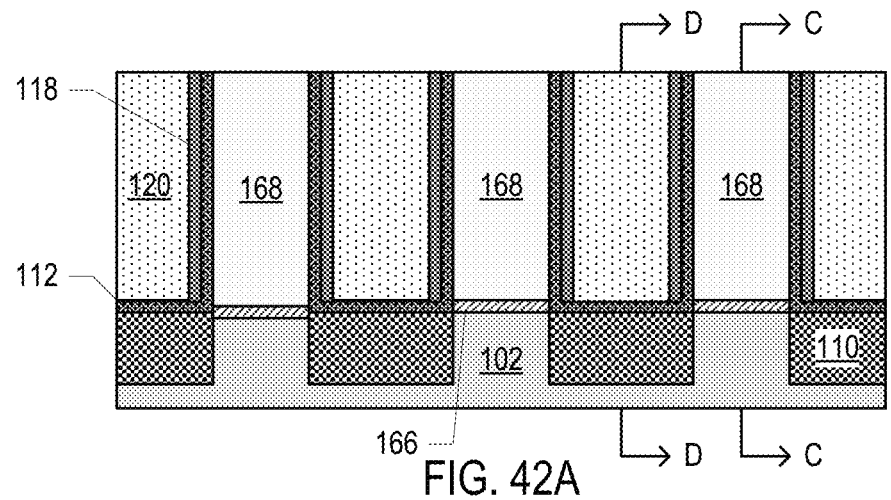
Figure 42B:
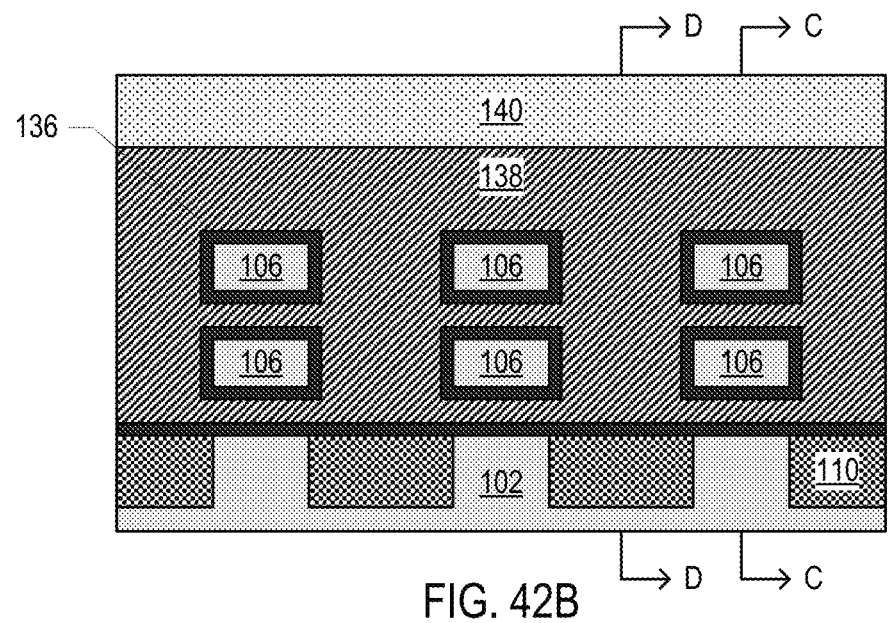
Figure 42C:
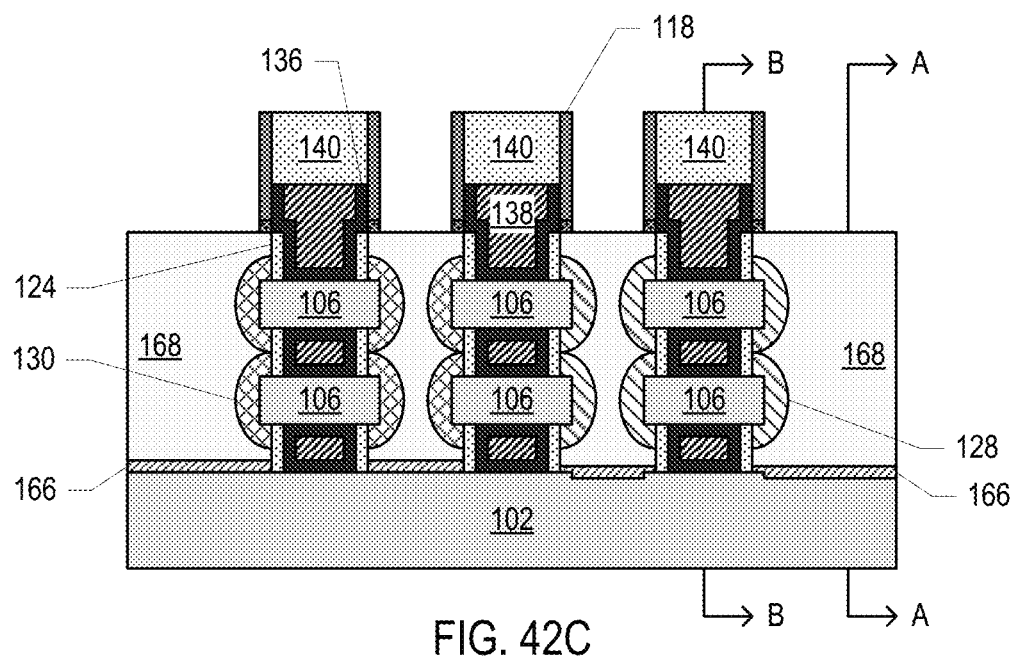
Figure 42D:
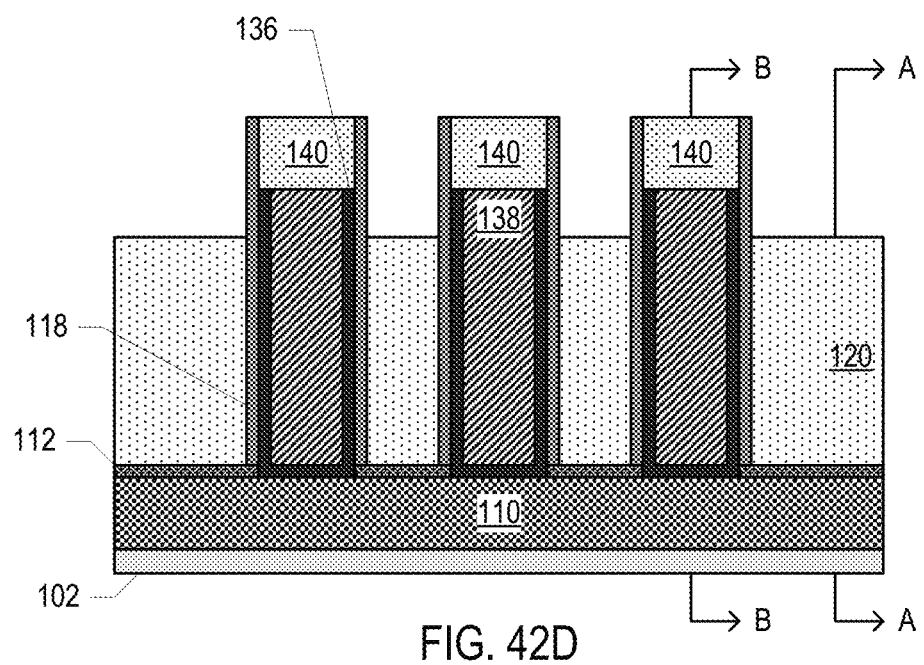
Figure 43A:
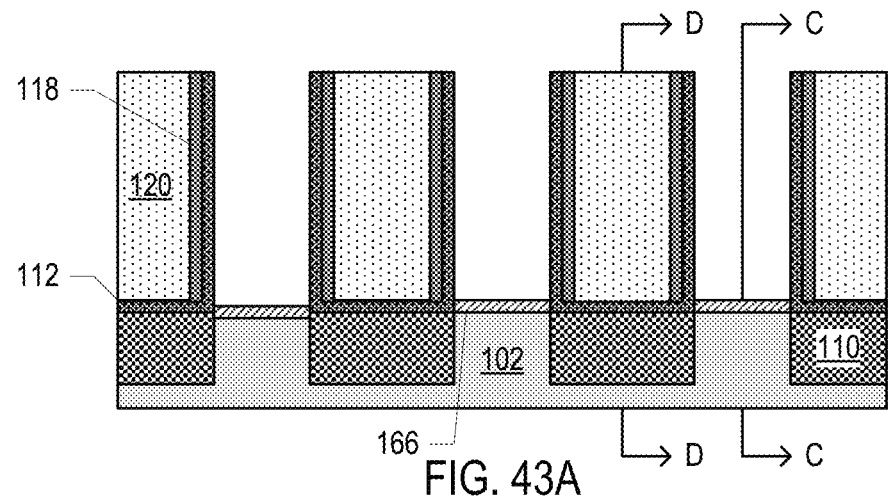
Figure 43B:
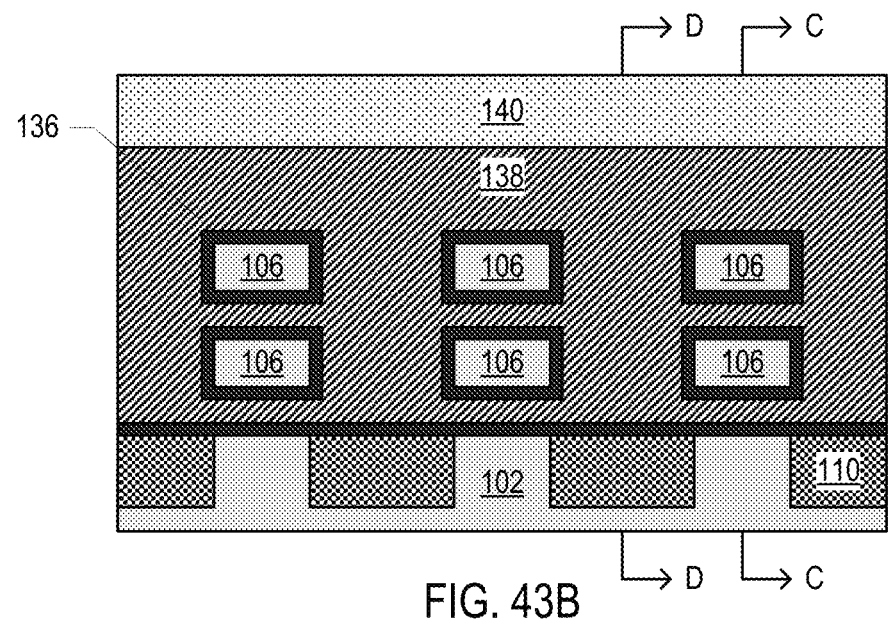
Figure 43C:
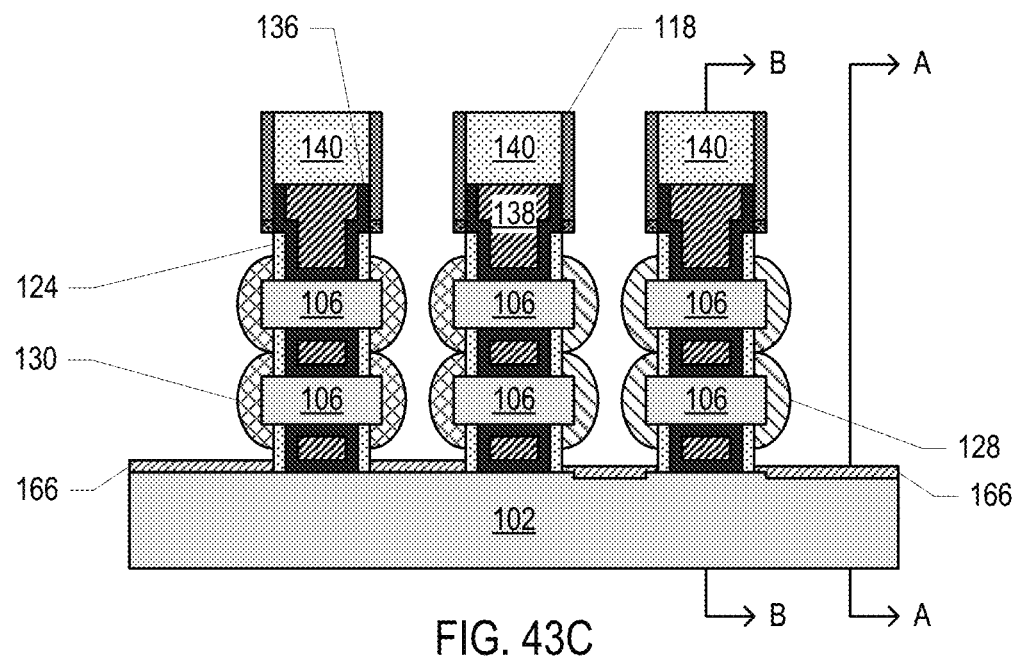
Figure 43D:
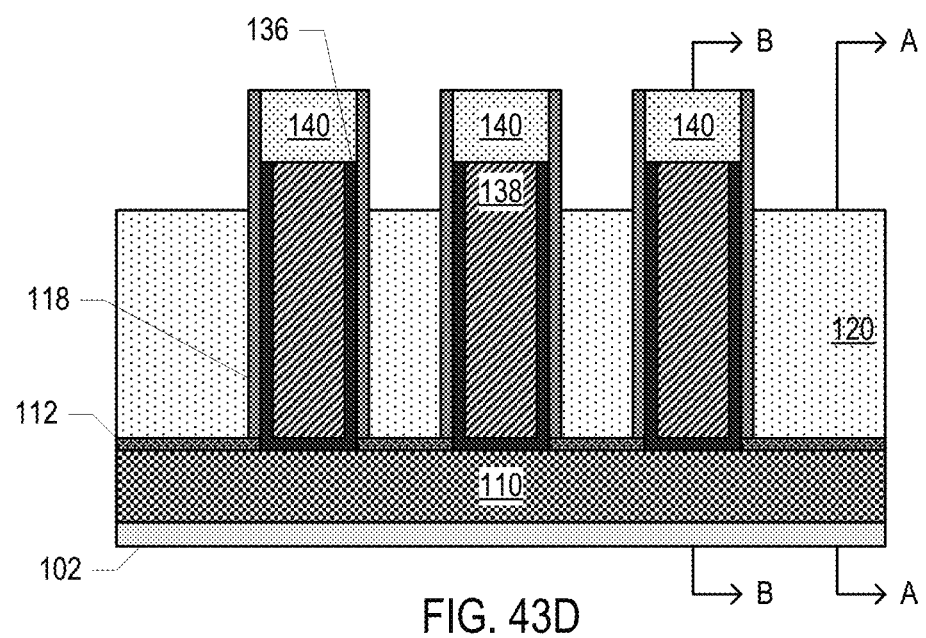
Figure 44A:
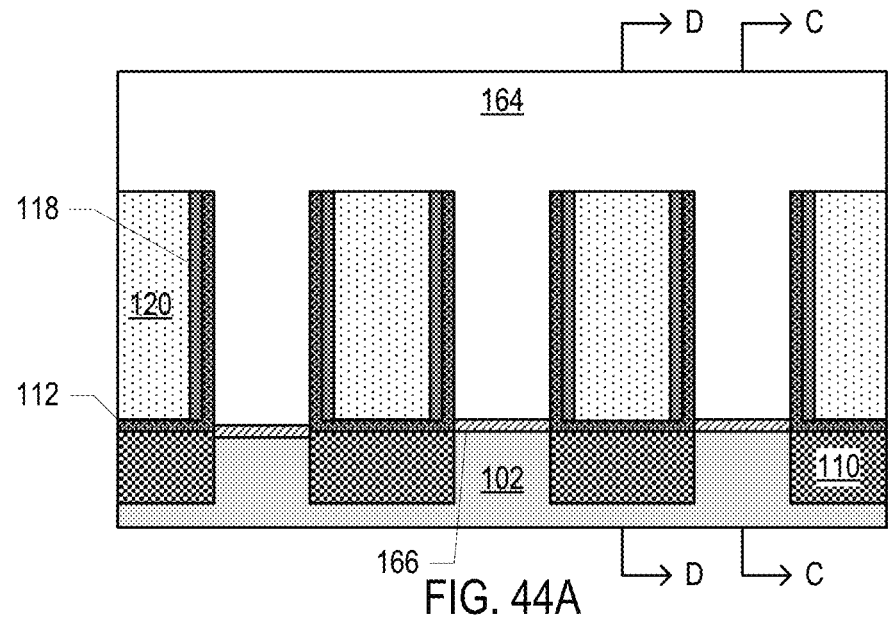
Figure 44B:
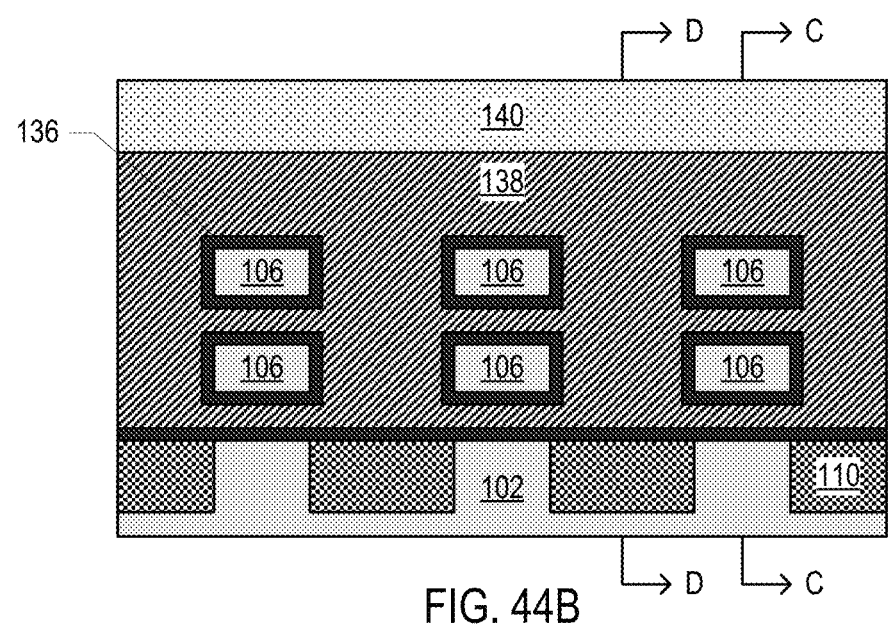
Figure 44C:
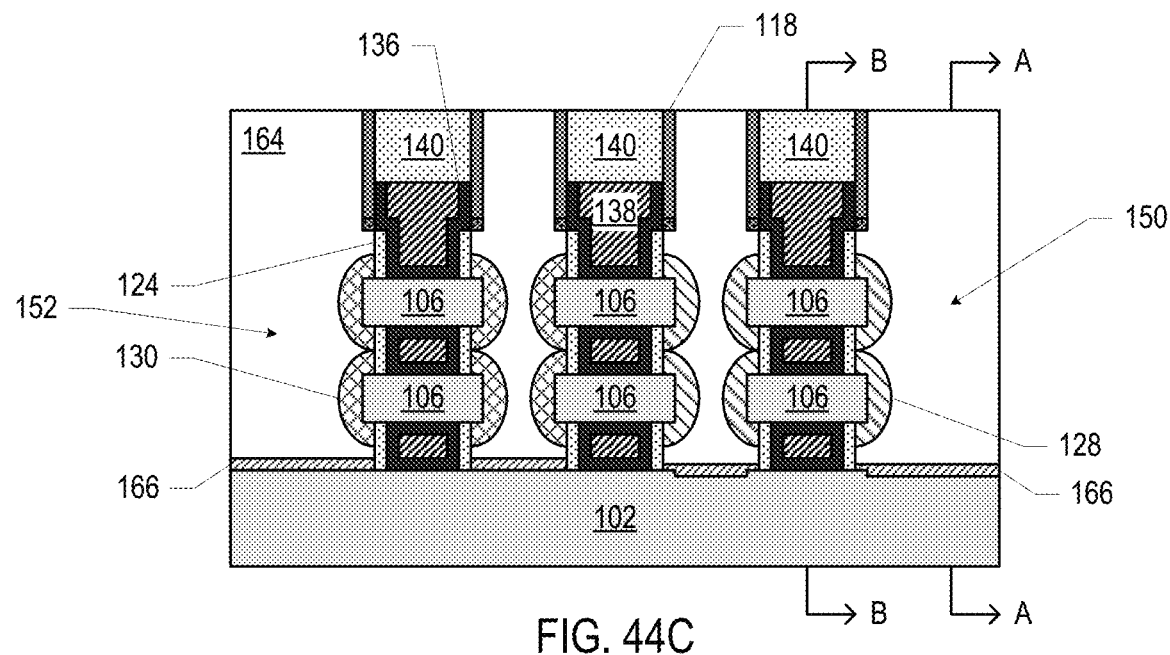
Figure 44D:
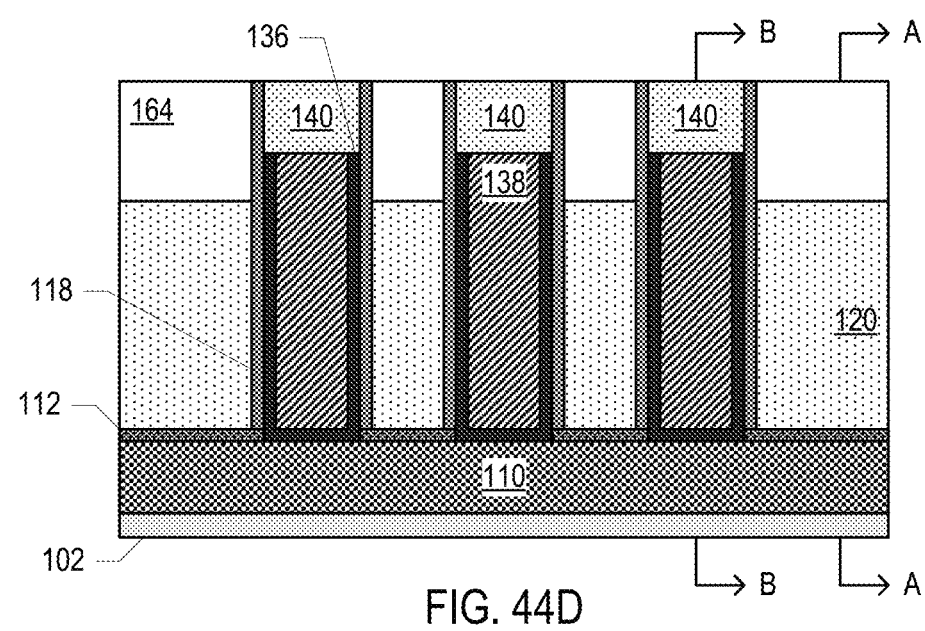

FIG. 19 illustrates an assembly subsequent to recessing the exposed sacrificial material 104 of the assembly of FIG. 18, without simultaneously recessing the exposed channel material 106 (as shown in FIG. 19C). Any suitable selective etch technique may be used. Since this partial lateral recess of the exposed sacrificial material 104 is self-aligned to the exposed channel material 106, the recess of the exposed sacrificial material 104 may be uniform across the width of the channel material 106 (i.e., left-right from the perspective of FIG. 19A).

FIG. 20 illustrates an assembly subsequent to conformally depositing a dielectric material 124 over the assembly of FIG. 19. The dielectric material 124 may include any suitable material (e.g., a low-k dielectric material) and may be deposited so as to fill the recesses formed by recessing the exposed sacrificial material 104 (as discussed above with reference to FIG. 19). In some embodiments, conformally depositing the dielectric material 124 may include multiple rounds of deposition (e.g., three rounds) of one or more dielectric materials.

FIG. 21 illustrates an assembly subsequent to recessing the dielectric material 124 of the assembly of FIG. 20. Any suitable selective etch technique may be used to recess the exposed dielectric material 124, such as an isotropic etch. The dielectric material 124 may remain on side surfaces of the sacrificial material 104 proximate to the open volumes 224, as shown in FIG. 21C. The amount of recess may be such that the recessed surface of the dielectric material 124 is flush with (not shown) or slightly beyond the side surface of the channel material 106, as shown in FIG. 21C. Excessive recess of the exposed dielectric material 124 beyond the side surface of the channel material 106 may result in device performance degradation (e.g., due to elevated parasitic contact-to-gate coupling capacitance) and/or device defect (e.g., due to contact-to-gate short).

FIG. 22 illustrates an assembly subsequent to forming a dielectric material 166 on the base 102 in the open volumes 224 of the assembly of FIG. 21. The dielectric material 166 may include any suitable material, and in some embodiments, may be formed by initially blanket-depositing the dielectric material 166 and then recessing the dielectric material 166 back to a desired thickness on the base 102.

FIG. 23 illustrates an assembly subsequent to forming the semiconductor regions 130 in the open volumes 224 of the assembly of FIG. 22. The semiconductor regions 130 may be formed by epitaxial growth (e.g., an initial nucleation operation to provide a seed layer, followed by a primary epitaxy operation in which the remainder of the semiconductor regions 130 are formed on the seed layer), but unlike conventional approaches, the semiconductor regions 130 do not fill the volumes 224. Instead, the semiconductor regions 130 form around the exposed ends of the channel material 106, with the growth stopped before the volumes 224 are filled, forming semiconductor regions 130 having the undulating shape shown. In some embodiments, the different protrusions (or "epi nubs") of the semiconductor regions 130 may correspond to the different channel materials 106, and as discussed above with reference to FIGS. 10, 1E, and 1F, the portions of the semiconductor regions 130 corresponding to different ones of the channel materials 106 may or may not contact each other. In some embodiments, the different semiconductor regions 130 in a single open volume 224 (corresponding to the channel materials 106 on either side of the open volume 224) may not contact each other (i.e., a "gap" may remain between one semiconductor region 130 and another semiconductor region 130 in an open volume 224; as discussed below, this gap may be filled with contact metal 164 in subsequent operations to complete the S/D regions 152. In some embodiments, the semiconductor regions 130 may include an n-type epitaxial material (e.g., heavily in-situ phosphorous-doped material for use in an NMOS transistor).

FIG. 24 illustrates an assembly subsequent to filling the remainder of the open volumes 224 with a sacrificial material 168. The sacrificial material 168 may be a dielectric material, and may be removed in subsequent operations, as discussed below.

FIG. 25 illustrates an assembly subsequent to depositing a conformal layer of a dielectric material 142 on the assembly of FIG. 24. The dielectric material 142 may be a contact etch stop layer (CESL), and may be formed of any suitable material (e.g., silicon nitride).

FIG. 26 illustrates an assembly subsequent to depositing a dielectric material 122 on the assembly of FIG. 25, and then polishing the dielectric material 122 and the dielectric material 142 to expose the hardmask 126. In some embodiments, the dielectric material 122 may be a pre-metal dielectric (PMD), such as an oxide material (e.g., silicon oxide).

FIG. 27 illustrates an assembly subsequent to removing the hardmask 126 from the assembly of FIG. 26, then depositing and patterning a hardmask 127. The hardmask 127 may have any suitable material composition; for example, in some embodiments, the hardmask 127 may include titanium nitride. The hardmask 127 may be patterned so as to selectively remove the hardmask 127 in areas that will correspond to the S/D regions 150, while otherwise leaving the hardmask 127 in place. Any suitable patterning technique (e.g., a lithographic technique) may be used to pattern the hardmask 127. As noted above, the particular arrangement of the S/D regions 150 in an IC structure 100 (and thus the particular layout of the patterned hardmask 127) depicted in various ones of the accompanying figures is simply illustrative, and any desired arrangement may be used FIG. 28 illustrates an assembly subsequent to recessing the exposed dielectric material 120 (i.e., the dielectric material 120 not protected by the hardmask 127) of the assembly of FIG. 27. Any suitable selective etch technique may be used to recess the exposed dielectric material 120, such as an isotropic etch.

FIG. 29 illustrates an assembly subsequent to removing some of the dielectric material 118 exposed in the assembly of FIG. 28. This operation may enlarge the "canyons" between adjacent portions of hardmask 116/dielectric material 114, facilitating subsequent operations. In some embodiments, the removal of some of the dielectric material 118 may be achieved by a partial isotropic etch (e.g., a nitride partial isotropic etch when the dielectric material 118 includes a nitride).

FIG. 30 illustrates an assembly subsequent to further recessing the exposed dielectric material 120 of the assembly of FIG. 29 (i.e., the dielectric material 120 not protected by the hardmask 127). Any suitable selective etch technique may be used to recess the exposed dielectric material 120, such as an isotropic etch.

FIG. 31 illustrates an assembly subsequent to conformally depositing additional dielectric material 118 on the assembly of FIG. 30, and then performing another directional "downward" etch to remove the dielectric material 118 on horizontal surfaces, "repairing" the dielectric material 118 as "spacers" on side faces of exposed surfaces, as shown. The etch of FIG. 31 (e.g., an RIE) may also remove the dielectric material 112 from the top faces of the sacrificial material 104, as shown.

FIG. 32 illustrates an assembly subsequent to removing the portions of the sacrificial material 104 and the channel material 106 in the assembly of FIG. 31 that are not covered by the hardmask 127 to form open volumes 225 (e.g., using any suitable etch techniques). These open volumes 225 may correspond to the locations of the S/D regions 150 in the IC structure 100, as discussed further below, and are self-aligned to the dielectric material 112, as shown.

FIG. 33 illustrates an assembly subsequent to recessing the exposed sacrificial material 104 of the assembly of FIG. 32, without simultaneously recessing the exposed channel material 106, conformally depositing a dielectric material 124, and recessing the dielectric material 124. These operations may take any of the forms discussed above with reference to FIGS. 19-21. The dielectric material 124 may remain on side surfaces of the sacrificial material 104 proximate to the open volumes 225, as shown in FIG. 33C.

FIG. 34 illustrates an assembly subsequent to forming a dielectric material 166 on the base 102 in the open volumes 225, forming the semiconductor regions 128 in the open volumes 225 of the assembly of FIG. 33, forming a sacrificial material 168 to fill the remainder of the open volumes 225, depositing a conformal layer of a dielectric material 154, and depositing a dielectric material 156. The semiconductor regions 128 may be formed by epitaxial growth (e.g., an initial nucleation operation to provide a seed layer, followed by a primary epitaxy operation in which the remainder of the semiconductor regions 128 are formed on the seed layer), but as discussed above with reference to FIG. 23 and unlike conventional approaches, the semiconductor regions 128 do not fill the volumes 225. Instead, the semiconductor regions 128 form around the exposed ends of the channel material 106, with the growth stopped before the volumes 225 are filled, forming semiconductor regions 128 having the undulating shape shown. In some embodiments, the different protrusions (or "epi nubs") of the semiconductor regions 128 may correspond to the different channel materials 106, and as discussed above with reference to FIGS. 1O, 1E, and 1F, the portions of the semiconductor regions 128 corresponding to different ones of the channel materials 106 may or may not contact each other. In some embodiments, the different semiconductor regions 128 in a single open volume 226 (corresponding to the channel materials 106 on either side of the open volume 226) may not contact each other (i.e., a "gap" may remain between one semiconductor region 128 and another semiconductor region 128 in an open volume 225; as discussed below, this gap may be filled with contact metal 164 in subsequent operations to complete the S/D regions 150. In some embodiments, the semiconductor regions 128 may include a p-type epitaxial material (e.g., heavily in-situ boron-doped material for use in a PMOS transistor). In some implementations, the semiconductor regions 128 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the semiconductor regions 128 may be formed using one or more alternate semiconductor materials such as germanium or a group III-V material or alloy. The dielectric material 154 may be a CESL, and may be formed of any suitable material (e.g., silicon nitride). In some embodiments, the dielectric material 156 may be a PMD, such as an oxide material (e.g., silicon oxide).

FIG. 35 illustrates an assembly subsequent to polishing the hardmask 127, the dielectric material 122, the dielectric material 142, the dielectric material 154, and the dielectric material 156 of the assembly of FIG. 34 (e.g., using a CMP technique) to expose the hardmask 116 above the channel regions 202.

FIG. 36 illustrates an assembly subsequent to removing the hardmask 116, the dielectric material 114 (the "dummy gate"), and the dielectric material 112 from the assembly of FIG. 35 to form open volumes 226. Any suitable etch techniques may be used.

FIG. 37 illustrates an assembly subsequent to "release" of the channel material 106 in the assembly of FIG. 36 by removal of the sacrificial material 104. Any suitable etch technique may be used.

FIG. 38 illustrates an assembly subsequent to forming a conformal gate dielectric 136 over the assembly of FIG. 37. The gate dielectric 136 may be formed using any suitable technique (e.g., ALD), and may include any of the materials discussed herein with reference to the gate dielectric 136.

FIG. 39 illustrates an assembly subsequent to forming a gate metal 138 over the assembly of FIG. 38. The gate metal 138 may include any one or more material layers, such as any of the materials discussed herein with reference to the gate metal 138.

FIG. 40 illustrates an assembly subsequent to polishing the gate metal 138 and the gate dielectric 136 of the assembly of FIG. 39 to remove the gate metal 138 and the gate dielectric 136 over the dielectric material 122 and the dielectric material 156. Any suitable polishing technique, such as a CMP technique, may be used.

FIG. 41 illustrates an assembly subsequent to recessing the gate metal 138 and the gate dielectric 136 (e.g., using one or more etch techniques) to form recesses in the assembly of FIG. 40, and then forming gate contacts 140 in the recesses. The gate contacts 140 may include any one or more materials (e.g., an adhesion liner, a barrier liner, one or more fill metals, etc.).

FIG. 42 illustrates an assembly subsequent to patterning the dielectric material 122, the dielectric material 142, the dielectric material 154, and the dielectric material 156 of the assembly of FIG. 41 to form recesses. Any suitable etch technique may be used.

FIG. 43 illustrates an assembly subsequent to removing the sacrificial material 168 from the assembly of FIG. 42, in accordance with the pattern in the dielectric material 122, the dielectric material 142, the dielectric material 154, and the dielectric material 156 to deepen the recesses. Any suitable etch technique may be used.

FIG. 44 illustrates an assembly subsequent to filling the recesses with contact metal 164. As shown, the contact metal 164 may contact the semiconductor regions 128/130, and may complete the S/D regions 150/152. The contact metal 164 may include any one or more materials (e.g., an adhesion liner, a barrier liner, one or more fill metals, etc.). The assembly of FIG. 44 may take the form of the IC structure 100 of FIG. 1.

Figure 45:
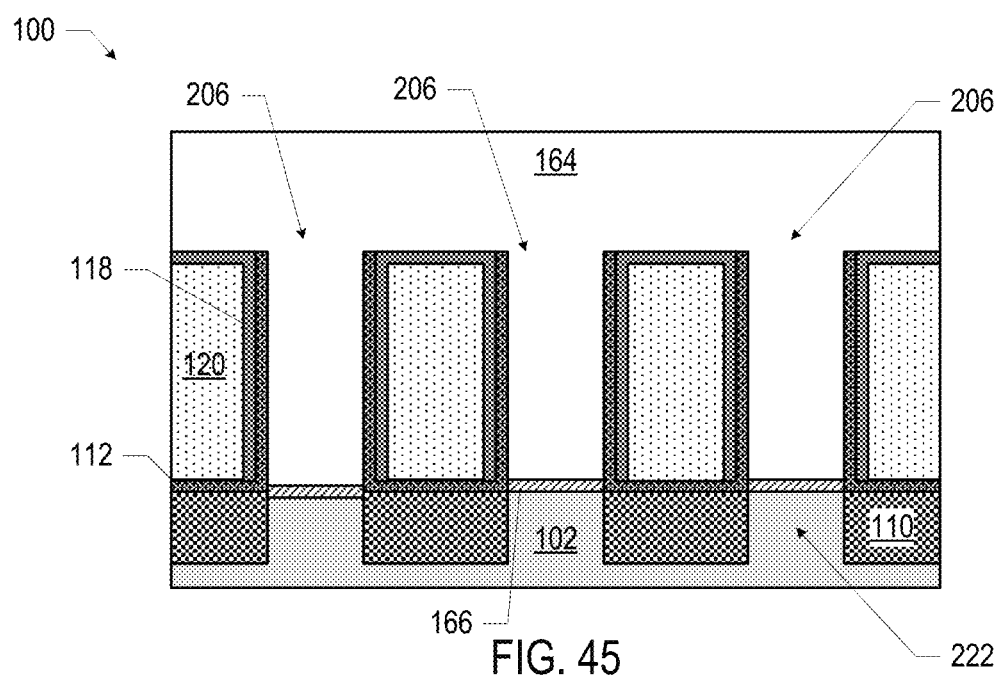
FIG. 45 is a cross-sectional view of another example of an IC structure, in accordance with various embodiments.

In some embodiments, the repeated deposition and etching operations around the dielectric material 118 may be performed such that a "cap" of the dielectric material 118 extends over the insulating material 120. FIG. 45 is a side, cross-sectional view of such an IC structure 100, sharing the perspective of the "A" sub-figures herein. The resulting dielectric material 118 may have the same of an upside down "U" and may be nested in the U-shaped dielectric material 112. Any of the embodiments disclosed herein may include a dielectric material 118 having the structure of FIG. 45.

The IC structures 100 disclosed herein may be included in any suitable electronic component. FIGS. 46-50 illustrate various examples of apparatuses that may include any of the IC structures 100 disclosed herein.

Figure 46:
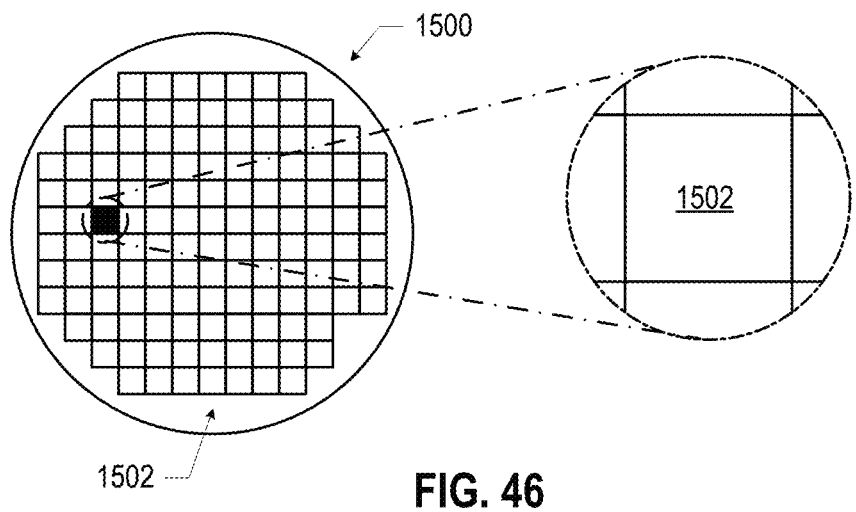
FIG. 46 is a top view of a wafer and dies that may include an IC structure in accordance with any of the embodiments disclosed herein.

FIG. 46 is a top view of a wafer 1500 and dies 1502 that may include one or more IC structures 100 in accordance with any of the embodiments disclosed herein. The wafer 1500 may be composed of semiconductor material and may include one or more dies 1502 having IC structures (e.g., the IC structures 100 disclosed herein) formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more IC structures 100 (e.g., as discussed below with reference to FIG. 47), one or more transistors (e.g., some of the transistors discussed below with reference to FIG. 47) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 50) or other logic that is configured to store information in the memory devices or execute instructions stored in the memory array.

Figure 47:
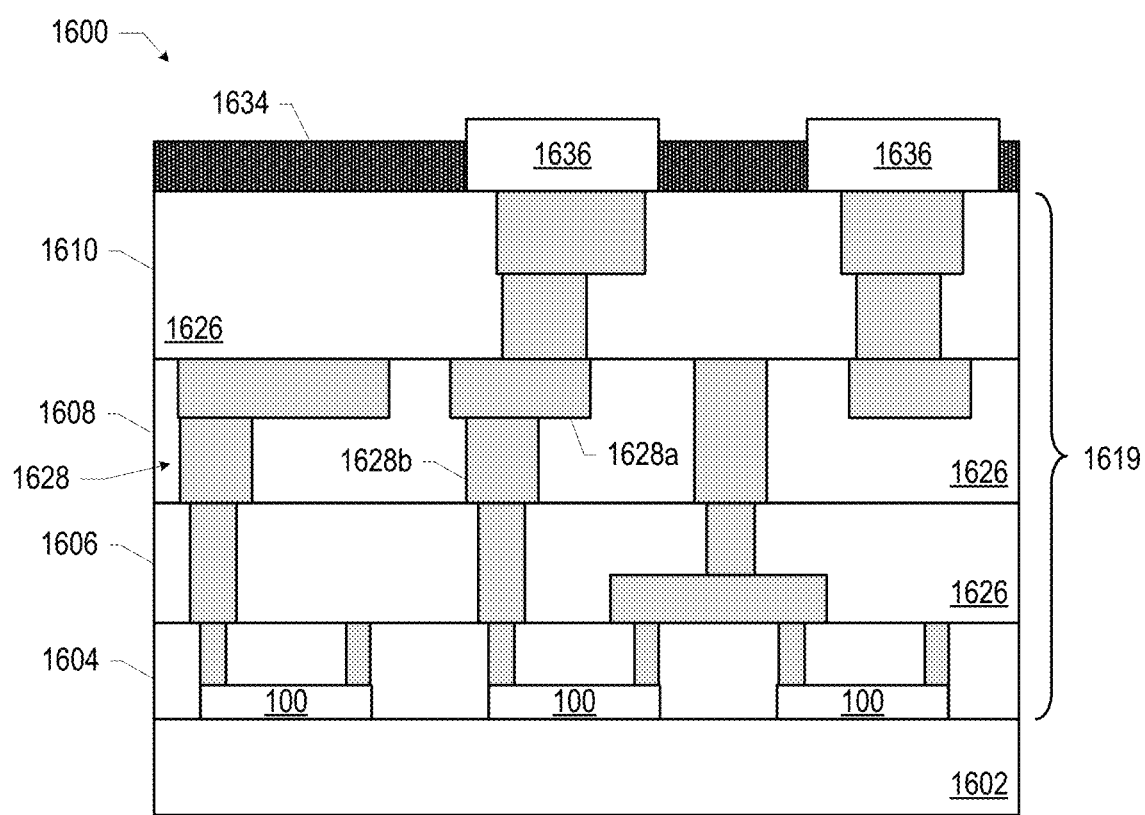
FIG. 47 is a side, cross-sectional view of an IC component that may include an IC structure in accordance with any of the embodiments disclosed herein.

FIG. 47 is a side, cross-sectional view of an IC component 1600 that may include one or more IC structures 100 in accordance with any of the embodiments disclosed herein. One or more of the IC components 1600 may be included in one or more dies 1502 (FIG. 46). The IC component 1600 may be formed on a substrate 1602 (e.g., the wafer 1500 of FIG. 46) and may be included in a die (e.g., the die 1502 of FIG. 46). The substrate 1602 may take the form of any of the embodiments of the base 102 disclosed herein.

The IC component 1600 may include one or more device layers 1604 disposed on the substrate 1602. The device layer 1604 may include features of one or more IC structures 100, other transistors, diodes, or other devices formed on the substrate 1602. The device layer 1604 may include, for example, source and/or drain (S/D) regions, gates to control current flow between the S/D regions, S/D contacts to route electrical signals to/from the S/D regions, and gate contacts to route electrical signals to/from the S/D regions (e.g., in accordance with any of the embodiments discussed above with reference to the IC structures 100). The transistors that may be included in a device layer 1604 are not limited to any particular type or configuration, and may include any one or more of, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors (e.g., as discussed above with reference to the IC structures 100).

Electrical signals, such as power and/or input/output (I/O) signals, may be routed to and/or from the devices (e.g., the IC structures 100) of the device layer 1604 through one or more interconnect layers disposed on the device layer 1604 (illustrated in FIG. 47 as interconnect layers 1606-1610). For example, electrically conductive features of the device layer 1604 (e.g., the gate contacts and the S/D contacts) may be electrically coupled with the interconnect structures 1628 of the interconnect layers 1606-1610. The one or more interconnect layers 1606-1610 may form a metallization stack (also referred to as an "ILD stack") 1619 of the IC component 1600. Although FIG. 47 depicts an ILD stack 1619 at only one face of the device layer 1604, in other embodiments, an IC component 1600 may include two ILD stacks 1619 such that the device layer 1604 is between the two ILD stacks 1619.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 47). Although a particular number of interconnect layers 1606-1610 is depicted in FIG. 47, embodiments of the present disclosure include IC components having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 47. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 47. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts or gate contacts) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC component 1600 (i.e., farther away from the device layer 1604) may be thicker.

The IC component 1600 may include a solder resist material 1634 (e.g., polyimide or similar material) and one or more conductive contacts 1636 formed on the interconnect layers 1606-1610. In FIG. 47, the conductive contacts 1636 are illustrated as taking the form of bond pads. The conductive contacts 1636 may be electrically coupled with the interconnect structures 1628 and configured to route the electrical signals of device layer 1604 to other external devices. For example, solder bonds may be formed on the one or more conductive contacts 1636 to mechanically and/or electrically couple a chip including the IC component 1600 with another component (e.g., a circuit board). The IC component 1600 may include additional or alternate structures to route the electrical signals from the interconnect layers 1606-1610; for example, the conductive contacts 1636 may include other analogous features (e.g., posts) that route the electrical signals to external components. In embodiments in which the IC component 1600 includes an ILD stack 1619 at each opposing face of the device layer 1604, the IC component 1600 may include conductive contacts 1636 on each of the ILD stacks 1619 (allowing interconnections to the IC component 1600 to be made on two opposing faces of the IC component 1600).

Figure 48:
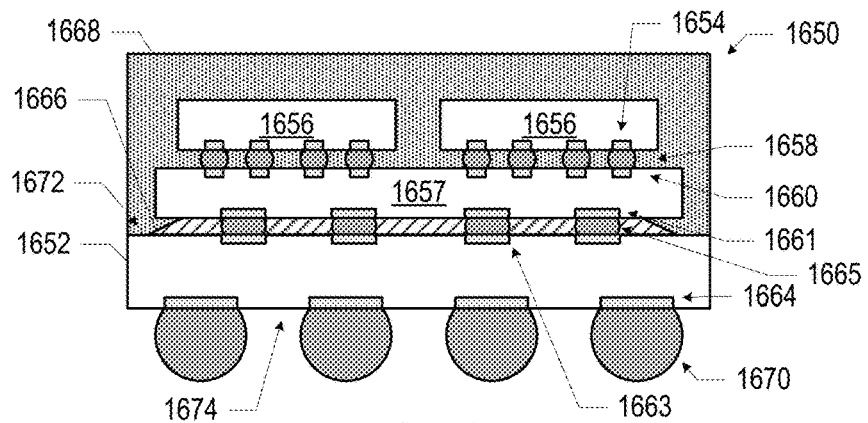
FIG. 48 is a side, cross-sectional view of an IC package that may include an IC structure in accordance with any of the embodiments disclosed herein.

FIG. 48 is a side, cross-sectional view of an example IC package 1650 that may include one or more IC structures 100 in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 47.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664.

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 48 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 48 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable.

Second-level interconnects 1670 may be coupled to the conductive contacts 1664. The second-level interconnects 1670 illustrated in FIG. 48 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 49.

The dies 1656 may take the form of any of the embodiments of the die 1502 discussed herein (e.g., may include any of the embodiments of the IC component 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., siliconbased dies), and one or more of the dies 1656 may be memory dies (e.g., high bandwidth memory). In some embodiments, the die 1656 may include one or more IC structures 100 (e.g., as discussed above with reference to FIG. 46 and FIG. 47).

Although the IC package 1650 illustrated in FIG. 48 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 48, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 49:
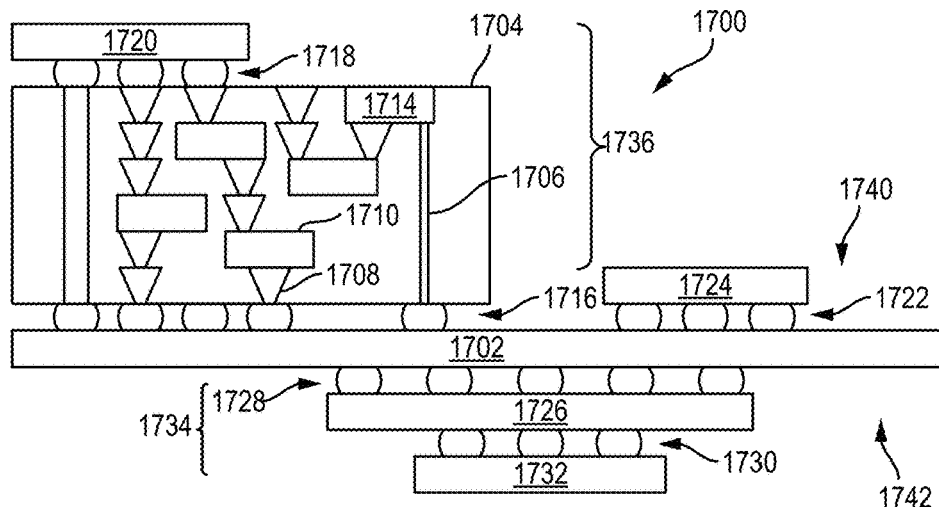
FIG. 49 is a side, cross-sectional view of an IC component assembly that may include an IC structure in accordance with any of the embodiments disclosed herein.

FIG. 49 is a side, cross-sectional view of an IC component assembly 1700 that may include one or more IC packages or other electronic components (e.g., a die) including one or more IC structures 100 in accordance with any of the embodiments disclosed herein. The IC component assembly 1700 includes a number of components disposed on a circuit board 1702 (which may be, e.g., a motherboard). The IC component assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC component assembly 1700 may take the form of any of the embodiments of the IC package 1650 discussed above with reference to FIG. 48 (e.g., may include one or more IC structures 100 in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC component assembly 1700 illustrated in FIG. 49 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 49), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 49, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 46), an IC component (e.g., the IC component 1600 of FIG. 47), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 49, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC component assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC component assembly 1700 illustrated in FIG. 49 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 50:
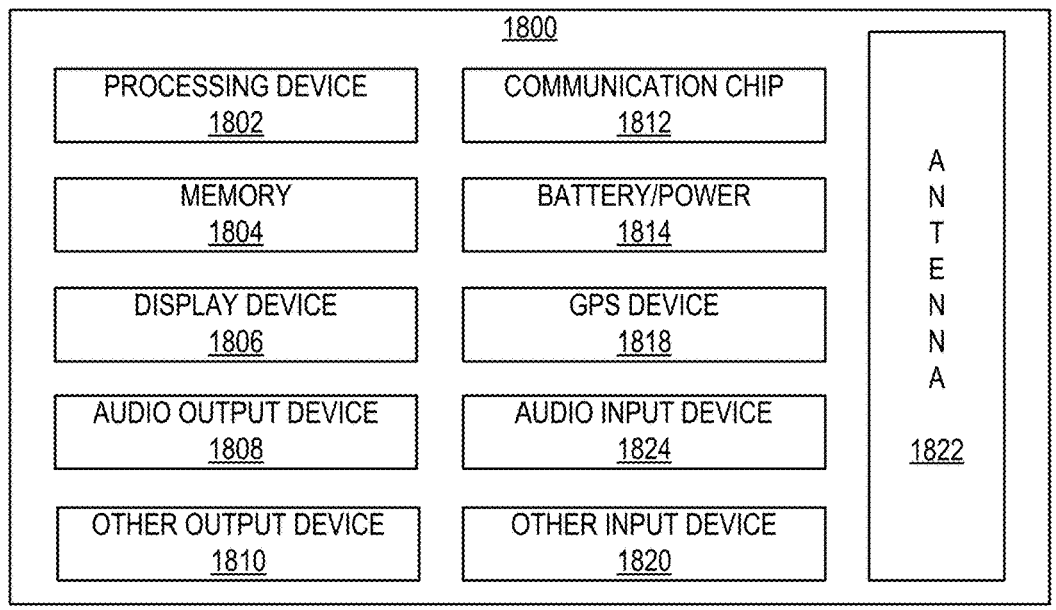
FIG. 50 is a block diagram of an example electrical device that may include an IC structure in accordance with any of the embodiments disclosed herein.

FIG. 50 is a block diagram of an example electrical device 1800 that may include one or more IC structures 100 in accordance with any of the embodiments disclosed herein. For example, any suitable ones of the components of the electrical device 1800 may include one or more of the IC component assemblies 1700, IC packages 1650, IC components 1600, or dies 1502 disclosed herein. A number of components are illustrated in FIG. 50 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 50, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) structure, including: a channel region including a first semiconductor wire and a second semiconductor wire; and a source/drain region proximate to the channel region, wherein the source/drain region includes a first semiconductor portion proximate to an end of the first semiconductor wire, the source/drain region includes a second semiconductor portion proximate to an end of the second semiconductor wire, and the source/drain region includes a contact metal at least partially between the first semiconductor portion and the second semiconductor portion.

Example 2 includes the subject matter of Example 1, and further specifies that the first semiconductor portion does not contact the second semiconductor portion.

Example 3 includes the subject matter of Example 1, and further specifies that the first semiconductor portion contacts the second semiconductor portion.

Example 4 includes the subject matter of any of Examples 1-3, and further specifies that the first semiconductor portion contacts the first semiconductor wire, and the second semiconductor portion contacts the second semiconductor wire.

Example 5 includes the subject matter of any of Examples 1-4, and further specifies that the first semiconductor portion includes a first sub-portion and a second sub-portion, the first sub-portion is between a pair of dielectric spacers, and the first sub-portion is between the second sub-portion and the first semiconductor wire.

Example 6 includes the subject matter of any of Examples 1-5, and further specifies that the second semiconductor portion includes a first sub-portion and a second sub-portion, the first sub-portion is between a pair of dielectric spacers, and the first sub-portion is between the second sub-portion and the second semiconductor wire.

Example 7 includes the subject matter of any of Examples 1-6, and further specifies that the first semiconductor wire and the second semiconductor wire are arranged in a vertical array.

Example 8 includes the subject matter of any of Examples 1-7, and further specifies that the channel region is a first channel region, and the IC structure further includes: a second channel region including a third semiconductor wire and a fourth semiconductor wire; wherein the source/drain region is between the first channel region and the second channel region, the source/drain region includes a third semiconductor portion proximate to an end of the third semiconductor wire, the source/drain region includes a fourth semiconductor portion proximate to an end of the fourth semiconductor wire, and the contact metal is at least partially between the third semiconductor portion and the fourth semiconductor portion.

Example 9 includes the subject matter of Example 8, and further specifies that the third semiconductor portion does not contact the fourth semiconductor portion.

Example 10 includes the subject matter of Example 8, and further specifies that the third semiconductor portion contacts the fourth semiconductor portion.

Example 11 includes the subject matter of any of Examples 8-10, and further specifies that the third semiconductor portion contacts the third semiconductor wire, and the fourth semiconductor portion contacts the fourth semiconductor wire.

Example 12 includes the subject matter of any of Examples 8-11, and further specifies that the third semiconductor portion includes a first sub-portion and a second sub-portion, wherein the first sub-portion is between a pair of dielectric spacers, and the first sub-portion is between the second sub-portion and the third semiconductor wire.

Example 13 includes the subject matter of any of Examples 8-12, and further specifies that the fourth semiconductor portion includes a first sub-portion and a second sub-portion, the first sub-portion is between a pair of dielectric spacers, and the first sub-portion is between the second sub-portion and the fourth semiconductor wire.

Example 14 includes the subject matter of any of Examples 8-13, and further specifies that the first semiconductor wire and the third semiconductor wire share a longitudinal axis.

Example 15 includes the subject matter of any of Examples 8-14, and further specifies that the second semiconductor wire and the fourth semiconductor wire share a longitudinal axis.

Example 16 includes the subject matter of any of Examples 8-15, and further specifies that the contact metal is between the first semiconductor portion and the third semiconductor portion.

Example 17 includes the subject matter of any of Examples 8-16, and further specifies that the contact metal is between the second semiconductor portion and the fourth semiconductor portion.

Example 18 includes the subject matter of any of Examples 1-17, and further specifies that the source/drain region is a first source/drain region, and the IC structure further includes: a second source/drain region, adjacent to the first source/drain region; and an insulating material region at least partially between the first source/drain region and the second source/drain region.

Example 19 includes the subject matter of Example 18, and further specifies that the insulating material region includes a first insulating material and a second insulating material, wherein the first insulating material has a U-shaped cross-section, and the first insulating material is between the second insulating material and first source/drain region.

Example 20 includes the subject matter of any of Examples 1-19, and further includes: a base region; and an insulating material region between the base region and the source/drain region.

Example 21 includes the subject matter of Example 20, and further specifies that the base region includes a semiconductor material.

Example 22 is an integrated circuit (IC) structure, including: a first channel region including a first semiconductor wire; a second channel region including a second semiconductor wire; and a source/drain region between the first channel region and the second channel region, wherein the source/drain region includes a first semiconductor region proximate to the first channel region, the source/drain region includes a second semiconductor region proximate to the second channel region, and the source/drain region includes a contact metal between the first semiconductor region and the second semiconductor region; wherein the first semiconductor region has a first surface facing the contact metal, and the first surface has a protrusion proximate to the first semiconductor wire; and wherein the second semiconductor region has a second surface facing the contact metal, and the second surface has a protrusion proximate to the second semiconductor wire.

Example 23 includes the subject matter of Example 22, and further specifies that: the first channel region includes a third semiconductor wire; and the first surface has a protrusion proximate to the third semiconductor wire.

Example 24 includes the subject matter of Example 23, and further specifies that the first semiconductor region includes a first portion including the protrusion proximate to the first semiconductor wire, the first semiconductor region includes a second portion including the protrusion proximate to the third semiconductor wire, and the first portion does not contact the second portion.

Example 25 includes the subject matter of any of Examples 23-24, and further specifies that: the second channel region includes a fourth semiconductor wire; and the second surface has a protrusion proximate to the fourth semiconductor wire.

Example 26 includes the subject matter of Example 25, and further specifies that the second semiconductor region includes a first portion including the protrusion proximate to the second semiconductor wire, the second semiconductor region includes a second portion including the protrusion proximate to the fourth semiconductor wire, and the first portion does not contact the second portion.

Example 27 includes the subject matter of any of Examples 22-26, and further specifies that the first semiconductor region includes portions between pairs of dielectric spacers.

Example 28 includes the subject matter of any of Examples 22-27, and further specifies that the first semiconductor region contacts the first semiconductor wire.

Example 29 includes the subject matter of any of Examples 22-28, and further specifies that the first semiconductor wire is one of an array of semiconductor wires in the first channel region.

Example 30 includes the subject matter of any of Examples 22-29, and further specifies that the source/drain region is a first source/drain region, and the IC structure further includes: a second source/drain region, adjacent to the first source/drain region; and an insulating material region at least partially between the first source/drain region and the second source/drain region.

Example 31 includes the subject matter of Example 30, and further specifies that the insulating material region includes a first insulating material and a second insulating material, wherein the first insulating material has a U-shaped cross-section, and the first insulating material is between the second insulating material and first source/drain region.

Example 32 includes the subject matter of any of Examples 22-31, and further includes: a base region; and an insulating material region between the base region and the source/drain region.

Example 33 includes the subject matter of Example 32, and further specifies that the base region includes a semiconductor material.

Example 34 is an integrated circuit (IC) structure, including: a first channel region; a second channel region; and a source/drain region between the first channel region and the second channel region, wherein the source/drain region includes a first semiconductor region proximate to the first channel region, the source/drain region includes a second semiconductor region proximate to the second channel region, and the source/drain region includes a contact metal between the first semiconductor region and the second semiconductor region; wherein the first semiconductor region has an undulating first surface facing the contact metal; and wherein the second semiconductor region has an undulating second surface facing the contact metal.

Example 35 includes the subject matter of Example 34, and further specifies that: the first channel region includes a first semiconductor wire and a second semiconductor wire; the first surface has a protrusion proximate to the first semiconductor wire and a protrusion proximate to the second semiconductor wire.

Example 36 includes the subject matter of Example 35, and further specifies that the first semiconductor region includes a first portion including the protrusion proximate to the first semiconductor wire, the first semiconductor region includes a second portion including the protrusion proximate to the second semiconductor wire, and the first portion does not contact the second portion.

Example 37 includes the subject matter of any of Examples 35-36, and further specifies that the first semiconductor region contacts the first semiconductor wire and the second semiconductor wire.

Example 38 includes the subject matter of any of Examples 34-37, and further specifies that the first semiconductor region includes portions between pairs of dielectric spacers.

Example 39 includes the subject matter of any of Examples 34-38, and further specifies that the source/drain region is a first source/drain region, and the IC structure further includes: a second source/drain region, adjacent to the first source/drain region; and an insulating material region at least partially between the first source/drain region and the second source/drain region.

Example 40 includes the subject matter of Example 39, and further specifies that the insulating material region includes a first insulating material and a second insulating material, wherein the first insulating material has a U-shaped cross-section, and the first insulating material is between the second insulating material and first source/drain region.

Example 41 includes the subject matter of any of Examples 34-40, and further includes: a base region; and an insulating material region between the base region and the source/drain region.

Example 42 includes the subject matter of Example 41, and further specifies that the base region includes a semiconductor material.

Example 43 is an electronic assembly, including: a die including the IC structure of any of Examples 1-42; and a support electrically coupled to the die.

Example 44 includes the subject matter of Example 43, and further specifies that the support includes a package substrate.

Example 45 includes the subject matter of any of Examples 43-44, and further specifies that the support includes an interposer.

Example 46 includes the subject matter of any of Examples 43-44, and further specifies that the support includes a printed circuit board.

Example 47 includes the subject matter of any of Examples 43-46, and further includes: a housing around the die and the support.

Example 48 includes the subject matter of Example 47, and further specifies that the housing is a handheld computing device housing.

Example 49 includes the subject matter of Example 47, and further specifies that the housing is a server housing.

Example 50 includes the subject matter of any of Examples 47-49, and further includes: a display coupled to the housing.

Example 51 includes the subject matter of Example 50, and further specifies that the display is a touchscreen display.

The invention claimed is:
1. An integrated circuit (IC) structure, comprising:
   a channel region including a first semiconductor wire and a second semiconductor wire; and
   a source/drain region proximate to the channel region, the source/drain region including:
      a first semiconductor portion in contact with an end of the first semiconductor wire,
      a second semiconductor portion in contact with an end of the second semiconductor wire, and
      a contact metal at least partially between the first semiconductor portion and the second semiconductor portion,
   wherein:
      the first semiconductor portion has a first surface in contact with the contact metal,
      the first surface is curved and not in contact with the channel region,
      the second semiconductor portion has a second surface in contact with the contact metal, and
      the second surface is curved and not in contact with the channel region.

2. The IC structure of claim 1, wherein the first semiconductor portion does not contact the second semiconductor portion.

3. The IC structure of claim 1, wherein the first semiconductor portion contacts the second semiconductor portion.

4. The IC structure of claim 1, wherein the first semiconductor portion includes a first sub-portion and a second sub-portion, the first sub-portion is between a pair of dielectric spacers, and the first sub-portion is between the second sub-portion and the first semiconductor wire.

5. The IC structure of claim 1, wherein the second semiconductor portion includes a first sub-portion and a second sub-portion, the first sub-portion is between a pair of dielectric spacers, and the first sub-portion is between the second sub-portion and the second semiconductor wire.

6. The IC structure of claim 1, wherein the first semiconductor wire is over the second semiconductor wire.

7. The IC structure of claim 1, wherein:
the channel region is a first channel region,
the IC structure further includes a second channel region including a third semiconductor wire and a fourth semiconductor wire,
the source/drain region is between the first channel region and the second channel region,
the source/drain region includes a third semiconductor portion in contact with an end of the third semiconductor wire,
the source/drain region includes a fourth semiconductor portion in contact with an end of the fourth semiconductor wire,
the portion of the contact metal is a first potion of the contact metal;
a second portion of the contact metal is between the third semiconductor portion and the first semiconductor portion, and
a third portion of the contact metal is between the fourth semiconductor portion and the second semiconductor portion.

8. The IC structure of claim 7, wherein the third semiconductor portion does not contact the fourth semiconductor portion.

9. The IC structure of claim 8, wherein the third semiconductor portion contacts the fourth semiconductor portion.

10. The IC structure of claim 8, wherein the third semiconductor portion includes a first sub-portion and a second sub-portion, wherein the first sub-portion is between a pair of dielectric spacers, and the first sub-portion is between the second sub-portion and the third semiconductor wire.

11. The IC structure of claim 1, wherein the source/drain region is a first source/drain region, and the IC structure further includes:
a second source/drain region, adjacent to the first source/drain region; and
an insulating material region at least partially between the first source/drain region and the second source/drain region.

12. The IC structure of claim 11, wherein the insulating material region includes a first insulating material and a second insulating material, wherein the first insulating material has a U-shaped cross-section, and the first insulating material is between the second insulating material and first source/drain region.

13. The IC structure of claim 1, wherein the source/drain region further includes:
a third semiconductor portion proximate to another end of the first semiconductor wire, and
a fourth semiconductor portion proximate to another end of the second semiconductor wire.

14. The IC structure of claim 13, wherein the first semiconductor portion or the second semiconductor portion include a n-type dopant, and the third semiconductor portion or the fourth semiconductor portion include a p-type dopant.

15. The IC structure of claim 13, wherein the first semiconductor portion, the second semiconductor portion, the third semiconductor portion, and the fourth semiconductor portion include a p-type dopant or a n-type dopant.

16. The IC structure of claim 1, wherein the first undulating surface is in contact with the contact metal.

17. The IC structure of claim 1, wherein the first undulating surface is in contact with a first portion of the contact metal, and the second undulating surface in contact with a second portion of the contact metal.

18. The IC structure of claim 1, wherein a portion of the contact metal is between the first undulating surface and the second undulating surface.

19. The IC structure of claim 1, wherein the first undulating surface or the second undulating surface is a surface protruding toward the contact metal.

20. The IC structure of claim 1, wherein:
the first semiconductor portion comprises dopants of a first type,
the second semiconductor portion comprises dopants of a second type, and
the second type is opposite the first type.

* * * * *

UNITED STATES PATENT AND TRADEMARK OFFICE
CERTIFICATE OF CORRECTION

| | | |
|---|---|---|
| PATENT NO. | : 11,450,738 B2 | |
| APPLICATION NO. | : 16/832417 | |
| DATED | : September 20, 2022 | |
| INVENTOR(S) | : Sean T. Ma et al. | |

It is certified that error appears in the above-identified patent and that said Letters Patent is hereby corrected as shown below:

In the Claims

In Column 27, Claim 7, Line 31, delete "first potion" and insert -- first portion --, therefor.

In Column 28, Claim 17, Line 34, delete "surface in" and insert -- surface is in --, therefor.

Signed and Sealed this
Third Day of January, 2023

*Katherine Kelly Vidal*

Katherine Kelly Vidal
*Director of the United States Patent and Trademark Office*